(12) United States Patent
West

(10) Patent No.: US 8,991,114 B2
(45) Date of Patent: *Mar. 31, 2015

(54) PIVOT-FIT CONNECTION APPARATUS, SYSTEM, AND METHOD FOR PHOTOVOLTAIC MODULES

(75) Inventor: John R. West, San Rafael, CA (US)

(73) Assignee: Zep Solar, LLC, San Rafael, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/830,250

(22) Filed: Jul. 2, 2010

(65) Prior Publication Data

US 2011/0000519 A1      Jan. 6, 2011

Related U.S. Application Data

(60) Provisional application No. 61/270,122, filed on Jul. 2, 2009, provisional application No. 61/255,004, filed on Oct. 26, 2009, provisional application No. 61/351,586, filed on Jun. 4, 2010.

(51) Int. Cl.
*F24J 2/52*        (2006.01)
*H02S 20/23*    (2014.01)
(Continued)

(52) U.S. Cl.
CPC ........ *F24J 2/5262* (2013.01); *Y10T 403/32606* (2015.01); *F24J 2/5211* (2013.01);
(Continued)

(58) Field of Classification Search
CPC ....... F24J 2/5243; F24J 2/5245; F24J 2/5252; F24J 2/5254; F24J 2/5256; F24J 2/5258; F24J 2/526; F24J 2/5262; F24J 2/5247; F24J 2/5264; F24J 2/52; F24J 2/5204; F24J 2/5203; F24J 2/5207; F24J 2/5209; F24J 2/5211; F24J 2/523; F24J 2002/5292; F24J 2002/5213; F24J 2002/522; F24J 2002/5226; Y10T 403/32606; Y02E 10/50; Y02E 10/47; Y02E 10/12; H01L 31/0488; H02S 20/24; H02S 20/00; H02S 20/20; H02S 20/22; H02S 20/23; H02S 30/10
USPC ............ 52/173.3, 582.1, 582.2, 584.1, 586.1, 52/586.2, 698, 710; 126/621, 622, 623, 126/569; 136/244, 251, 252
See application file for complete search history.

(56) References Cited

U.S. PATENT DOCUMENTS 1,893,481 A    1/1933   Adams
3,630,253 A    12/1971  Sherman
(Continued)

FOREIGN PATENT DOCUMENTS

DE         3111969        10/1982
DE         44 44 439 A1    4/1995
(Continued)

OTHER PUBLICATIONS

International Search Report and Written Opinion mailed Jul. 7, 2011 in International Application No. PCT/US2010/040981.
(Continued)

*Primary Examiner* — Jessica Laux
(74) *Attorney, Agent, or Firm* — Larry D. Johnson

(57) ABSTRACT

A system and method are disclosed for quickly and easily assembling PV modules into a PV array in a sturdy and durable manner. In examples of the present technology, the system includes various couplings having a first engaging portion adapted to engage a first PV module and a second engaging portion adapted to engage a second PV module. At least one of the engaging portions allows variable positioning of the engaged PV module along the engaging portion.

10 Claims, 39 Drawing Sheets

(51) Int. Cl.
*H02S 20/24* (2014.01)
*H01L 31/048* (2014.01)
(52) U.S. Cl.
CPC ............. *F24J 2/5245* (2013.01); *F24J 2/5247* (2013.01); *F24J 2/5264* (2013.01); *Y02B 10/12* (2013.01); *Y02E 10/47* (2013.01); *F24J 2002/5292* (2013.01); *Y02E 10/50* (2013.01); *H02S 20/23* (2014.12); *H02S 20/24* (2014.12); *H01L 31/048* (2013.01); *H01L 31/0488* (2013.01)
USPC ....................................................... 52/173.3

(56) References Cited

U.S. PATENT DOCUMENTS

| | | |
|---|---|---|
| 3,658,596 A | 4/1972 | Osborne |
| 4,047,516 A | 9/1977 | Bruel et al. |
| 4,104,083 A | 8/1978 | Hirano |
| 4,112,922 A | 9/1978 | Skinner |
| 4,146,785 A | 3/1979 | Neale |
| 4,154,223 A | 5/1979 | Lof |
| 4,155,346 A | 5/1979 | Aresty |
| 4,173,229 A | 11/1979 | Halfon |
| 4,215,677 A | 8/1980 | Erickson |
| 4,217,825 A | 8/1980 | Bruckner |
| 4,219,011 A | 8/1980 | Knoos |
| 4,233,085 A | 11/1980 | Roderick et al. |
| 4,233,962 A | 11/1980 | Neny |
| 4,237,863 A | 12/1980 | Harrison |
| 4,271,825 A | 6/1981 | Schwob et al. |
| 4,306,540 A | 12/1981 | Hutchison |
| 4,308,858 A | 1/1982 | Skillman |
| 4,310,182 A | 1/1982 | Vandenbossche |
| 4,312,325 A | 1/1982 | Voges |
| 4,353,356 A | 10/1982 | Vandenbossche |
| 4,371,139 A | 2/1983 | Clark |
| 4,392,009 A | 7/1983 | Napoli |
| 4,400,847 A | 8/1983 | Farber |
| 4,429,872 A | 2/1984 | Capachi |
| 4,505,261 A | 3/1985 | Hunter |
| 4,570,408 A | 2/1986 | Frascaroli |
| 4,582,953 A | 4/1986 | Nagase et al. |
| 4,691,818 A | 9/1987 | Weber |
| 4,718,185 A | 1/1988 | Conlin |
| 4,966,631 A | 10/1990 | Matlin |
| 5,046,791 A | 9/1991 | Kooiman |
| 5,076,035 A * | 12/1991 | Wright ............................ 52/464 |
| 5,127,762 A | 7/1992 | Havlovitz |
| 5,134,827 A | 8/1992 | Hartman |
| 5,143,556 A | 9/1992 | Matlin |
| 5,144,780 A | 9/1992 | Gieling |
| 5,164,019 A | 11/1992 | Sinton |
| 5,164,020 A | 11/1992 | Wagner |
| 5,203,135 A | 4/1993 | Bastian |
| 5,205,087 A | 4/1993 | Jines |
| 5,205,694 A | 4/1993 | Nagoshi et al. |
| 5,232,518 A | 8/1993 | Nath |
| 5,316,592 A | 5/1994 | Dinwoodie |
| 5,333,602 A | 8/1994 | Huang |
| 5,338,369 A | 8/1994 | Rawlings |
| 5,460,660 A | 10/1995 | Albright et al. |
| 5,497,587 A | 3/1996 | Hirai |
| 5,505,788 A | 4/1996 | Dinwoodie |
| D374,169 S | 10/1996 | Kopish |
| 5,571,338 A | 11/1996 | Kadonome et al. |
| 5,596,981 A | 1/1997 | Soucy |
| 5,603,187 A | 2/1997 | Merrin |
| 5,628,580 A | 5/1997 | Rinderer |
| D387,655 S | 12/1997 | Kopish |
| 5,706,617 A | 1/1998 | Hirai |
| 5,746,029 A | 5/1998 | Ullman |
| 5,746,839 A | 5/1998 | Dinwoodie |
| 5,768,831 A | 6/1998 | Melchior |
| 5,787,653 A | 8/1998 | Sakai |
| 5,960,790 A | 10/1999 | Rich |
| 6,046,399 A | 4/2000 | Kapner |
| 6,061,978 A | 5/2000 | Dinwoodie |
| 6,093,884 A | 7/2000 | Toyomura |
| 6,105,317 A | 8/2000 | Tomiuchi et al. |
| 6,111,189 A | 8/2000 | Garvison |
| 6,148,570 A | 11/2000 | Dinwoodie |
| 6,201,180 B1 | 3/2001 | Meyer |
| 6,205,719 B1 | 3/2001 | Bruce |
| 6,207,889 B1 | 3/2001 | Toyomura |
| 6,269,596 B1 | 8/2001 | Ohtsuka |
| 6,274,402 B1 | 8/2001 | Verlinden |
| 6,295,818 B1 | 10/2001 | Ansley |
| 6,313,395 B1 | 11/2001 | Crane |
| 6,337,283 B1 | 1/2002 | Verlinden |
| 6,360,491 B1 | 3/2002 | Ullman |
| 6,370,828 B1 | 4/2002 | Genschorek |
| 6,387,726 B1 | 5/2002 | Verlinden |
| 6,414,237 B1 | 7/2002 | Boer |
| 6,423,568 B1 | 7/2002 | Verlinden |
| 6,465,724 B1 | 10/2002 | Garvison et al. |
| 6,495,750 B1 | 12/2002 | Dinwoodie |
| 6,501,013 B1 | 12/2002 | Dinwoodie |
| 6,523,320 B2 | 2/2003 | Stoof |
| 6,534,702 B1 | 3/2003 | Makita |
| 6,534,703 B2 | 3/2003 | Dinwoodie |
| 6,546,535 B1 | 4/2003 | Nagao et al. |
| 6,568,873 B1 | 5/2003 | Peterson |
| 6,570,084 B2 | 5/2003 | Dinwoodie |
| 6,584,737 B1 | 7/2003 | Bradley, Jr. |
| 6,586,668 B2 | 7/2003 | Shugar |
| 6,617,507 B2 | 9/2003 | Mapes et al. |
| 6,634,077 B2 | 10/2003 | Layfield |
| 6,670,541 B2 | 12/2003 | Nagao |
| 6,672,018 B2 | 1/2004 | Shingleton |
| 6,675,545 B2 | 1/2004 | Chen |
| 6,675,580 B2 | 1/2004 | Ansley |
| 6,676,326 B2 | 1/2004 | Wu |
| 6,722,357 B2 | 4/2004 | Shingleton |
| 6,750,391 B2 | 6/2004 | Bower et al. |
| 6,761,008 B2 | 7/2004 | Chen |
| 6,784,360 B2 | 8/2004 | Nakajima |
| 6,809,251 B2 | 10/2004 | Dinwoodie |
| 6,809,253 B2 | 10/2004 | Dinwoodie |
| 6,935,623 B2 | 8/2005 | Cook |
| D510,315 S | 10/2005 | Shugar |
| D511,576 S | 11/2005 | Shingleton |
| 6,959,517 B2 * | 11/2005 | Poddany et al. ............. 52/173.3 |
| 6,968,654 B2 | 11/2005 | Moulder |
| RE38,988 E | 2/2006 | Dinwoodie |
| D516,017 S | 2/2006 | Mascolo |
| 6,993,917 B2 | 2/2006 | Unger |
| D519,444 S | 4/2006 | Mascolo |
| 7,043,884 B2 | 5/2006 | Moreno |
| 7,172,184 B2 | 2/2007 | Pavani et al. |
| 7,260,918 B2 | 8/2007 | Liebendorfer |
| 7,297,867 B2 | 11/2007 | Nomura |
| 7,307,209 B2 | 12/2007 | Mapes et al. |
| D560,605 S | 1/2008 | McClintock |
| D562,225 S | 2/2008 | Almy et al. |
| 7,328,534 B2 | 2/2008 | Dinwoodie |
| D564,958 S | 3/2008 | Almy et al. |
| 7,339,110 B1 | 3/2008 | Mulligan |
| D565,505 S | 4/2008 | Shugar |
| 7,406,800 B2 | 8/2008 | Cinnamon |
| 7,435,134 B2 | 10/2008 | Lenox |
| 7,435,897 B2 | 10/2008 | Russell |
| 7,592,537 B1 | 9/2009 | West |
| 7,600,349 B2 | 10/2009 | Liebendorfer |
| 7,634,875 B2 | 12/2009 | Genschorek |
| 7,677,242 B2 | 3/2010 | Carcangiu et al. |
| 7,748,175 B2 | 7/2010 | Liebendorfer |
| 7,762,832 B2 | 7/2010 | Minnick |
| 7,774,998 B2 | 8/2010 | Aschenbrenner |
| 7,797,889 B2 | 9/2010 | McClintock |
| 7,806,377 B2 | 10/2010 | Strizki |
| 7,832,157 B2 | 11/2010 | Cinnamon |
| 7,866,098 B2 | 1/2011 | Cinnamon |
| 7,866,099 B2 | 1/2011 | Komamine et al. |

(56) References Cited

U.S. PATENT DOCUMENTS

| | | | |
|---|---|---|---|
| 7,915,519 B2 | 3/2011 | Kobayashi | |
| 7,918,221 B2 | 4/2011 | Warfield et al. | |
| 7,956,281 B2 | 6/2011 | O'Brien et al. | |
| 7,987,641 B2 | 8/2011 | Cinnamon | |
| 8,039,733 B2 | 10/2011 | Kobayashi | |
| 8,109,048 B2* | 2/2012 | West et al. | 52/173.3 |
| 8,316,590 B2* | 11/2012 | Cusson | 52/173.3 |
| 8,430,372 B2 | 4/2013 | Haddock | |
| 2002/0046506 A1 | 4/2002 | Ullman | |
| 2002/0078991 A1 | 6/2002 | Nagao et al. | |
| 2002/0112435 A1 | 8/2002 | Hartman | |
| 2003/0010372 A1 | 1/2003 | Dinwoodie | |
| 2003/0015636 A1 | 1/2003 | Liebendorfer | |
| 2003/0015637 A1 | 1/2003 | Liebendorfer | |
| 2003/0070368 A1* | 4/2003 | Shingleton | 52/173.3 |
| 2003/0172922 A1 | 9/2003 | Haber | |
| 2003/0175071 A1 | 9/2003 | Layfield | |
| 2003/0201009 A1 | 10/2003 | Nakajima | |
| 2004/0007260 A1 | 1/2004 | Dinwoodie | |
| 2004/0031219 A1 | 2/2004 | Banister | |
| 2004/0063265 A1 | 4/2004 | Noble | |
| 2004/0163338 A1 | 8/2004 | Liebendorfer | |
| 2004/0179892 A1 | 9/2004 | Du Preez | |
| 2005/0115176 A1 | 6/2005 | Russell | |
| 2005/0126621 A1 | 6/2005 | Dinwoodie et al. | |
| 2005/0199278 A1 | 9/2005 | Aschenbrenner | |
| 2005/0257453 A1 | 11/2005 | Cinnamon | |
| 2006/0005875 A1 | 1/2006 | Haberlein | |
| 2006/0042680 A1 | 3/2006 | Korman et al. | |
| 2006/0118163 A1 | 6/2006 | Plaisted | |
| 2006/0137736 A1 | 6/2006 | Nishitani et al. | |
| 2006/0156651 A1 | 7/2006 | Genschorek | |
| 2007/0074755 A1 | 4/2007 | Eberspacher et al. | |
| 2007/0079865 A1 | 4/2007 | Warfield et al. | |
| 2007/0102036 A1 | 5/2007 | Cinnamon | |
| 2007/0131273 A1 | 6/2007 | Kobayashi | |
| 2007/0144575 A1 | 6/2007 | Mascolo | |
| 2007/0151594 A1 | 7/2007 | Mascolo et al. | |
| 2007/0157963 A1 | 7/2007 | Metten et al. | |
| 2007/0212935 A1 | 9/2007 | Lenox | |
| 2007/0266672 A1 | 11/2007 | Bateman et al. | |
| 2008/0000173 A1 | 1/2008 | Lenox et al. | |
| 2008/0029144 A1 | 2/2008 | Brazier | |
| 2008/0289679 A1 | 11/2008 | Ressler | |
| 2008/0302407 A1 | 12/2008 | Kobayashi | |
| 2009/0025314 A1 | 1/2009 | Komamine | |
| 2009/0026338 A1 | 1/2009 | Bruce | |
| 2009/0064606 A1 | 3/2009 | Ceria | |
| 2009/0078299 A1 | 3/2009 | Cinnamon | |
| 2009/0095280 A1 | 4/2009 | Buller et al. | |
| 2009/0134291 A1 | 5/2009 | Meier | |
| 2009/0166494 A1 | 7/2009 | Genschorek | |
| 2009/0242014 A1 | 10/2009 | Leary | |
| 2009/0320905 A1 | 12/2009 | Botkin et al. | |
| 2010/0043319 A1 | 2/2010 | Bennett | |
| 2010/0043781 A1 | 2/2010 | Jones | |
| 2010/0065108 A1 | 3/2010 | West | |
| 2010/0089390 A1 | 4/2010 | Miros | |
| 2010/0147362 A1 | 6/2010 | King et al. | |
| 2010/0154199 A1 | 6/2010 | Kobayashi | |
| 2001/0179678 | 7/2010 | Dinwoodie et al. | |
| 2010/0179678 A1 | 7/2010 | Dinwoodie et al. | |
| 2010/0192505 A1 | 8/2010 | Schaefer | |
| 2010/0218798 A1 | 9/2010 | Cinnamon | |
| 2010/0236162 A1 | 9/2010 | Tweedie | |
| 2010/0243023 A1 | 9/2010 | Patton et al. | |
| 2010/0269430 A1 | 10/2010 | Haddock | |
| 2011/0070765 A1 | 3/2011 | Kobayashi | |
| 2011/0100434 A1 | 5/2011 | Van Walraven | |
| 2011/0179727 A1 | 7/2011 | Liu | |
| 2011/0198304 A1 | 8/2011 | Wallgren | |
| 2011/0203637 A1 | 8/2011 | Patton et al. | |
| 2011/0214365 A1 | 9/2011 | Aftanas | |
| 2011/0214368 A1 | 9/2011 | Haddock et al. | |
| 2011/0220180 A1 | 9/2011 | Cinnamon | |
| 2011/0248131 A1 | 10/2011 | Genschorek | |
| 2012/0273029 A1 | 11/2012 | Bragagna et al. | |

FOREIGN PATENT DOCUMENTS

| | | | |
|---|---|---|---|
| DE | 4444439 A1 | 4/1995 | |
| DE | 2970348 | 11/1997 | |
| DE | 102005002828 | 8/2006 | |
| DE | 102005002828 A1 | 8/2006 | |
| GB | 2391704 | 2/2004 | |
| JP | 47-023570 | 7/1971 | |
| JP | 47-057885 | 5/1972 | |
| JP | 57-087561 | 1/1982 | |
| JP | 57-077856 | 5/1982 | |
| JP | 57087561 A | 6/1982 | |
| JP | 58-133945 | 9/1983 | |
| JP | 59-191748 | 12/1984 | |
| JP | 02-42449 | 3/1990 | |
| JP | 04-052367 | 2/1992 | |
| JP | 06-41156 | 5/1994 | |
| JP | 07153982 | 6/1995 | |
| JP | 07-202242 | 8/1995 | |
| JP | 08-296311 | 11/1996 | |
| JP | 08296311 A | 11/1996 | |
| JP | 10-176403 | 6/1998 | |
| JP | 10-266499 | 10/1998 | |
| JP | 10-317619 | 12/1998 | |
| JP | 10-317621 | 12/1998 | |
| JP | 11-002004 | 1/1999 | |
| JP | 11-002011 | 1/1999 | |
| JP | 11-006262 | 1/1999 | |
| JP | 11-040835 | 2/1999 | |
| JP | 11-222991 | 8/1999 | |
| JP | 11222991 A | 8/1999 | |
| JP | 2000-150947 | 5/2000 | |
| JP | 2000147262 | 5/2000 | |
| JP | 2000345664 | 12/2000 | |
| JP | 2000345664 A | 12/2000 | |
| JP | 2001-148493 | 5/2001 | |
| JP | 2001-210853 | 8/2001 | |
| JP | 2002-141541 | 5/2002 | |
| JP | 2002-294957 | 10/2002 | |
| JP | 2003-227207 | 8/2003 | |
| JP | 10-159284 | 6/2008 | |
| JP | 10159284 A | 6/2008 | |
| JP | 2008214875 | 9/2008 | |
| WO | 9738185 | 10/1997 | |
| WO | 200103206 | 1/2001 | |
| WO | 2005089192 | 9/2005 | |
| WO | WO2005116359 | 12/2005 | |
| WO | 2007045695 | 4/2007 | |
| WO | 2007103882 A2 | 9/2007 | |
| WO | WO 2007103882 | 9/2007 | |
| WO | 2008108909 | 9/2008 | |
| WO | 2008124158 A1 | 10/2008 | |
| WO | WO2008124158 * | 10/2008 | H01M 10/44 |
| WO | 2010074701 A1 | 7/2010 | |
| WO | WO2010/074701 | 7/2010 | |

OTHER PUBLICATIONS

International Search Report and Written Opinion mailed Jun. 30, 2011 in International Application No. PCT/US2010/040984.

International Search Report and Written Opinion mailed Jul. 7, 2011 in International Application No. PCT/US2010/040986.

English Translation of Abstract for DE Publication No. 102005002828 published Aug. 3, 2006.

Office Action mailed May 3, 2011 in U.S. Appl. No. 12/830,249.

Response to Office Action filed Jul. 5, 2011 in U.S. Appl. No. 12/830,249.

Office Action mailed Apr. 26, 2011 in U.S. Appl. No. 12/830,252.

Response to Office Action filed Jun. 27, 2011 in U.S. Appl. No. 12/830,252.

Office Action mailed Apr. 26, 2011 in U.S. Appl. No. 12/830,257.

Response to Office Action filed Jun. 27, 2011 in U.S. Appl. No. 12/830,257.

(56) References Cited

OTHER PUBLICATIONS

English Translation of Abstract for JP Publication No. 2008214875 published Sep. 18, 2008.
Sharp Product Brochure, The OnEnergy Solar Racking System for Asphalt-Shingle Roofs with Flashing Attachment, 2008.
English Translation of DE Publication No. 4444439 published Apr. 27, 1995.
English Translation of Abstract for JP Publication No. 10159284 published Jun. 16, 2008.
English Translation of Abstract for JP Publication No. 2000345664 published Dec. 12, 2000.
English Translation of Abstract for JP Publication No. 57087561 published Jun. 1, 1982.
English Translation of Abstract for JP Publication No. 11222991 published Aug. 17, 1999.
English Translation of Abstract for JP Publication No. 08296311 published Nov. 12, 1996.
Office Action dated Apr. 4, 2008 in U.S. Appl. No. 11/053,524 (now US Patent 7,592,537).
Response to Office Action filed Jul. 10, 2008 in U.S. Appl. No. 11/053,524 (now US Patent 7,592,537).
Notice of Non-Compliant Amendment dated Sep. 23, 2008 in U.S. Appl. No. 11/053,524 (now US Patent 7,592,537).
Response to Notice of Non-Compliant Amendment filed Oct. 27, 2008 in U.S. Appl. No. 11/053,524 (now US Patent 7,592,537).
Final Office Action dated Feb. 17, 2009 in U.S. Appl. No. 11/053,524 (now US Patent 7,592,537).
Response to Final Office Action filed May 27, 2009 in U.S. Appl. No. 11/053,524 (now US Patent 7,592,537).
Notice of Allowance and Fee(s) Due dated Aug. 12, 2009 in U.S. Appl. No. 11/053,524 (now US Patent 7,592,537).
Re-Exam U.S. Appl. No. 95/001,304, filed Apr. 2, 2010.
Preliminary Amendment filed Mar. 24, 2010 in U.S. Appl. No. 12/594,935.
CI Solar Supplies Co. On-Line Catalog, [last modified: Mar. 13, 2010], Retrieved from the Internet: <URL: http://www.cisolar.com/catSolarHotColl.htm>.
U.S. Appl. No. 12/830,249, filed Jul. 2, 2010.
U.S. Appl. No. 12/830,252, filed Jul. 2, 2010.
U.S. Appl. No. 12/830,257, filed Jul. 2, 2010.
Solarex VLX PV Module, circa 1993.
Solyndra 200 Series datasheet, released Apr. 1, 2011.
Unirac Technical Bulletin 103, May 2002.
Unirac Installation Manual 210, 2003.
PanelClaw "Grizzly Bear Flat Roof Mounting System", http://www.panelclaw.com/grizzly-bear.html, pp. 1-2, retrieved May 6, 2014.
PanelClaw "Kodiak Bear Flat Roof Mounting System", http://www.panelclaw.com/component/k2/item/41.html?Itemid=186, pp. 1-2, retrieved May 6, 2014.
US 5,819,447, 10/1998, Yamawaki (withdrawn)

\* cited by examiner

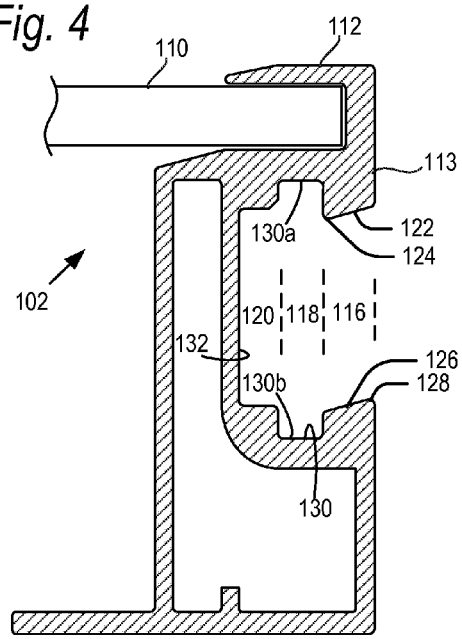
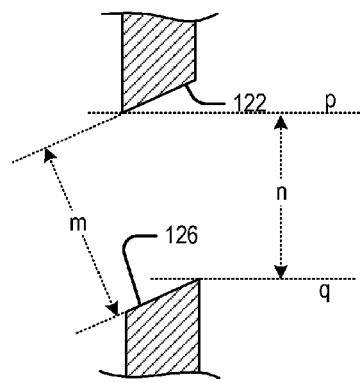
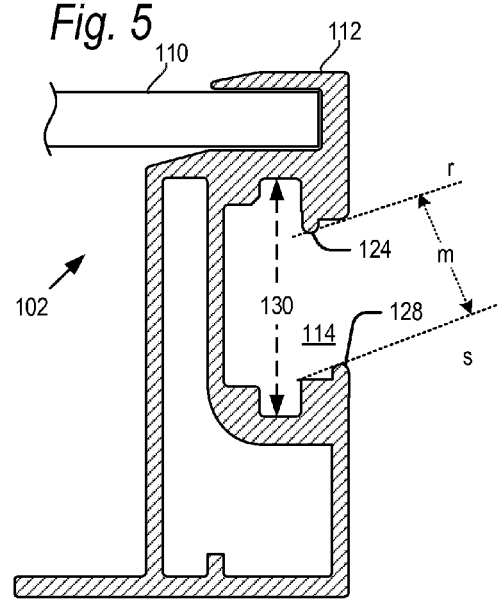

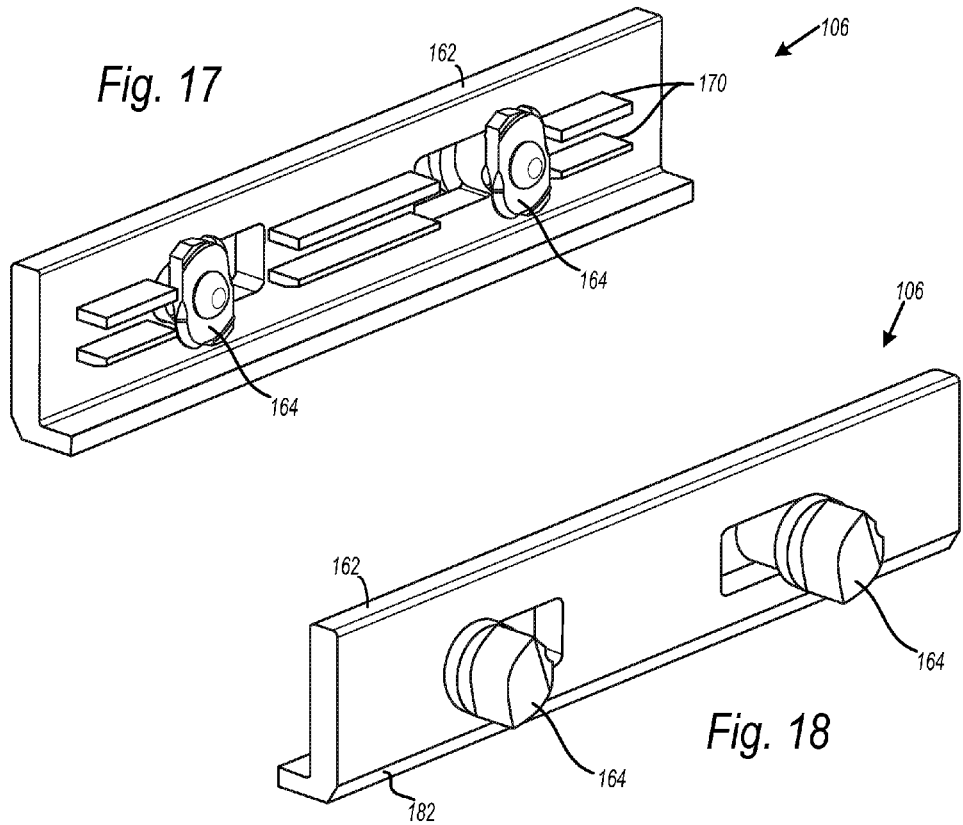
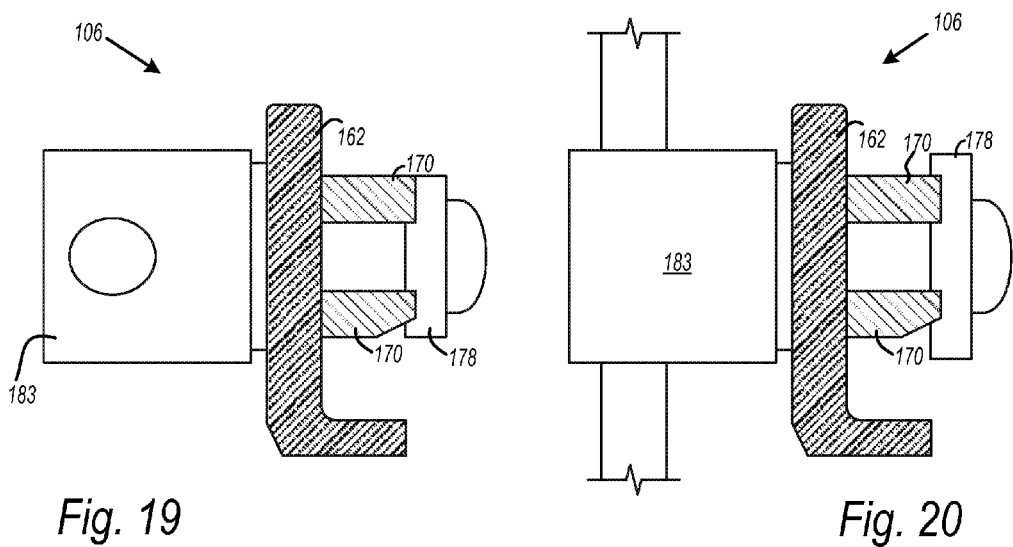

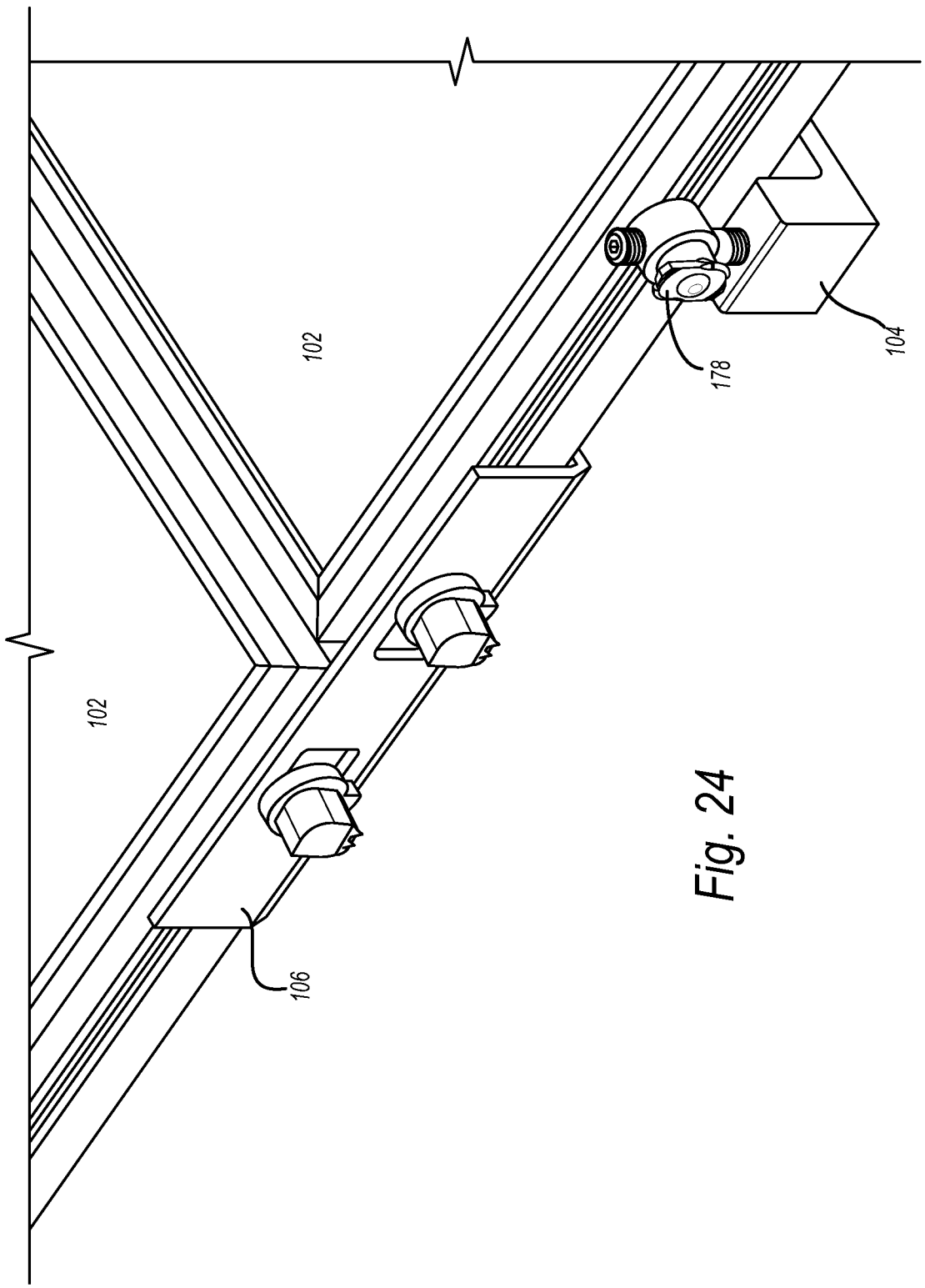

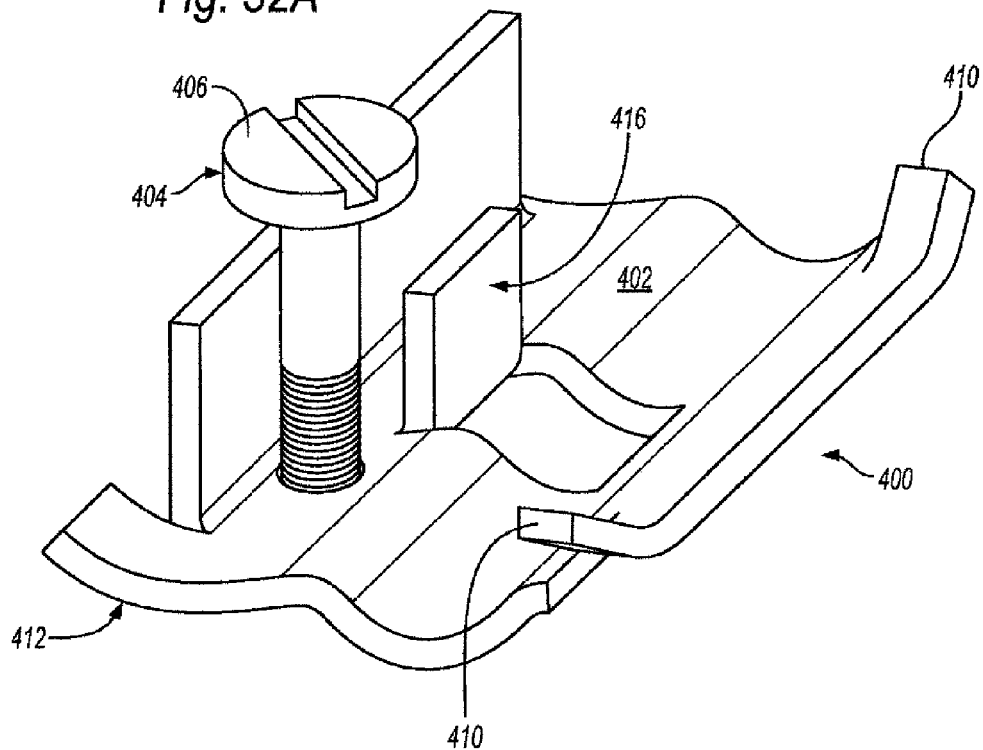
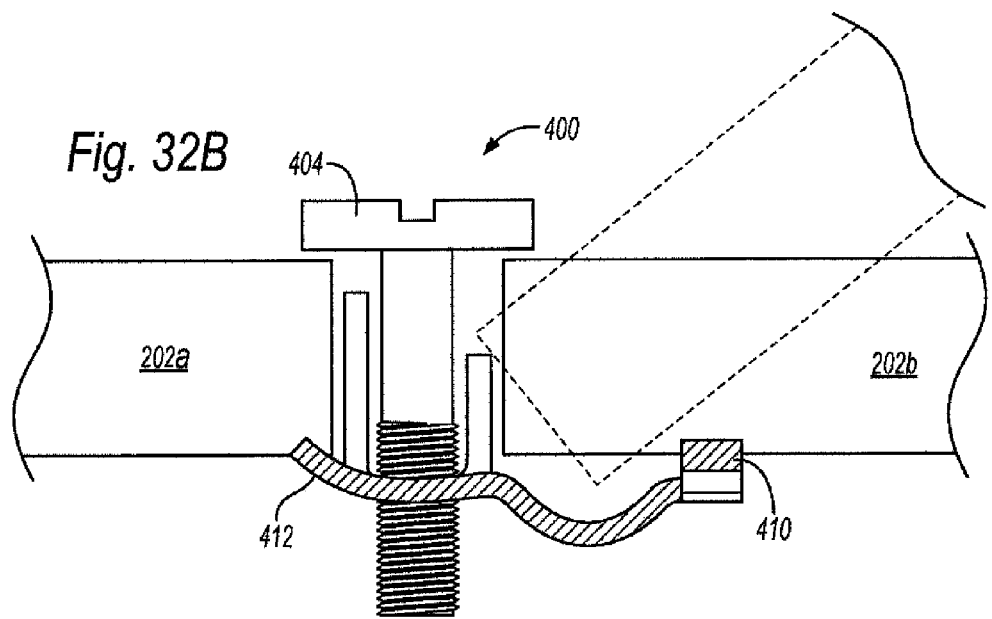

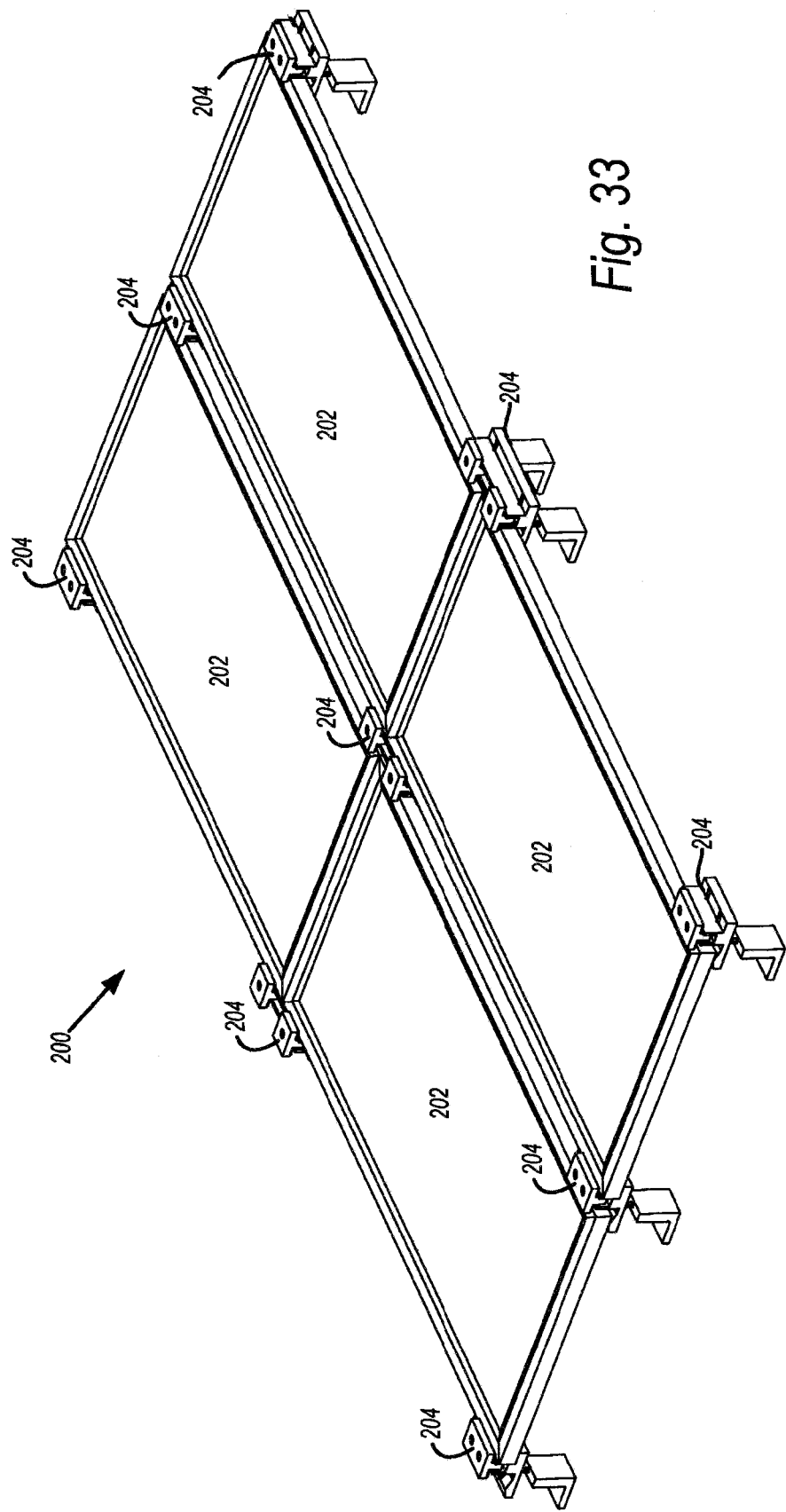

us 8,991,114 B2

PIVOT-FIT CONNECTION APPARATUS, SYSTEM, AND METHOD FOR PHOTOVOLTAIC MODULES

CROSS-REFERENCE TO RELATED APPLICATIONS

The present application claims priority to Provisional Patent Application No. 61/270,122, entitled "Forming and Mounting a Photovoltaic Array," filed Jul. 2, 2009; the present application claims priority to Provisional Patent Application No. 61/255,004, entitled, "Forming and Mounting a Photovoltaic Array: Hardware and Software Improvements," filed Oct. 26, 2009; and the present application claims priority to Provisional Patent Application No. 61/351,586, entitled, "Pivot-Fit Connection System, Apparatus and Method For Photovoltaic Arrays," filed Jun. 4, 2010. Each of these applications is incorporated by reference herein in their entirety.

BACKGROUND

Photovoltaic (PV) arrays are formed by mechanically linking together PV modules into an array. Most PV module coupling systems require the time-consuming use of multiple small fasteners. High part count and slow installation time is a major barrier to reducing PV system costs and adoption. Some attempts have been made to reduce fastener usage by developing press-fit and hook-type connections. However, these systems suffer from a number of drawbacks.

First, neither of these methods can adequately account for variations in the dimensions of PV modules and couplings due to manufacturing tolerances. PV modules typically vary by approximately ±0.10" along the length and/or width dimension. When multiple modules are formed into columns in the north-south direction of the PV array, it is critical that any dimensional variations from one module in the column not carry forward to the next module in the column, as the dimensional variations will add up over the length of the column and result in significant dimensional differences from one column to the next. Likewise, the same problem exists with east-west rows of PV modules. This problem, frequently referred to as tolerance take-up, is solved in rail-based systems by spacing the modules in a column more or less from each other on top of mounting rails so that the next module in the column is properly positioned and/or by only linking modules to the rails along one axis, either east-west or north-south. However, in rail-free systems, a PV module is structurally connected to the next module in both the north-south direction and the east-west direction. Thus, if the seams between adjacent east-west modules do not line up because of compounded north-south dimensional variations, then it may be impossible to complete the installation of an array. In other systems compounded east-west variations may cause problems along the north-south axis. Press-fit and hook-type connections do not adequately address or solve the problem of tolerance variations.

Second, press-fit and hook-type connections do not provide a reliable electrical ground bond between adjacent PV modules. Hook-type connections are inherently loose-fitting and thus incapable of providing a consistent, low-resistance ground bond that will withstand weather conditions over time. Similarly, a press-fit connection does not provide a reliable ground bond unless the materials are deformed enough in the connection. In practice, too much force is required to achieve such deformation with standard PV module frame materials such as aluminum, thereby eliminating any time and cost savings that might have occurred since a heavy-duty tool would be required to deliver the force needed for the deformation.

Third, press-fit and hook-type systems cannot reliably provide a strong, durable connection between mating male and female parts. In order to facilitate a quick and easy connection, the female receiving portion in the connection is made wider than the male connecting portion. This results in a loose or unstable connection, which is vulnerable to loosening over time as the PV modules experience mechanical stress due to wind and snow loads.

It is also important to note that PV mounting systems require a design that works with a wide tolerance band. The reason is that production of tight tolerance PV modules and couplings is very expensive. In order to accelerate the adoption of solar power, it is necessary to reduce the cost of solar arrays, thus increased costs for tight tolerance parts is not a viable option in the market.

SUMMARY

Disclosed herein is a system and method for quickly and easily assembling PV modules into a PV array in a sturdy and durable manner. In some embodiments, the PV modules may have a grooved frame where the groove is angled into the frame with respect to the planar surface of the modules. Various components may engage within the angled groove to assemble the PV modules into the PV array using what may be referred to as a pivot-fit connection between the components and angled groove. One type of component is a leveling foot which in some embodiments includes a foot mounted to a support surface and a coupling affixed to the foot. The coupling of the leveling foot may have a male component such as a tongue for coupling within the groove. In order to mount a PV module to the leveling foot, the module is seated on the tongue and rotated down until the angle of the groove substantially aligns with the axis of the tongue. The groove may then seat at least partially over the tongue. To complete the pivot-fit connection, the PV module is simply pivoted down to its final angular orientation in the PV array. This final rotation causes bearing portions in the groove to bear against the tongue to restrain the PV module against upward or downward movement. The coupling may still allow for adjustment of the PV module position in the plane of the PV array to account for tolerance variations.

Another type of coupling is an interlock having an interlock plate and a pair of couplings, each having a key supported on a shaft. The interlock may be affixed into the groove of a pair of adjacent modules with the angle of the key and shaft substantially matching the angle of the groove. Thereafter, rotation of the key and shaft pivots the interlock into the grooves of the adjacent PV modules, thereby affixing the adjacent modules together. This final rotation causes bearing portions in the groove to bear against the interlock plate to resist upward or downward movement of the coupled PV modules. The coupling may still allow for adjustment of the PV module position in the plane of the PV array to account for tolerance variations.

Further embodiments of the present technology may operate with PV modules having frames without the angled grooves. For such embodiments, wraparound brackets are used which engage the upper and lower surfaces of the module frame, or the PV laminate itself in some embodiments where the frame is omitted. In such embodiments, the wraparound component may have frame-engaging or laminate-engaging couplings provided at an angle as in the angled groove of the above embodiments. The PV modules may initially engage with the wraparound components substantially at the angle of the couplings, and thereafter be pivoted down to their final position relative to the coupling. As in the grooved frame embodiments, this final rotation causes bearing portions in the wraparound coupling to bear against the PV module frame to restrain the PV module in position in the array.

An embodiment of the present technology relates to an array of photovoltaic modules connected together by couplings. The first coupling of said couplings includes: a first engaging portion adapted to engage a first photovoltaic module; and a second engaging portion adapted to pivotally engage a second photovoltaic module along a length of a side of said second photovoltaic module, said length being substantially parallel with a plane of a laminate of said second photovoltaic module; wherein said second engaging portion is adapted to allow variable positioning of said second photovoltaic module relative to said first coupling in a direction substantially parallel with said plane and perpendicular to said length.

Another embodiment relates to a coupling for connecting a photovoltaic module to an adjacent photovoltaic module in a photovoltaic array. The adjacent photovoltaic module comprising a frame, the coupling includes: a first engaging portion adapted to engage said photovoltaic module; and a second engaging portion adapted to engage said adjacent photovoltaic module at an insertion angle greater than 2 degrees relative to a plane of said photovoltaic module, wherein at least one of said second engaging portion and said frame is adapted to flex open as at least one of said coupling and said frame is rotated from said insertion angle to a position substantially parallel with said plane.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter. Furthermore, the claimed subject matter is not limited to implementations that solve any or all disadvantages noted in any part of this disclosure.

BRIEF DESCRIPTION OF THE DRAWINGS

FIG. 4 is a cross-sectional view showing a groove in the frame of the PV module.

FIG. 4A illustrates the geometries defined by the sloped surfaces of the groove formed in the frame of the PV module according to an embodiment of the present technology.

FIG. 5 is a cross-sectional view of the frame showing a groove configuration according to an alternative embodiment of the present technology.

FIG. 6 is a cross-sectional view of the frame showing a groove configuration according to a further alternative embodiment of the present technology.

FIG. 17 is a perspective view of the first side of an interlock assembled together according to an embodiment of the present technology.

FIG. 18 is a perspective view of a second side of an interlock according to an embodiment of the present technology.

FIG. 19 is a cross-sectional side view of an interlock showing a key in a first position.

FIG. 20 is a cross-sectional side view of an interlock showing the key rotated 90° from that shown in FIG. 19.

FIG. 24 is a perspective view of a pair of panels joined together by an interlock and a leveling foot supporting the panels according to an embodiment of the present technology.

FIGS. 32A and 32B are a further alternative embodiment of an interlock for mounting PV modules which do not have a groove in the frame according to an embodiment of the present technology.

FIG. 33 is a perspective view of at least a portion of a PV array formed with the couplings of FIGS. 29 through 32.

DETAILED DESCRIPTION

Figure 62:
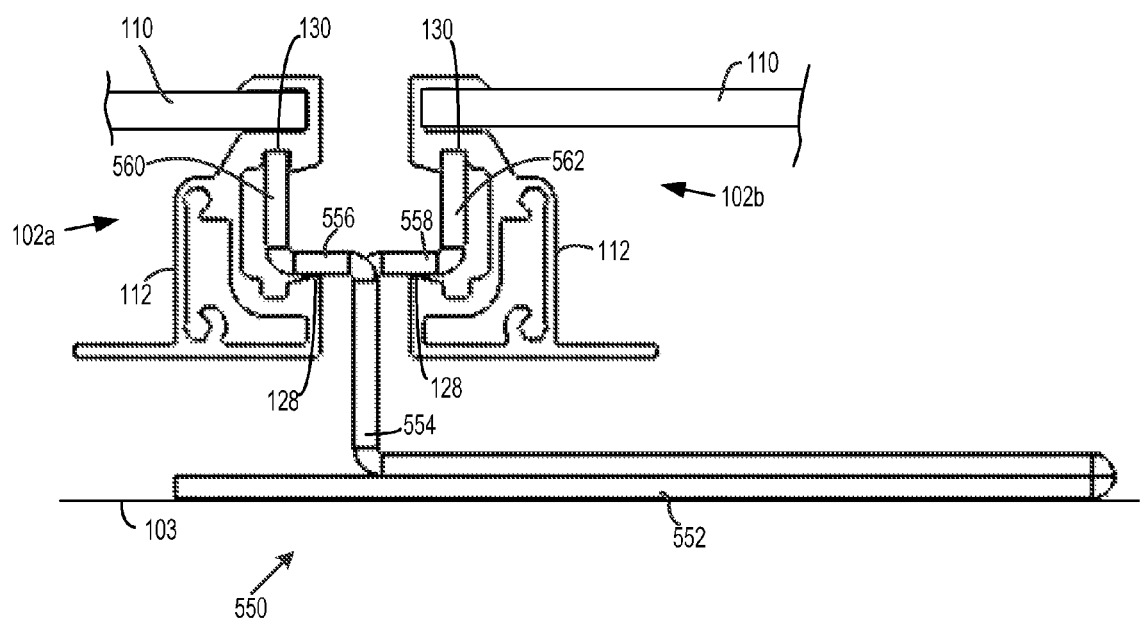
FIG. 62 is a side view of a key slot-engaging coupling according to embodiments of the present technology.

Embodiments of the present technology will now be described with reference to FIGS. 1-62, which in general relate to a system, apparatus and method for quickly and easily assembling a PV array in a sturdy and durable manner. It is understood that the present technology may be embodied in many different forms and should not be construed as being limited to the embodiments set forth herein. The terms top, bottom, upper, lower, left, right, north, south, east, west, and derivations of these terms as they may appear in this description are used for convenience and illustrative purposes only, and are not meant to limit the description inasmuch as the referenced item can be exchanged in position.

Figure 1:
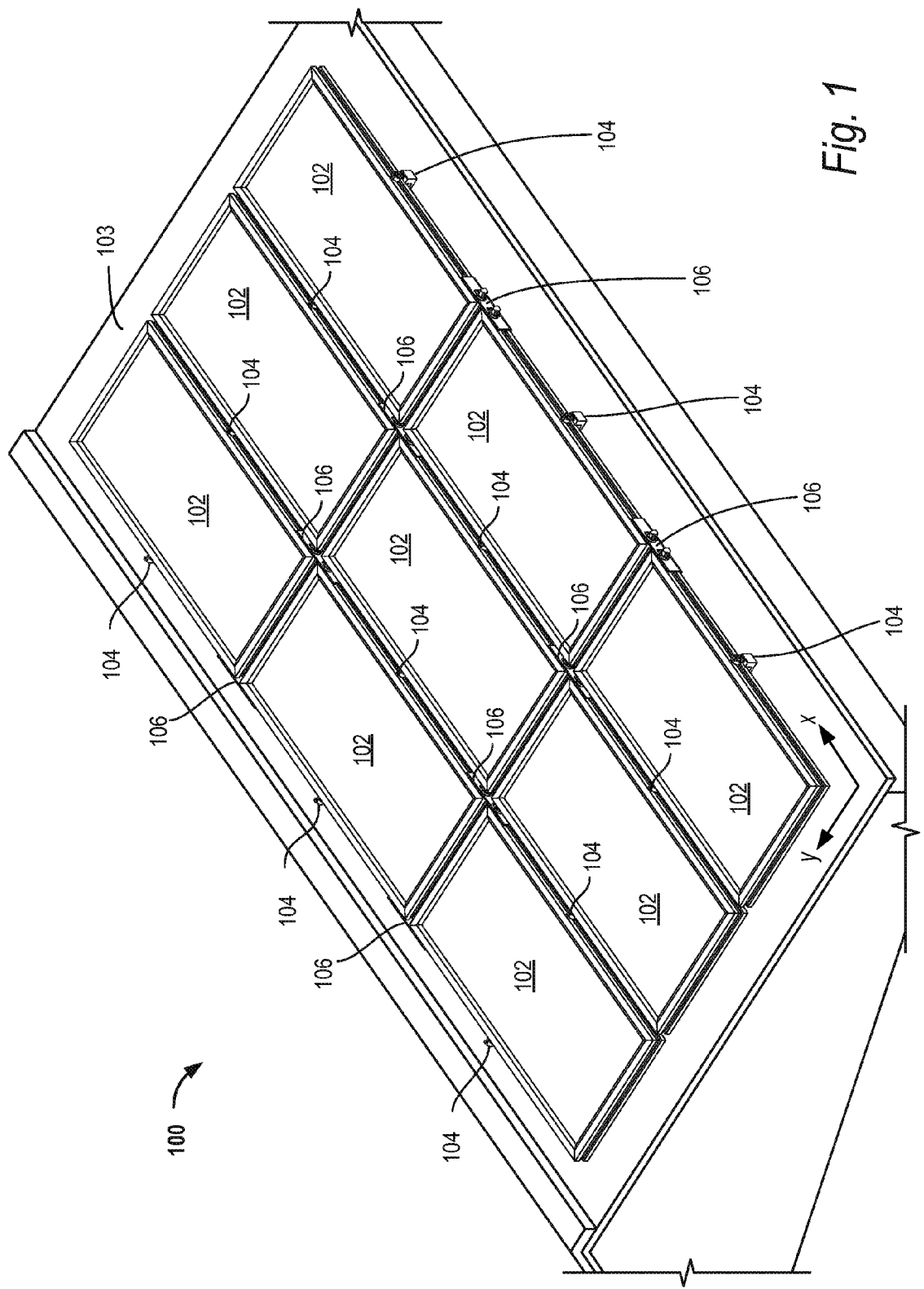
FIG. 1 is a perspective view of a PV array mounted on a roof

Referring now to FIG. 1, there is shown a perspective view of a PV array 100 including a plurality of PV modules 102 laid out in an x-y reference plane on a support structure 103. Mounting structure 103 is herein shown as including a planar surface, however it may be a structure with thickness, width, depth, and other dimension(s); in reference to any mounting structure, such as mounting structure 103, the height adjustment of a coupling described hereinafter is considered relative to any essential surface or essential plane, such as a top surface. The y-direction corresponds to the north-south dimension of the array, and the x-direction corresponds to the east-west direction. In the embodiment of FIG. 1, the reference plane is defined as being coextensive with a surface of the PV modules, when the PV modules are positioned in their final installed positions. However, in further embodiments, some of which are illustrated below, the reference plane may be above an upper surface of the PV modules 102, or below the lower surfaces of the PV modules 102. The PV array 100 may be assembled together and attached to the support structure 103 by means of leveling feet, wraparound leveling feet, double-tongue feet, key coupling feet, brackets, feet, tilt feet, or T-feet, such as leveling feet 104, and interlocks, wraparound interlocks, series coupling rails, series/parallel couplings, male coupling members, splices, parallel couplings, double-key couplings, or key couplings, such as interlocks 106, the structure and operation of which are explained below. Other components may be coupled to array 100 such as for example a grounding coupling and accessory coupling, also explained below. The PV array 100 of FIG. 1 is shown by way of example only. It is understood that array 100 may have more or less modules 102 in the x and/or y direction. In the embodiment shown, the support structure 103 may be a roof, such as a slanted roof of a residential dwelling or the like. However, it is understood that the PV array 100 may be supported on a wide variety of other support surfaces, such as for example a flat roof, a ground-mounted structure or, in some embodiments, a vertical support structure. The defined x-y reference plane of the PV array is substantially parallel to support structure 103, and may be oriented in any of a wide variety of angles from horizontal to vertical.

Figure 2:
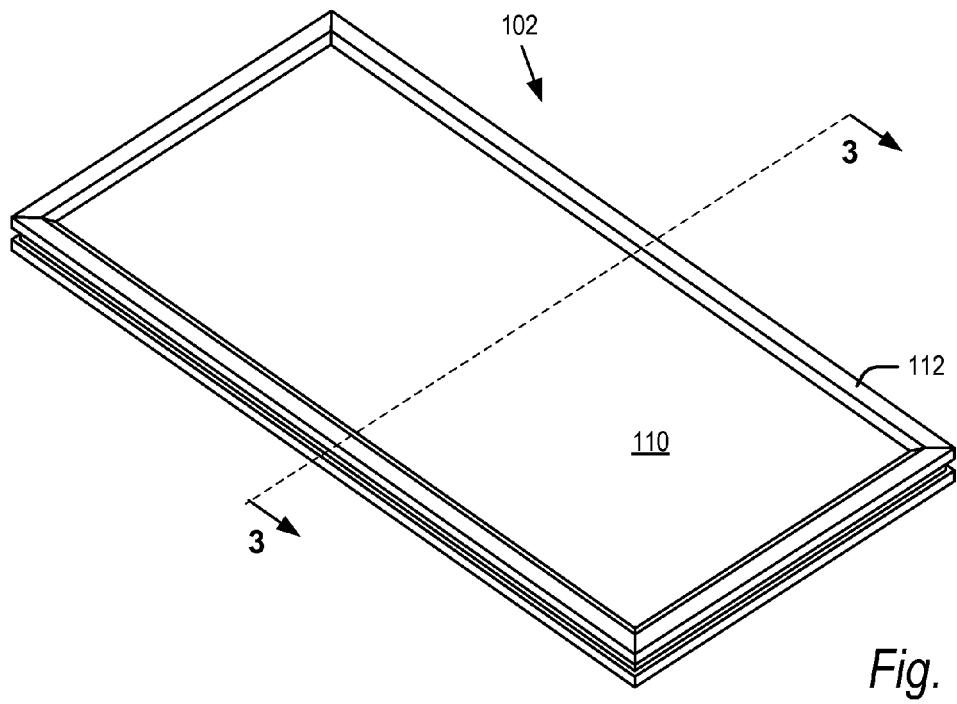
FIG. 2 is a perspective view of a PV module used in the PV array of FIG. 1.

FIG. 2 is a perspective view of a PV module 102 used in the array 100. A PV module, such as PV module 102, without a groove according to the present technology, is generally disclosed in U.S. Pat. No. 7,592,537, entitled "Method and Apparatus for Mounting Photovoltaic Modules," which patent is incorporated by reference herein in its entirety. In some embodiments, module 102 may include a PV laminate 110 surrounded and supported on two or four sides by a frame 112. PV laminate 110 may include any of various photovoltaic materials for converting solar radiation to electric current. Frame 112 may be formed of any of various rigid or semi-rigid materials, including for example extruded aluminum with an anodized coating. Other materials, plastics, and coatings are contemplated.

Figure 3:
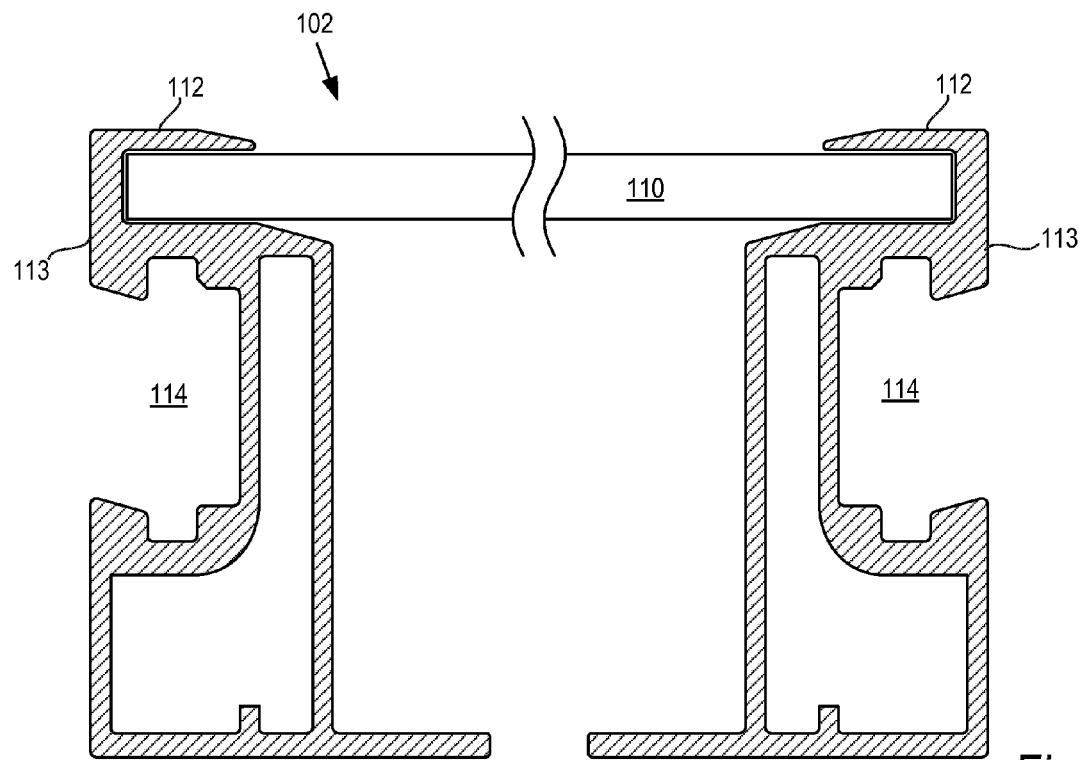
FIG. 3 is a cross-sectional view through line 3-3 of FIG. 2.

Frame 112 may include a hollow portion for connecting the corners together with corner keys, as is well-known in the art, or it may include screw receptacles for attaching the corners together with screws, as is also well-known. Frame 112 may include a connection portion such as groove 114 in accordance with the present technology provided on one, two, three or all four exterior facing portions of the frame 112, usually with an external surface 113. FIG. 3 illustrates a cross-sectional side view through line 3-3 of FIG. 2 showing further detail of groove 114. In some embodiments, groove 114 may have the same cross-sectional configuration around the entire periphery of frame 112, though different sides may have different configurations in further embodiments. FIG. 4 is a partial cross-sectional view showing a single side of the frame 112. As seen in FIG. 4, a groove 114 may in general be divided into three vertical regions (from the perspective of FIG. 4). A proximal region 116 adjacent to an external surface 113 of frame 112, a distal region 120 defining a back wall of groove 114 and located farthest from the external surface 113 of frame 112, and a medial region 118 between the proximal and distal regions.

Proximal region 116 may be defined by a pair of sloped surfaces—upper sloped surface 122 and lower sloped surface 126. Sloped surfaces 122 and 126 may in general be parallel to each other and sloped at an angle of 15° with respect to a planar surface of module 102 (such as, a plane in which a surface of PV laminate 110 resides). It is understood that sloped surfaces 122 and 126 need not be parallel to each other, and may form other oblique angles with respect to the planar surface of the module 102 that are less than or greater than 15° in further embodiments. The angle of sloped surfaces 122 and 126 with respect to the planar surface of module 102 defines an angle, referred to herein as the insertion angle, which is explained in greater detail below. Further examples of the insertion angle include but are not limited to 2° or greater, 5° or greater, 10° or greater and 20° or greater.

Upper surface 122 includes a bearing portion 124, which represents the bottommost portion of upper surface 122 from the perspective of FIG. 4. Bearing portion 124 may be a line along the groove 114 where the sloped surface 122 and the adjacent interior groove wall come together. The bearing portion 124 may have a sharp profile, or the bearing portion may instead have a rounded or flattened profile in further embodiments. Similarly, lower sloped surface 126 may include a bearing portion 128, which represents the upper-most portion of lower surface 126 from the perspective of FIG. 3. Bearing portion 128 may be a line along the groove 114 where sloped surface 126 and the adjacent interior wall come together. The bearing portion 128 may have a sharp profile, or the bearing portion may instead have a rounded or flattened profile in further embodiments. Bearing portions 124 and 128 may be offset from each other horizontally; that is, bearing portion 128 may be located at the external surface 113 of frame 112 and bearing portion 124 may be located distally of the external surface 113 in the horizontal direction.

Particular geometries defined by sloped surfaces 122 and 126 are explained in greater detail now with respect to FIG. 4A. As noted above, sloped surfaces 122 and 126 may be parallel to each other in some embodiments of the present technology. In such an embodiment, a distance, m, represents the perpendicular distance between the two sloped surfaces 122 and 126. FIG. 4A also shows planes p and q (into the page), which are planes through bearing portions 124 and 128, respectively, and which planes are substantially parallel to the planar surface of module 102. A distance, n, is the perpendicular distance between planes p and q. In some embodiments, the distance m may be greater than the distance n. The significance of this is explained in greater detail below. In some embodiments, the distance m may for example be 0.51" and the distance n may for example be 0.50". These dimensions are by way of example only and may vary together or disproportionately in further embodiments.

Medial region 118 includes an upper recess 130a in an upper portion of groove 114 and a lower recess 130b in a lower portion of groove 114 (from the perspective of FIG. 4). Recesses 130a and 130b together define a key slot 130 in the medial portion of groove 114 for receiving a key of various couplings as described hereinafter. The length from upper recess 130a to lower recess 130b may be longer than the distance between the sloped surfaces 122, 126. Distal region 120 is defined between the distal most portion of key slot 130 and a back wall 132 of groove 114.

In the embodiment described above, bearing portions 124, 128 are provided in sloped surfaces 122, 126, respectively. It is understood that bearing portions 124 and/or 128 may be provided in other shaped surfaces of frame 112 in other embodiments. As one such example, FIG. 5 shows a bearing portion 128 in a sloped surface as described above. However, bearing portion 124 may be a protrusion from an otherwise essentially flat surface parallel to the planar surface of the module 102. Bearing portion 128 may be formed as a protrusion on an otherwise flat surface in addition to, or instead of, the bearing portion 124 in further embodiments. Given this disclosure and the disclosure that follows, those of skill in the art will appreciate other possible configurations of the surfaces including bearing portions 124, 128, with the provision that bearing portions 124 and 128 are spaced from each other vertically and offset from each other horizontally. The distance m of FIG. 4A is found in FIG. 5 in a manner similar to FIG. 4A. In FIG. 5 as shown, a first plane r may be defined which is tangential to bearing projection 124 and the proximal (outer) edge of the upper sloped surface 122. A second plane s may be defined which is tangential to bearing projection 128 and the distal (inner) edge of the lower sloped surface 126. The distance m may be defined by the perpendicular distance between the two defined planes.

In addition to variations in proximal region 116 as described above, regions 118 and/or 120 may have other configurations in further embodiments. For example, FIG. 6 shows a cross-sectional side view as in FIG. 4, but key slot 130 is omitted. In some embodiments, frame 112 may have four sides, with a first side having a configuration as shown in FIG. 4, and an opposed side having a configuration as shown in FIG. 6, or other configurations as may be apparent to those with skill in the art. In other embodiments, frame 112 may have two sides with grooves 114 and two sides with no groove.

As explained below, the present technology includes couplings with male components that mate within female components, such as the groove 114, at the insertion angle. In another embodiment it is contemplated that one or more of the respective positions of the male components and/or female components may be reversed, so that the frame includes or forms protruding male components, and the couplings include female components receiving the male components of the frame at the insertion angle.

Figure 6A:
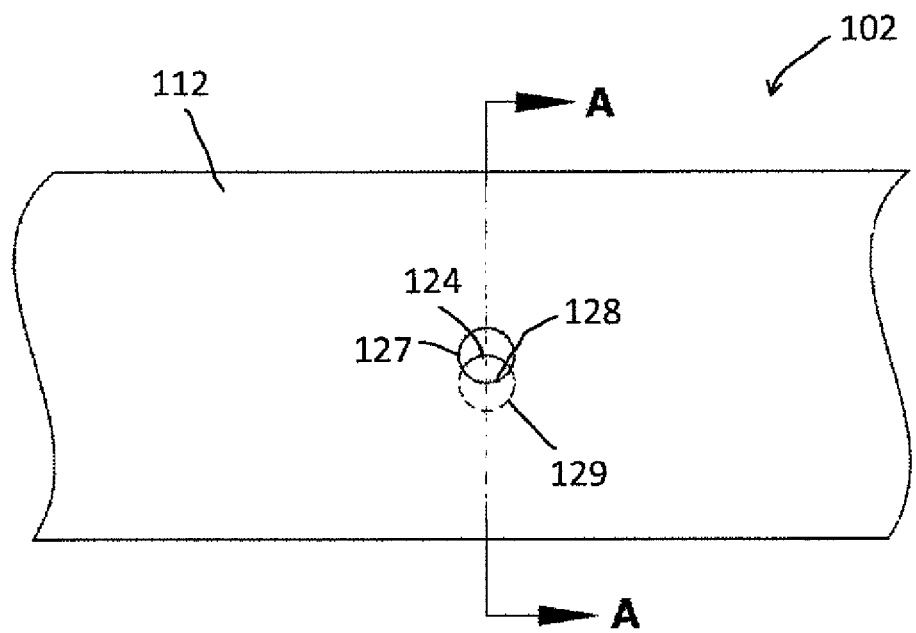
FIGS. 6A and 6B are front and cross-sectional views of the frame showing a bearing surface configuration according to a further alternative embodiment of the present technology.
Figure 6B:
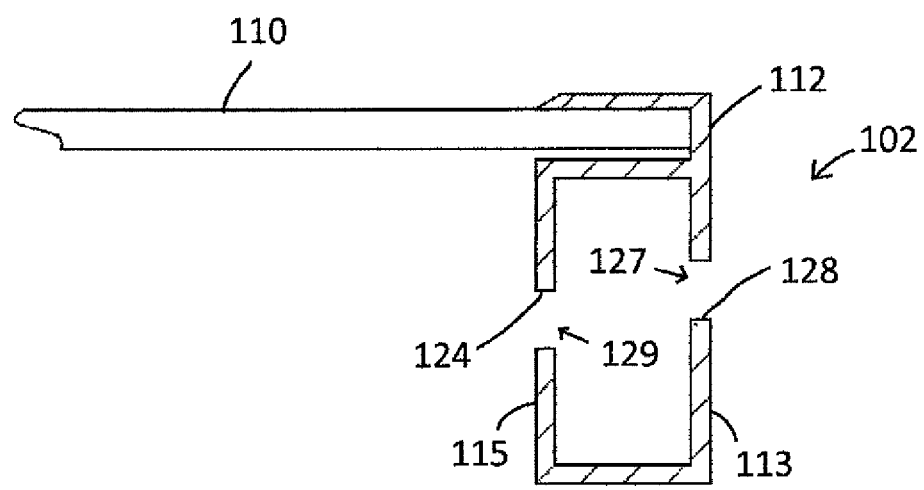

FIGS. 6A and 6B show a further embodiment of the frame 112, where FIG. 6A is a front view of a frame 112, and FIG. 6B is a cross-sectional view through line A-A of FIG. 6A. In this embodiment, frame 112 does not have an angled groove 114 with bearing surfaces 124, 128 as described above, and the structure of frame 112 defining the proximal section 116, medial section 118 and distal section 120 may be omitted. In this embodiment, the bearing surface 128 may be defined by a hole 127 formed through a front surface 113 of the frame 112. The bearing surface 124 may be defined by a hole 129 formed through a rear surface 115 of the frame 112 opposite the front surface 113. The holes 127, 129 may be circular with a variety of diameters, and formed by drilling through the front and rear surfaces 113, 115. However, the holes may be square, rectangular, oval or other shapes and formed by methods other than drilling in further embodiments. The bearing surface 128 may be on a bottom portion of the hole 127 and the bearing surface 124 may be on a top portion of hole 129.

As seen in FIG. 6A, the holes 127, 129 may be aligned with each other horizontally from the perspective of FIG. 6A, but the hole 127 defining bearing surface 128 may be vertically higher than the hole 129 defining bearing surface 124. As explained hereinafter, various couplings are provided having a male portion, such as for example a tongue 148 shown in FIGS. 8-10. These male portions may be inserted between bearing portions 128 and 124 shown in FIG. 4 at an insertion angle parallel to the upper and lower surfaces 122 and 126 of frame 112. Thereafter, the male portion or frame 112 may be rotated so that the mail portion engages the bearing portions 128 and 124 to restrain relative movement between the male portion and bearing surfaces in a vertical direction. This feature of the present technology is explained in greater detail below.

Referring again to FIGS. 6A and 6B, the male couplings described hereinafter may have a diameter and length to fit within both holes 127 and 129. Where frame 112 is formed with holes 127 and 129 according to this embodiment, a male coupling may be inserted through hole 127 and then through hole 129. The coupling may be inserted at an insertion angle defined by an axis passing holes 127 and 129. As the holes are vertically offset from each other, this insertion angle may be greater than 0°, and may for example be 15°. Thereafter, the male portion or frame 112 may be rotated so that the mail portion engages the bearing surfaces 128 and 124 to restrain relative movement between the male portion and the bearing surfaces 128, 124 in a vertical direction. Again, this engagement is explained in greater detail hereinafter.

Figure 7:
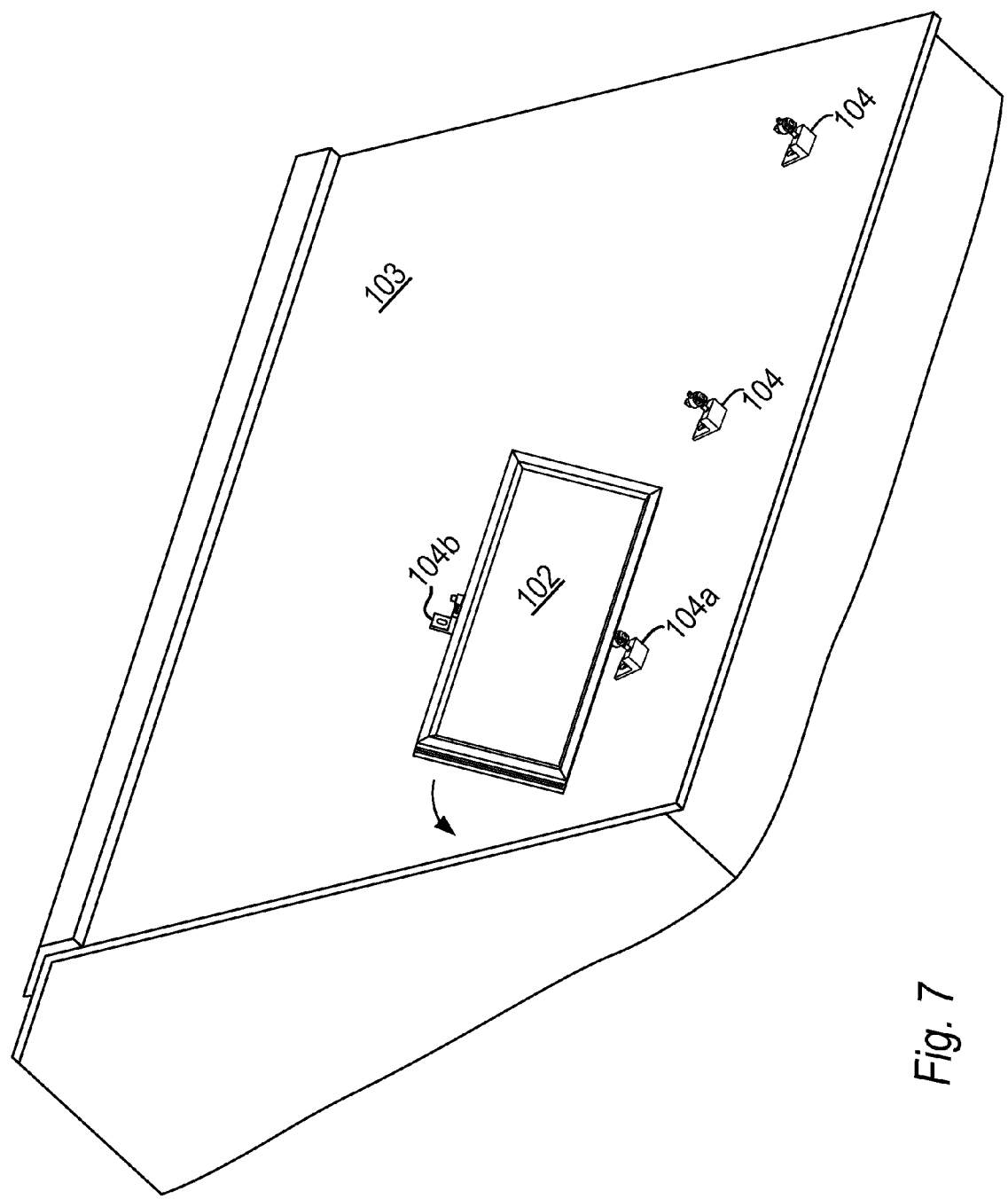
FIG. 7 illustrates the PV array of FIG. 1 during fabrication.

FIG. 7 is a perspective view, similar to FIG. 1, of an array-to-be during fabrication of the PV array 100. The present technology relates to a system of connecting components for a PV array which lies in a reference plane. In general, the system connects together first and second connecting components. As explained below, the first and/or second connecting components may be any of PV laminates, PV modules, PV module frames, coupling members, and brackets. One of the connecting members includes a first, or upper, bearing portion and a second, or lower, bearing portion. These bearing portions may be the bearing portions 124 and 128 described above within groove 114. As explained below, the bearing portions may be formed on other connecting components in further embodiments.

As is also explained below, the bearing portions may be offset from each other in a direction substantially parallel to the reference plane. For example, in FIG. 4, a reference plane may be defined by the laminate 110 of module 102. Bearing portion 124 is more distal than bearing portion 128 from the perspective of FIG. 4 in a direction substantially parallel to the laminate 110 and the reference plane defined by laminate 110.

The first component may engage with the bearing portions in a way that allows the first component to insert between the bearing portions. Thereafter, the first component may be pivoted to a position between the bearing portions where the bearing portions resist relative movement of the connecting components in a direction substantially perpendicular to the reference plane, while permitting relative movement of said connecting components in a direction substantially parallel with the reference plane. These features are explained below.

FIG. 7 shows a first row of leveling feet 104 affixed to support structure 103. As indicated above, support structure 103 may be a roof, such as of a residential dwelling. Such roofs typically include rafters or joists (105 in FIG. 14) beneath the roof surface. In some embodiments, the positions of the leveling feet 104 along the x axis may correspond to the positions of the rafters or joists below such a roof, so that the leveling feet 104 bolt directly to the rafters or joists to ensure the array 100 is properly supported. One skilled in the art will recognize that the leveling foot may be oriented 90° from the position shown if the rafters run east-west. As explained below, the couplings according to the present technology may be used for PV arrays on other types of surfaces, in which case bolting leveling feet 104 to joists or rafters may not be a consideration. In such embodiments, the leveling feet 104 may be positioned as desired, and may be combined with interlocks (not shown), which may be similar to interlock 106 shown in FIG. 1, into an integrated coupling, such as at seams between modules (not labeled), which may be similar to modules 102 shown in FIG. 1, as explained below.

Details relating to the configuration of an example leveling foot 104 will now be described with reference to FIGS. 8 through 10. This disclosure shows a mechanism for leveling photovoltaic arrays. Contrasting the instant mechanism is the use of a slot. Such slot may reside in a vertical portion of a bracket which may further comprise a bolt for variably tightening at different positions in the slot, such a device is not considered a mechanism since it is simply a fastener and a slot. The apparatus shown herein may include a mechanism for leveling. In general, leveling foot 104 includes a base 134 that may be mounted to a support structure (not shown), which may be similar to support structure 103 shown in FIG. 1, via a bolt or other fastener (not shown) fitting through a mounting hole 142 adapted to expose a portion of the support surface. In some embodiments base 134 is fastened to a separate structural member, rail, attachment device, or flashed attachment device, such as a flashed post, instead of being attached directly to support structure 103. A further threaded hole 137 is provided in base 134 for receiving a first end of double threaded stud 140.

Leveling foot 104 further includes a foot coupling 138 for coupling the leveling foot to a PV module, such as module 102. Coupling 138 is threaded onto a second end of double threaded stud 140 through a hole 142 in foot coupling 138. The threads of the coupling hole 142 may be reversed with respect to the threads in hole 137 in base 134. The double threaded stud 140 includes a tool-receiving recess 144 for receiving a tool which may be used for rotating the double threaded stud 140. Upon rotation of stud 140 in a first direction, the foot coupling 138 moves away from the base 134 to raise an attached PV module (not shown) away from a support structure, such as support structure 103 shown in FIG. 7. Rotation of stud 140 in the opposite direction moves the foot coupling 138 and attached PV module (not shown) closer to the support structure. It may happen that such support structure may not be flat but rather may include local or global large and/or small peaks and valleys, which peaks and valleys are emphasized by the high reflective properties of the laminates. Mounting the foot coupling 138 for quick and easy translation allows for correction of these peaks and valleys and ensures a more effective planarity of the finished array, such as array 100 as shown in FIG. 1, in the x-y reference plane.

A height adjustment mechanism, such as stud 140, allows adjustment of the height of leveling foot 104 even after leveling foot 104 has been connected to PV module 102. Thus, height adjustment of leveling foot 104 may be independent from the operation of engaging leveling foot 104 with a PV module 102 and/or support structure 103. Such an arrangement, as shown in FIG. 8, greatly simplifies the process of leveling a PV array, such as array 100, since an installer can still adjust the height of leveling foot 104 even after it has been installed. One skilled in the art will recognize that height adjustment after leveling foot 104 has been connected to module 102 and attached to support structure 103 means that an installer can easily see the planar relationship between adjacent PV modules (since the PV laminate very clearly defines a plane due to its glass surface) when making the final height adjustment, thereby substantially speeding up the process of bringing each of the modules 102 in array 100 into approximately the same plane. Adjusting the height of various leveling feet 104 in array 100 after at least two PV modules 102 are in place is much easier because PV modules 102 make it easier to see the planar relationship between adjacent modules. Additionally, recess 144 may be positioned to allow rotation of stud 140 from the top even after substantially all of the PV modules 102 in an array 100 have been installed. This arrangement provides additional benefits during the process of leveling PV array 100 since it is easiest to see the overall plane of PV array 100 once the bulk of modules 102 have been installed; thereby enabling, for example, an installer to go back out to a leveling foot located in the middle of the array and quickly adjust its height to fine tune the planarity of array 100.

It is contemplated that some or all components of leveling foot 104 may be manufactured from corrosion-resistant materials or may comprise corrosion-resistant coatings to prevent galvanic and/or moisture-induced corrosion. Since foot coupling 138 may provide a ground bonding connection between adjacent PV modules, such corrosion resistance may help to prevent a loss of ground continuity over time.

Those of skill in the art will appreciate a wide variety of other height adjustment mechanisms which may be used in addition to, or instead of, the components described above. Moreover, base 134 may be modified or replaced depending on the support structure on which the array is mounted. For example, base 134 may be replaced with a foot base adapted for attaching to seams or corrugations of metal roofs or a flash mount foot base that incorporates a roof flashing into base 134. In a further embodiment, base 134 may be adapted for tile roofs, both of flat and undulating design. In still other embodiments base 134 may be adapted to attach to structural members such as strut, round or square tube steel, I-beam, etc. Those with skill in the art will appreciate that base 134 may be adapted to seat properly on a variety of other support structures or surfaces as well.

Figure 11:
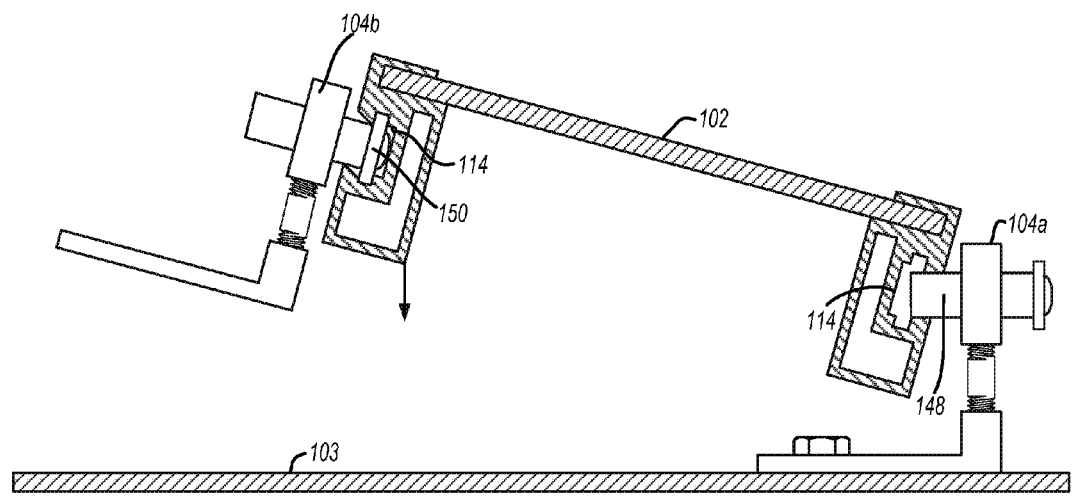
FIG. 11 is a side view of a PV module and mounting feet being mounted to the support surface according to an embodiment of the present technology.

Foot coupling 138 of leveling foot 104 further includes a center portion or flange 146, a tongue 148 extending from one side of flange 146, and a key 150 provided on a shaft 152 extending from the opposite side of flange 146. A PV module may be mounted to a support structure by two leveling feet on opposed sides of the module along the y-axis direction, as generally shown in FIG. 1, with the tongue 148 of the first leveling foot fitting within a groove, such as groove 114 shown in FIGS. 3, 5 and 6, on the first side, and the key 150 of the second leveling foot fitting within a groove, such as groove 114, on the opposite side. This aspect of the present technology will be explained below with reference to the perspective view of FIG. 7 and the side views of FIGS. 11 through 13. The first row can be mounted either with all keys in or one side key in and other side tongues in.

Figure 10:
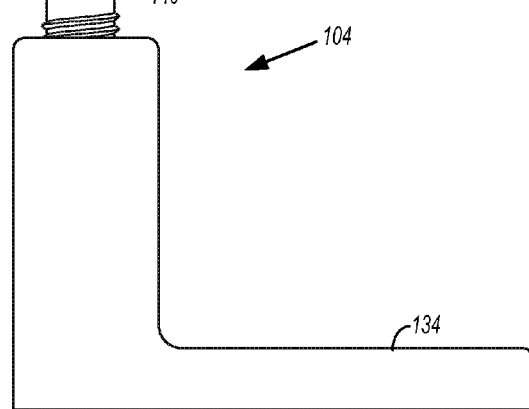
FIG. 10 is a side view of a leveling foot according to an embodiment of the present technology.
Figure 10A:
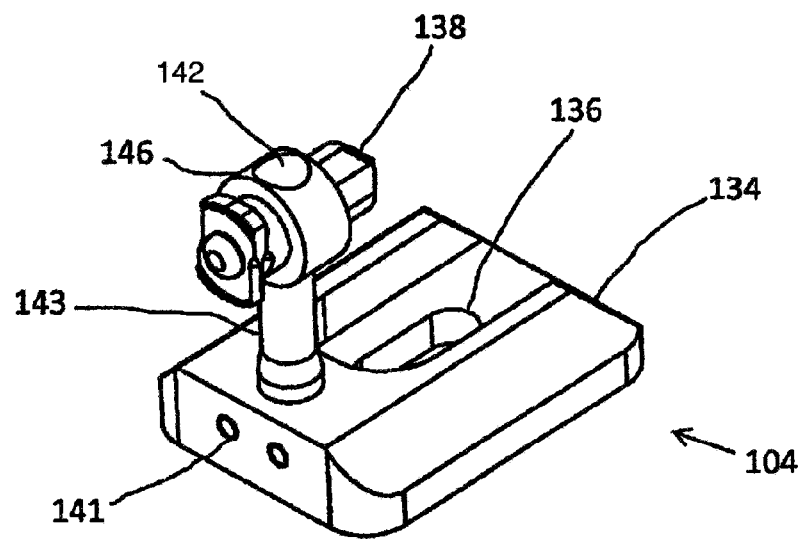
FIGS. 10A and 10B are perspective view of a leveling foot according to an alternative embodiment of the present technology.
Figure 10B:
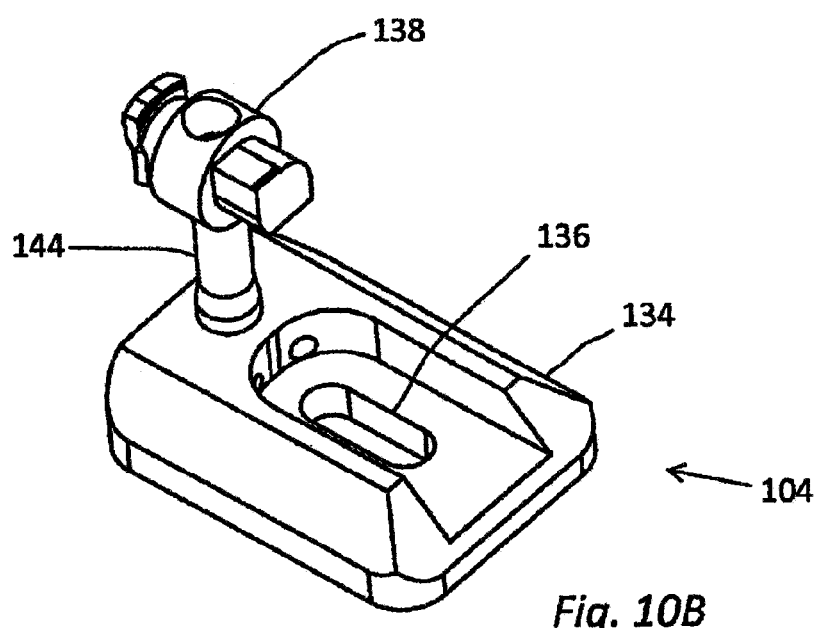

FIGS. 10A and 10B show an alternative embodiment of the leveling foot 104. This embodiment may include a base 134 and a foot coupling 138 as described above. However, in this embodiment, the foot coupling 138 may be affixed to the base 134 via a foot stud 143. Foot stud 143 may be mounted to the base 134 for example via retention pins 141. In this embodiment, a top portion of the stud 143 may be threaded, and fit within the threaded hold 142 in flange 146 of foot coupling 138. In this embodiment, height of the foot coupling 138 may be adjusted relative to the base 134 by rotating the coupling 138 on the stud 143 prior to coupling the leveling foot 104 to modules 102.

In some embodiments, a first leveling foot (104a in FIGS. 7, 11, 12 and 13) may be mounted to a support surface. On a slanted roof, this may be the leveling foot on the downhill side of the module 102 to be mounted. The leveling foot 104a may be fastened to the support surface 103 so that the tongue 148 of leveling foot 104a is facing toward the side where module 102 is to be affixed.

Figure 12:
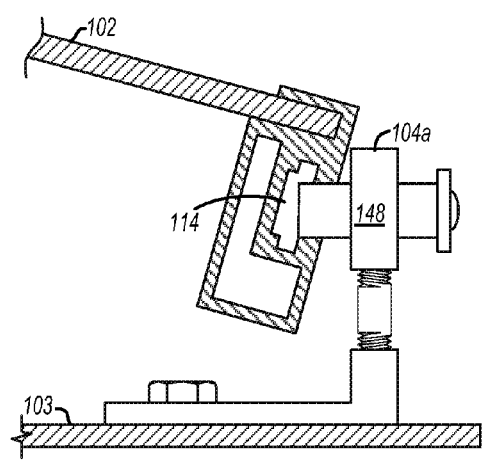
FIG. 12 is an enlarged side view showing the PV module frame groove sliding over the leveling foot tongue at an insertion angle according to an embodiment of the present technology.

Module 102 may then be brought into contact with, and supported on, mounted leveling foot 104a so that portions of the upper sloped surface 122 of groove 114 rest on the tongue 148 of the mounted leveling foot 104a. Thereafter, the module 102 can be rotated downward in the direction of the arrow shown in FIGS. 7 and 11. As discussed above, the upper and lower sloped surfaces 122, 126 may be provided at some insertion angle, for example 15°, with respect to the planar surface of module 102. FIG. 12 shows the module 102 having been rotated to the point where the angle of the module 102 with respect to the x-y reference plane is essentially equal and opposite to the insertion angle of the sloped surfaces 122, 126. At this point, the sloped surfaces 122, 126 will be essentially parallel to the upper and lower surfaces of the tongue 148, and the groove 114 may then slide over the tongue 148 to seat the tongue 148 within groove 114 and to seat the module 102 on leveling foot 104a. It is understood that the groove 114 may slide over the tongue 148 when there is a few degrees difference between the two in various embodiments. One skilled in the art will recognize that the normal variation in the final dimensions of mating parts may result in some cases where the groove 114 may be slightly narrower than tongue 148 even when positioned as shown in FIG. 12, yet groove 114 may still slide over tongue 148. Chamfer 147 on tongue 148 may help to start the insertion process and grounding teeth 149 may then cut their way as it is slid into position.

Figure 13:
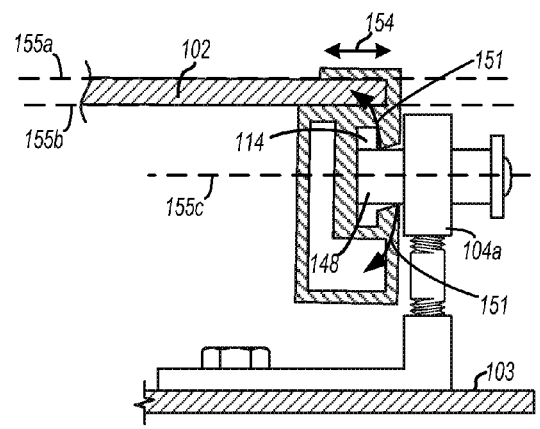
FIG. 13 is an enlarged side view showing the final coupling of a PV module frame groove to a leveling foot tongue according to an embodiment of the present technology.

FIG. 13 shows the module 102 upon further rotation to the finished position of the module 102 where the planar surface of the module 102 is generally parallel to the x-y reference plane. In this and other embodiments described herein, the reference plane may be at or above the upper surface of the PV laminate 110 (as indicated by dashed line 155a in FIG. 13), in between the upper and lower surfaces of the PV laminate 110, at the lower surface of PV laminate 110 (for example as indicated by dashed line 155b in FIG. 13) or below the PV laminate 110 (as indicated by the dashed line 155c in FIG. 13).

When the groove 114 slides over the tongue 148 in FIG. 12, the space in between the upper and lower sloped surfaces 122, 126 engaged by the tongue is the distance m described above in FIG. 4A. However, once the module is rotated to the position shown in FIG. 13, the spacing between the surfaces 122, 126 engaged by the tongue is the smaller distance n. In some embodiments, taking into account dimensional variations in the surfaces 122, 126 and tongue 148, the height of the tongue may be slightly smaller than or equal to the distance m, and slightly larger than or equal to the distance n. For example, the height of the tongue along a dimension between the surfaces 122 and 126 may be 0.010" smaller than the distance m, and 0.010" greater than the distance n. Thus, in embodiments, the tongue 148 and surfaces 122, 126 of groove 114 may have a cumulative tolerance range for mating parts of −0.010" to +0.010". One skilled in the art will recognize that the difference between m and n provides a range for vertical (z-axis) tolerance takeup. In the previous example, even a tongue that is 0.010" undersized at the insertion angle may result in a tight fit that flexes the frame open (in the direction of arrows 151) and thereby deforms the materials by 0.010" in the final 0° position. The size of the tongue 148 relative to the distances m, n may vary from these dimensions in various embodiments. For example, the height of tongue 148 may be greater than both m and n, so long as n is smaller than m.

The coupling, or connection, of the tongue 148 with the groove 114 discussed above helps to point some of the benefits of the pivot-fit connection. Such an arrangement allows for easy insertion of parts, yet solid connections in the final position without having to rely on cumbersome press-fits (which are difficult given the materials, tolerances, and dimensions of typical PV modules) or mechanical fasteners. Also, the fact that the insertion angle is different than the final angle may mean that the surface area of material in contact is lower (than if the groove 114 had straight lips), thereby enabling a low friction, easy adjustment of alignment even in the final 0° position. Furthermore, the pivot-fit connection system may also help to increase the amount of horizontal tolerance takeup.

As a result, after easily sliding over tongue 148 at the insertion angle, the module 102 may be rotated to the position shown in FIG. 13 to provide a pivot-fit connection of the groove 114 to the tongue 148. This disclosure may also refer to such a connection by saying that the tongue 148 pivotally engages the groove 114 or the groove 114 pivotally receives the tongue 148. In particular, the bearing portion 124 in the upper sloped surface 122 bears against, and exerts a force downward on, the tongue 148 (such as in a z-direction perpendicular to the x-y reference plane). In the position of FIG. 13, the bearing portion 128 in the lower sloped surface 126 similarly bears against, and exerts a force upward on, the tongue 148 in the z-direction.

The PV module 102 provides a lever arm, and the moment force allows the PV module to pivot about bearing portion 124 from the position of FIG. 12 to the position of FIG. 13 usually under the weight of module 102. This results in tongue 148 bearing against bearing portions 124, 128 of surfaces 122, 126, which elastically deforms the frame 112 around tongue 148 via a flexing open of the frame. One skilled in the art will recognize that the generally C-shaped connection portion 114 of frame 112 may naturally flex open when loaded at the bearing portions 124, 128. The bearing of the tongue against the surfaces 122, 126 takes up any variability in the z-axis dimensions of the tongue 148 and the groove 114. This provides a tight coupling and prevents any relative movement between the leveling foot 104a and the portion of the coupled frame 112 along the z-axis. Those skilled in the art will recognize that even if the height of the tongue 148 is greater than m, thereby requiring the tongue 148 to open the groove 114 slightly during insertion at the insertion angle, a rotation to the final angle of FIG. 13 increases the forces between the bearing portions 124, 128 and the tongue 148, thereby creating a final tight fit that is much tighter than it may have been when rotated as shown in FIG. 12.

While constrained in the z-direction, the coupled frame portion 112 and module 102 are able to move in a direction of arrow 154 in FIG. 13 along the surface of the tongue 148. This allows the y-position of the module 102 to be quickly and easily adjusted after the pivot-fit connection is established between the module and leveling foot 104a, for example, in order to account for any tolerance variations in the y-dimension of the module 102. As explained in the Background section, this variable positioning feature prevents or ameliorates dimensional variations from adding up along the length of a column of modules in the y-direction. As shown in FIG. 8, the tongue may include a catch 156 to prevent disengagement of the groove 114 from the tongue 148 while adjusting in the y-direction. One skilled in the art will also recognize that the variable positioning feature 154 of the pivot-fit connection may cause the pivot point, such as bearing portion 124 in the above example, to slide somewhat as the parts are being pivoted into position. In some embodiments bearing portions 128, 128 comprise non-concave shapes such as convex, faceted, ribbed, etc., thereby ensuring an easy horizontal adjustability.

Figure 13A:
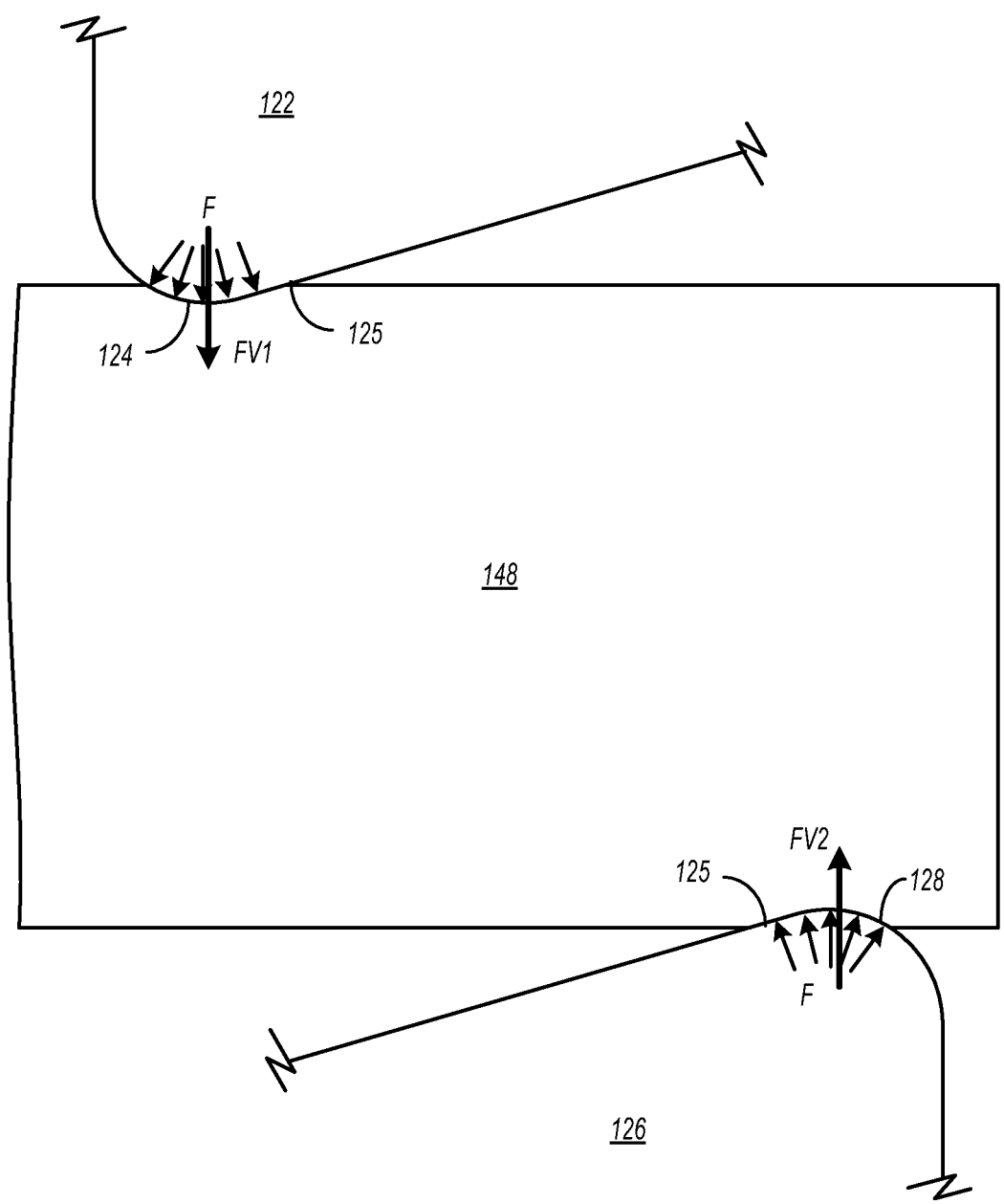
FIG. 13A is a further enlarged side view showing the bearing portions bearing against a connecting component.

FIG. 13A shows a further enlarged view of the forces exerted by bearing portion 124 down on the tongue 148, and bearing portion 128 up on tongue 148. In some embodiments, bearing portions may be formed so that there is an interface area 125 between the bearing portion 124 and tongue 148 where the two components lie in contact with each other. The same interface area 125 may exist between bearing portion 128 and tongue 148. The size of the interface area may be determined by the shape of the bearing portions 124, 128 and the degree of deformation of bearing portions 124, 128 and/or tongue 148.

Forces, F, are exerted by the bearing portion 124 down onto tongue 148. These forces are vector quantities with direction and magnitude, and may sum together into a resultant force vector FV1. Similarly, forces, F, are exerted by the bearing portion 128 up onto tongue 148. These forces are vector quantities with direction and magnitude, and may sum together into a resultant force vector FV2. In embodiments, the coupling described above between the tongue 148 and the bearing surfaces 124, 128 of groove 114 may result in equal and opposite force vectors FV1 and FV2. The contact areas 125 and resultant equal and opposite force vectors FV1 and FV2 may result from any of the couplings described below of a connecting component connecting with bearing portions. In further embodiments, the resultant force vectors FV1 and FV2 at bearing surfaces of a coupling need not be equal or opposite.

With the above described pivot-fit connection, the present technology provides an extremely fast and simple way to attach a PV module to a coupling such as a leveling foot. Through the simple act of sliding a groove in the module frame over a coupling at an insertion angle, and then letting the module down to its final angular orientation, the module is engaged in place and secured with respect to z-axis movement, while still being adjustable to account for dimensional differences in the size of a module. The tolerance take-up mechanisms as described above also take-up dimensional variations in the size of mating components as well as slight variations in the length of a row or column of modules due to other factors such as misalignment of mating parts and the unevenness of the mounting structure.

Figure 8:
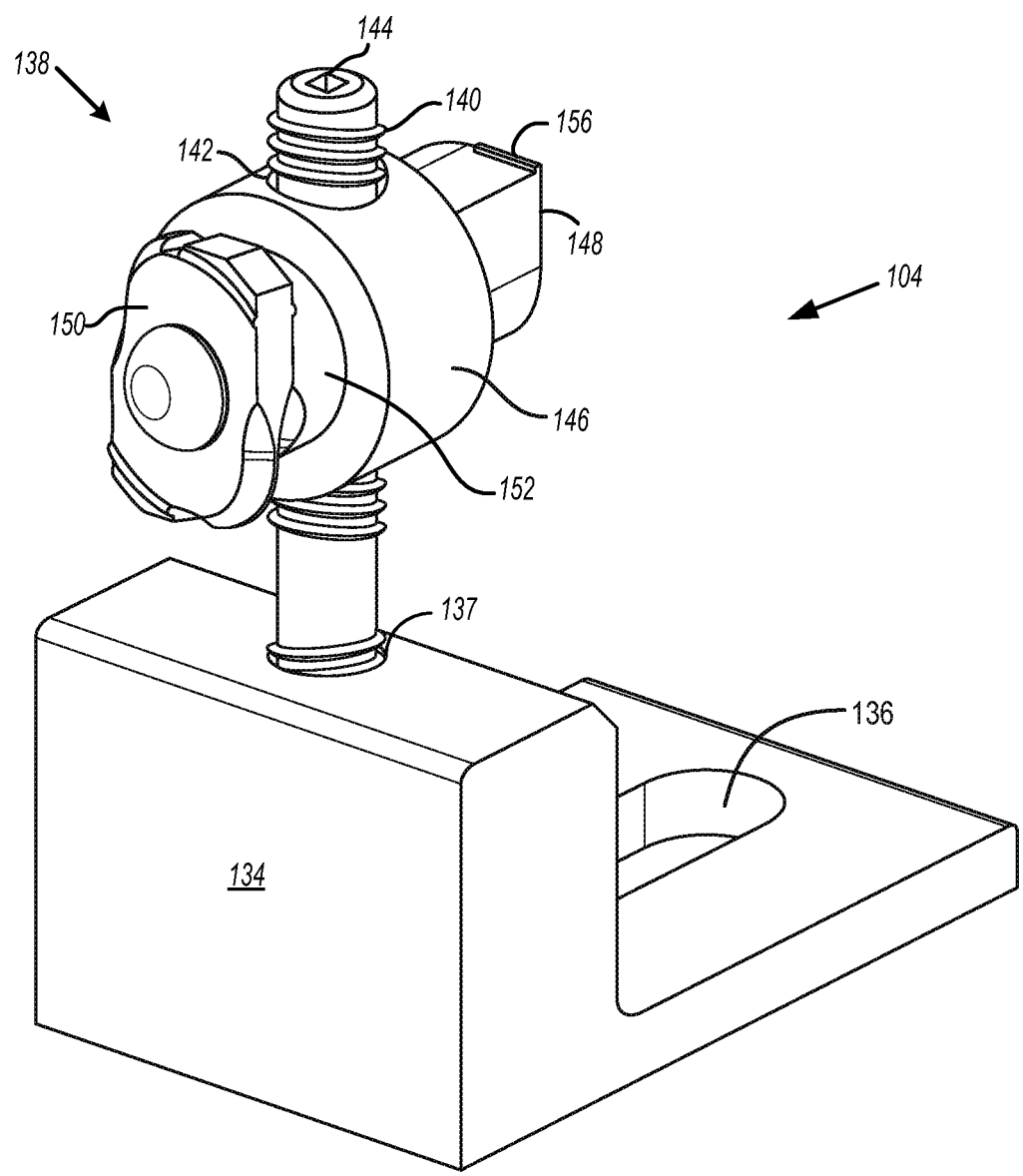
FIG. 8 is a first perspective view of a leveling foot according to an embodiment of the present technology.
Figure 9:
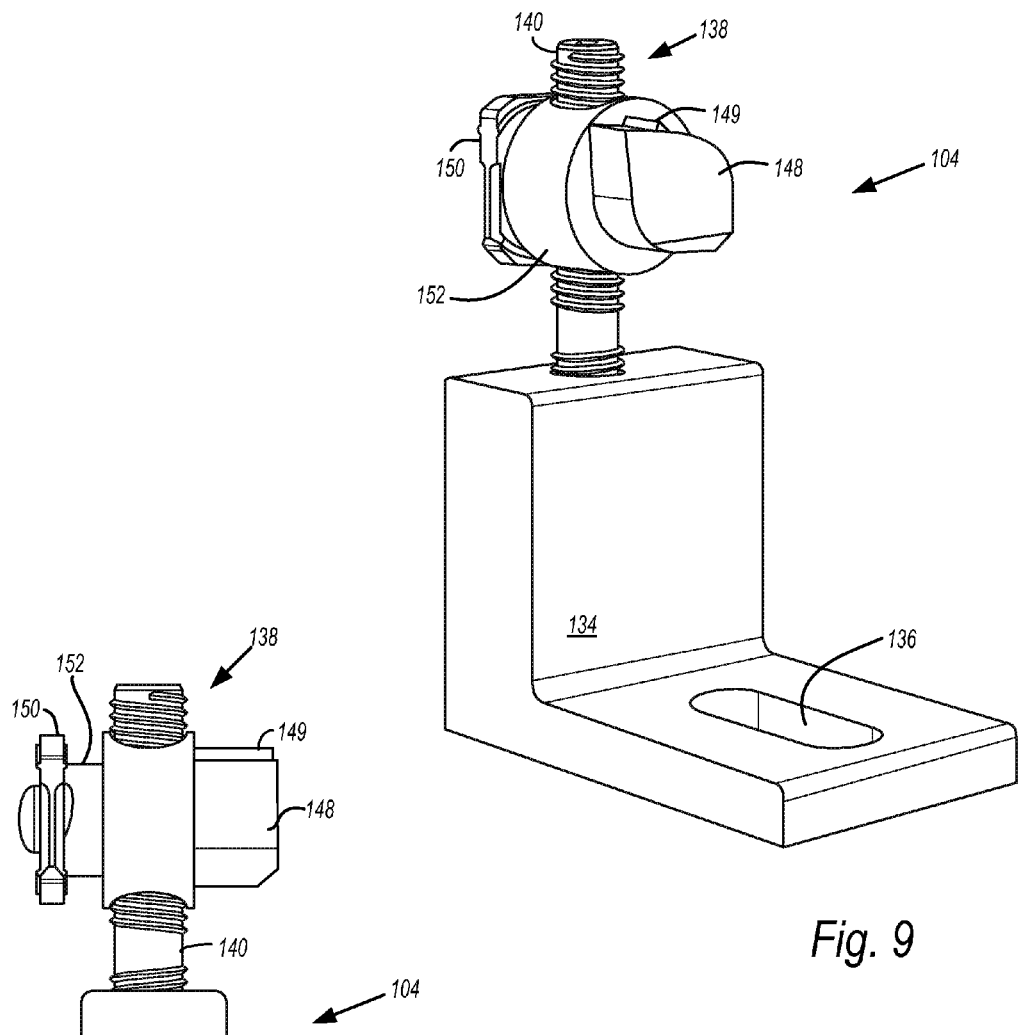
FIG. 9 is a second perspective view of a leveling foot according to an embodiment of the present technology.

The tongue 148 may include an electrical ground tooth 149 (one of which is shown in FIGS. 8 and 9), in the form of an inverse v-shaped protrusion extending from the upper surface of the tongue 148 along the y-dimension when oriented as shown in FIG. 7. It may alternatively be a v-shaped protrusion extending from the lower surface of the tongue 148 along the y-dimension. Other shapes of teeth or other configurations for electrical grounding are explicitly contemplated herein but hereafter generally described as a cutting tooth or teeth. When the module 102 is pivoted to its final position so that there is a tight fit of the tongue 148 between the upper and lower surfaces 122, 126, the ground tooth may bite through the anodized layer and into electrical contact with the metal underneath to establish an electrical ground contact with the connection portion 114 of module 102. The key 150 (see FIGS. 8, 9, 10 and 11) on the opposite side of leveling foot 104 may also include one or more cutting teeth as explained below for establishing a ground connection to the connection portion 114 of the module it couples with. Thus, the leveling foot may provide a grounding bond between modules along the y-dimension or x-dimension when oriented with the tongue facing east-west. One skilled in the art will recognize that the connection portion of PV module frame 112 may be adapted to create a reliable grounding bond between frame 112 and coupling 138. As explained below, mechanisms such as a grounding coupling may be used to electrically connect the array 100 to a grounded component on support structure 103 or directly to the earth.

Prior to the module 102 being affixed to the mounted leveling foot 104a as described above, a free-standing (not mounted to the support surface) leveling foot 104b may be engaged with the groove 114 at the opposite side of the module 102. The free-standing leveling foot 104b may be coupled to the opposite side of the module by locking the key 150 of the foot 104b into the key slot 130 in groove 114. This is accomplished by simply holding leveling foot 104b at an angle of approximately 90° from its final upright position, passing key 150 through the opening of groove 114, then rotating back 90° to engage the key with key slots 130a, 130b. Key 150 may be shaped to allow it to pass through the opening of groove 114 when held at 90° from its final upright position, yet engage behind the lips of groove 114 when rotated to its final upright position. This manner of coupling is similar to the coupling of an interlock 106 to modules 102, as explained in greater detail below, since both interlock coupling 164 and foot coupling 138 comprise a key 150, 178 (see discussion below).

After a module 102 is coupled to a tongue 148 of a mounted leveling foot 104a, and the y-position of the module is adjusted for tolerances, the leveling foot 104b coupled to the opposite side of the module 102 may then be fastened to the support structure 103. Once the module is rotated down to its final orientation, the leveling foot 104b now rests on the support structure 103. The base 134 of leveling foot 104b may simply be rotated about the z-axis until it aligns with the joist or rafter beneath the support structure 103, and then bolted down to provide a quick, easy and accurate attachment of the leveling foot 104b. The tongue 148 of leveling foot 104b is oriented along the y-axis and ready to accept the next panel in the y-direction. The above-described process may then be repeated.

One skilled in the art will recognize that the arrangement of mounting a PV module 102 by means of a tongue connection on one side and a key connection on an opposite side, as shown in FIGS. 11-14, effectively utilizes the rigidity of support surface 103 to help create a rigidly interlocked array 100. If, for example, the leveling feet 104 of array 100 were not attached to support surface 103, then the tongues could easily slide back out of grooves 114 if picked up to approximately the 15° insertion angle as discussed above. This technique significantly reduces the total materials required for an installation when compared to conventional rail-based systems (which add rails for rigidity) or other interlocking systems which incorporate rigid coupling systems. Furthermore, the pivot-fit action as described in this disclosure provides a rapid "drop-in" method for PV modules which is much faster than prior art systems that rely on press-fit connections and/or conventional fasteners.

In the embodiments described above, the key 150 of a free-standing leveling foot (104b) is engaged with groove 114, and the tongue 148 of a mounted leveling foot (104a) is engaged with groove 114. It is contemplated in further embodiments that this arrangement be reversed. That is, a key 150 of a mounted leveling foot may be engaged with groove 114 and a tongue 148 of a free-standing leveling foot may be engaged with groove 114. Moreover, in either embodiment, the key 150 may be coupled within the groove 114 before the tongue 148 on the opposite side, or visa-versa. In still other embodiments, PV modules 102 of a first row of array 100 may each be mounted by engaging the key 150 with groove 114 on both the lower side and upper side in the orientation shown in FIG. 14, then subsequently attaching each of these upper and lower side leveling feet 104 to support surface 103. Subsequent rows may then include the above method of including a tongue engagement on the lower side and a key engagement on the upper side.

In some embodiments, the couplings between connecting components such as tongue 148 and the bearing portions 124, 128 are made without a press-fit and not by friction forces to hold the respective components together. The rigidity of the final array in many embodiments is ultimately derived from the roof or support structure, not the coupling.

Figure 14:
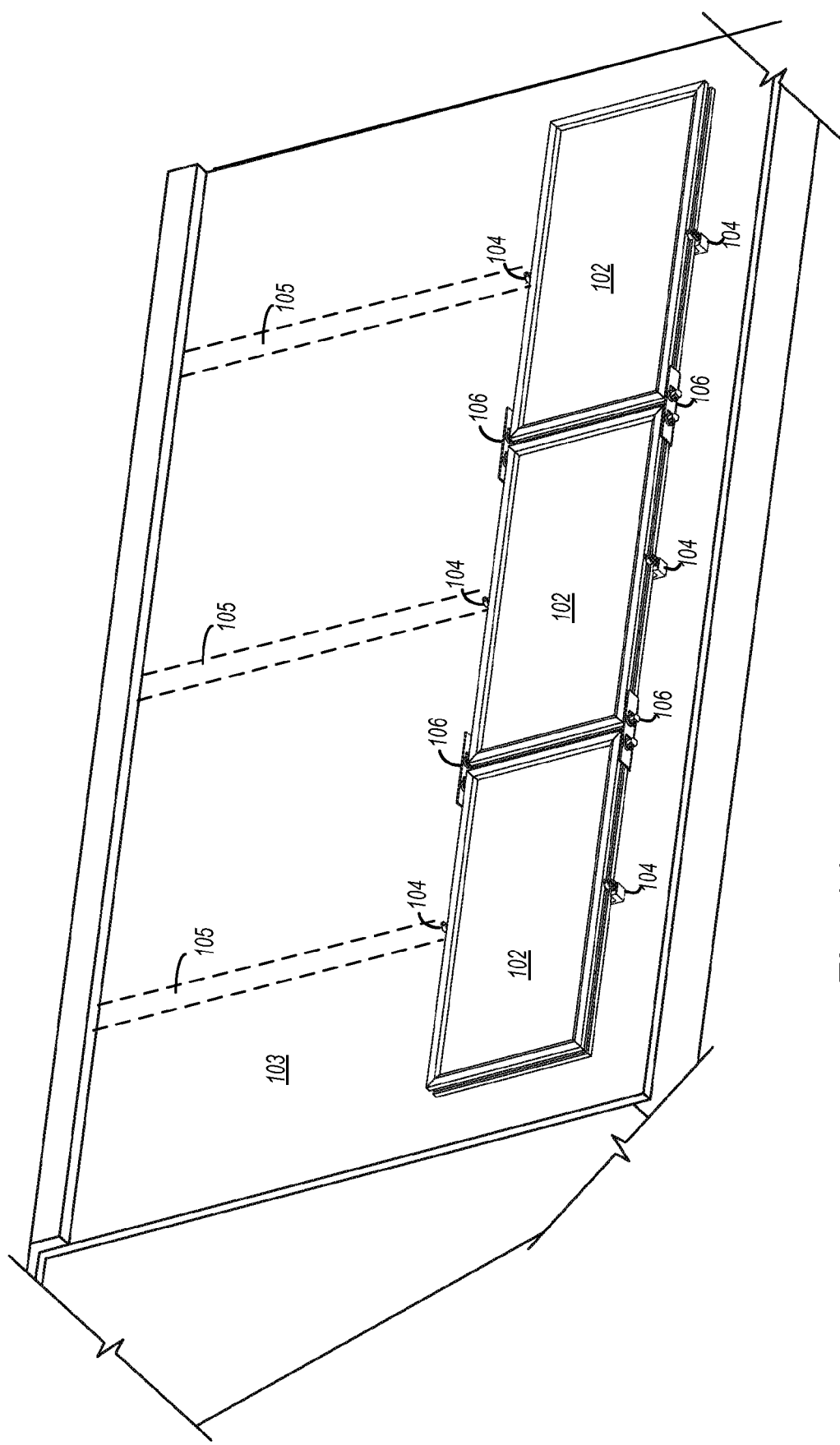
FIG. 14 is a perspective view as in FIG. 1 showing the array during fabrication on the support surface.

FIG. 14 shows a first row of PV modules 102 assembled together on support structure 103. As seen in FIG. 14, in addition to leveling feet 104, the present technology may employ interlocks 106 for affixing adjacent modules 102 together along the x-axis. The structure of interlock 106 will now be described in respect of the various views of FIGS. 15 through 20. Interlock 106 in general includes an interlock plate 162 including a pair of openings 166 receiving a pair of interlock couplings 164, which may be held in openings 166 via an interference fit. As seen for example in a perspective view of FIG. 15, interlock 106 includes a first surface 168 having a pair of ribs 170 spanning a substantial portion of the length of interlock 106. In some embodiments Ribs 170 may also be shown on tongue side of plate thereby increasing the structural properties of interlock 106.

An upper surface of the top rib 170 and a lower surface of the bottom rib 170 are spaced from each other so that the ribs together fit properly within groove 114 as explained below.

Instead of multiple separate ribs, element 170 may instead comprise a single rib, or lug, having a top surface matching the top surface of upper rib 170 and a bottom surface matching the bottom surface of lower rib 170. A lower portion of interlock plate 162 may include a lip 172 which is positioned beneath a lower surface of frames 112 of a pair of adjacent modules 102 once interlock 106 is affixed to PV modules 102. Lip 172 may enhance the structural performance of interlock 106 and may be omitted in further embodiments.

Each interlock coupling 164 may be identical to each other, and may include a nut portion or flange, such as flange 174, a tongue 176 extending in a first direction from the flange 174, and a key 178 affixed to a shaft 180 extending in the opposite direction from flange 174. Tongue 176 may be shaped like other tongues described in this disclosure such as the tongue of FIG. 8. The structure and operation of key 178 will now be described. It is understood that the key 150 on leveling foot 104 (referenced above with respect to leveling foot 104b) may be structurally and operationally identical to key 178 on interlock coupling 164, and the following description applies to the keys 178 and 150 on both the interlock coupling 164 and foot coupling 138, respectively.

Key 178 rotates between a first, horizontal position to allow insertion of the key into groove 114 and a second, vertical position for locking the key within the key slot 130 of the medial portion 118 of groove 114. The reference to horizontal and vertical in the description apply when the interlock 106 is horizontal with respect to the x-y plane. If the interlock were tilted, for example about the y-axis, the "horizontal" and "vertical" position of the key 178 would be adjusted accordingly.

Figure 15:
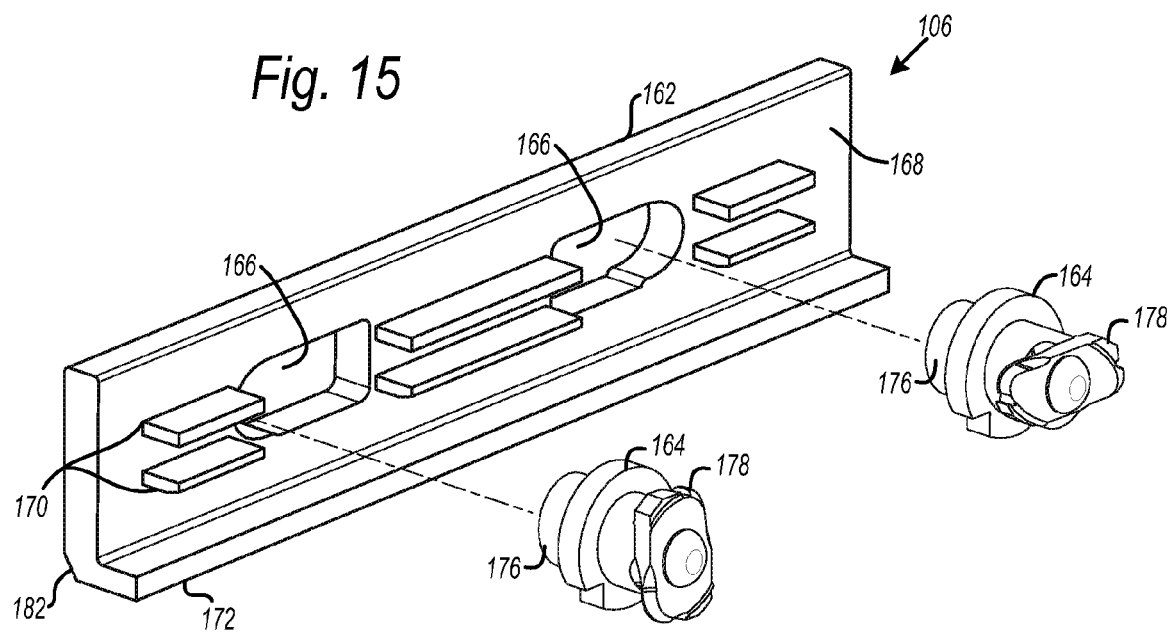
FIG. 15 is an exploded perspective view of a first side of an interlock according to an embodiment of the present technology.
Figure 16:
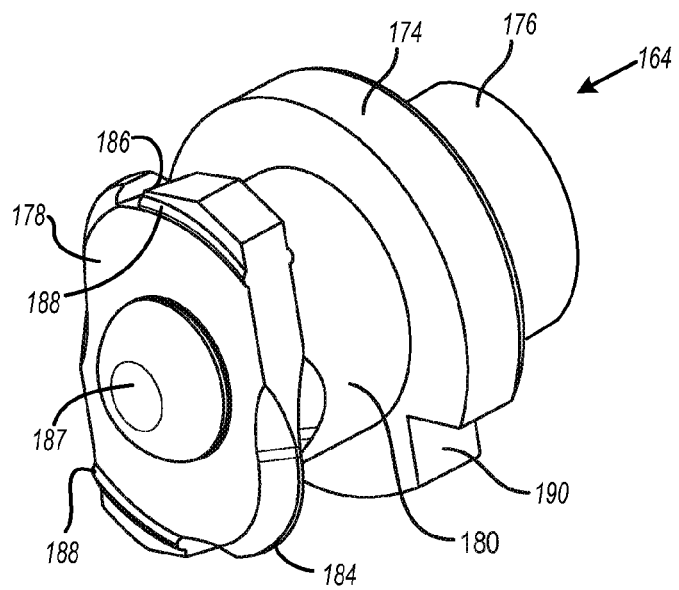
FIG. 16 is a perspective view of an interlock coupling according to an embodiment of the present technology.

The horizontal position of key 178 is shown by the interlock coupling 164 on the right in FIG. 15, and in the cross-sectional side view of FIG. 19. A key 178 in a vertical position is shown by the interlock coupling 164 on the left side of FIG. 15, the interlock coupling of FIG. 16 and the cross-sectional side view of FIG. 20. The interlock couplings 164 of FIG. 15 are shown in different orientations for illustration purposes only, and it is understood that the left side interlock coupling 164 would be in a horizontal position for insertion of the interlock 106 into grooves 114 of adjacent modules 102 as explained below.

In general, with the keys 178 of both interlock couplings in the horizontal position, an interlock 106 is engaged with the grooves 114 of modules 102 adjacent to each other in the x-direction, with one interlock coupling 164 being inserted into each of the adjacent grooves 114. The interlock 106 may be engaged with the ribs 170 at an angle that matches the insertion angle of upper and lower sloped surfaces 122 and 126. A chamfer 182 may be provided at the bottom of lower rib 170 to make it easier for ribs 170 to be inserted into the groove 114.

While completion of the pivot-fit connection of the groove 114 and tongue 148 of leveling foot 104 is facilitated by the moment force generated by the weight of the module 102 at the coupling, no such moment force exists to facilitate coupling of the interlock 106 to frame 112. Accordingly, the flange 174 and/or tongue 176 may be engaged by a tool 183 (a portion of which is shown in FIGS. 19 and 20) which rotates the interlock coupling 164 from the horizontal to vertical position. As the key 178 rotates (about the y-axis), it engages within the key slot 130 to pivot the ribs 170 (about the x-axis). The ribs pivot from their insertion position (parallel to the upper and lower sloped surfaces 122, 124) to their final, coupled position (where the ribs 170 are substantially parallel to the planar surface of the module 102 and the x-y reference plane).

A lead-in bevel 184 is defined by a gradually increasing thickness of the key 178 from narrow to full width. This lead-in bevel allows the interlock coupling 164 to gradually pivot about the x-axis from the angle of the groove 114 to zero degrees relative to the x-y reference plane. This pivoting occurs as a result of the interlock coupling 164 being rotated from its horizontal position to its vertical position along the axis of shaft 180.

A set of cutting teeth 188 are provided on the upper and lower portions of the key 178 of each interlock coupling 164 in an interlock 106. As the key 178 is rotated from horizontal to vertical, the cutting teeth 188 cut through the anodized layer in the groove 114 and make solid electrical grounding contact with the aluminum or other metal of the PV module frame 112. Both of the interlock couplings 164 on an interlock 106 may include these sets of cutting teeth 188. Thus, in addition to locking adjacent modules 102 together, rotation of the interlock couplings 164 also electrically couples the two electrical modules together. The grounding coupling explained below may connect the array to a ground state.

A chip gap 186 on each end of key 178 allows the teeth 188 to cut into surfaces of the frame within the key slot 130 more effectively, and provides a place for metal shavings from the cut to reside. A bump 187 at the end of the key 178 also helps align the key by abutting against back wall 132 of the distal region.

Flange 174 may include a detent 190 for being engaged by the tool 183 to allow quick and easy rotation of the interlock coupling 164 from its horizontal to vertical position. The detent 190 may be located on an underside of the interlock coupling 164 upon final rotation. This location, as well as the custom shape of the detent 190, makes it difficult to dismantle the interlock 106 from modules 102 without the proper tool to improve the security aspects of the system.

It is contemplated that some or all components of interlock 106 may be manufactured from corrosion-resistant materials or may comprise corrosion-resistant coatings to prevent galvanic and/or moisture-induced corrosion. Since foot coupling 138 may provide a ground bonding connection between adjacent PV modules, such corrosion resistance may help to prevent a loss of ground continuity over time.

Figure 21:
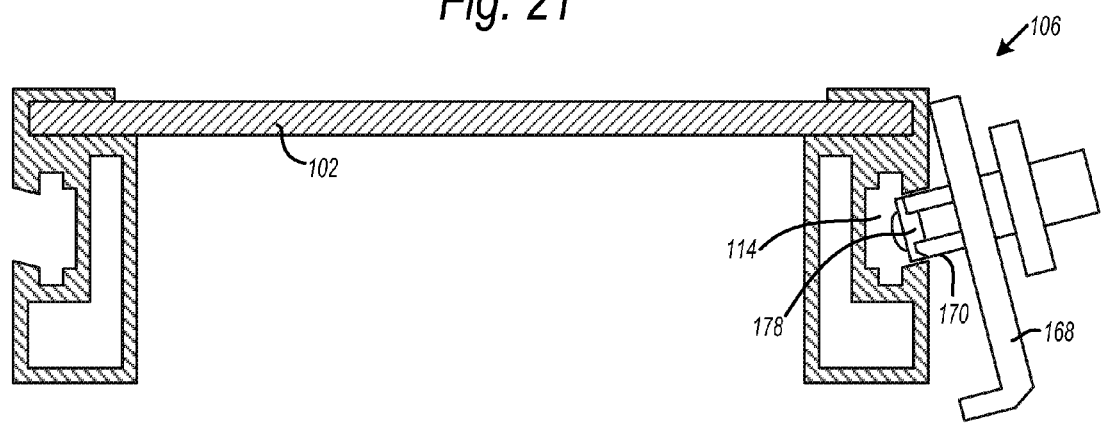
FIG. 21 is a cross-sectional side view of a PV module receiving an interlock according to an embodiment of the present technology.
Figure 22:
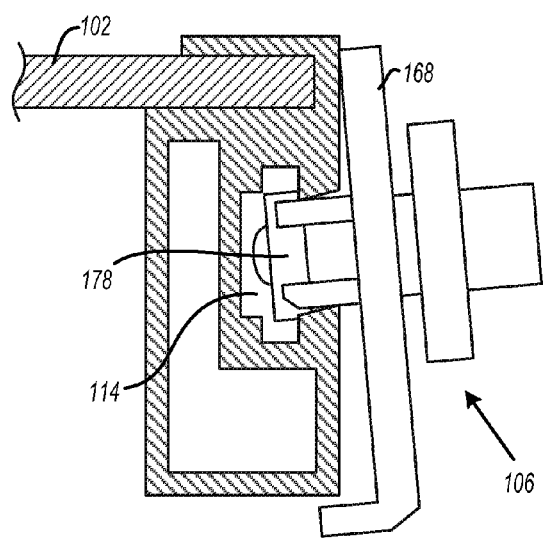
FIG. 22 is an enlarged cross-sectional side view showing the coupling of the interlock shown in FIG. 21 partially rotated.
Figure 23:
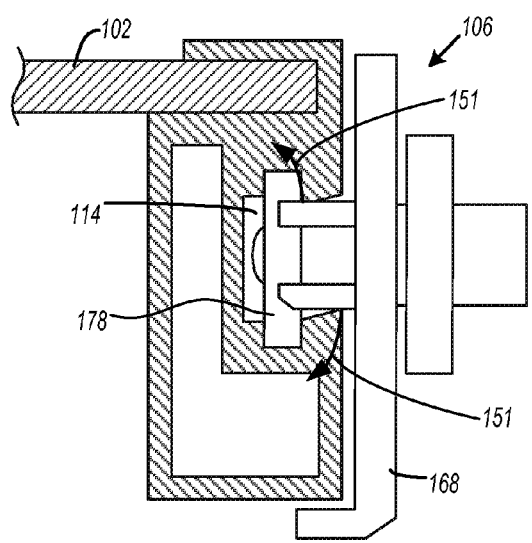
FIG. 23 is an enlarged cross-sectional side view showing an interlock fully rotated and locked in position within the module frame groove according to an embodiment of the present technology.

FIGS. 21 through 23 show various side views of an interlock 106 being affixed to a pair of adjacent modules (one such module being visible in the side view). FIG. 21 shows the ribs 170 of an interlock coupling 164 being inserted between the upper and lower sloped surfaces 122, 126 of frame 112. The ribs 170 may be inserted at the insertion angle of the upper and lower sloped surfaces 122, 126 to provide maximum clearance for the ribs 170 to enter into groove 114 (i.e., distance m, FIG. 4A). The width of the upper and lower ribs 170 together may be slightly less than or equal to the distance m. As indicated above, chamfer 182 on a bottom surface of the lower rib may further aid in the initial insertion of the ribs 170 into groove 114. Upon initial insertion of the ribs 170 into groove 114, the key 178 is in the horizontal position and as such does not interfere with the insertion of the ribs between the upper and lower sloped surfaces 122, 126.

Once ribs 170 are manually inserted as far as they will go between the upper and lower sloped surfaces 122, 126, tool 183 may then be used to rotate the interlock coupling from horizontal to vertical. FIG. 22 shows the interlock coupling upon partial rotation of the key 178, the ends of which are becoming more visible in the side view of FIG. 22. The lead-in bevel 184 pulls the key 178 into the key slot 130 behind the sloped surfaces 122, 126. Thus, as the coupling 164 is rotated, the coupling is pulled into the groove 114 and pivots from the initial position shown in FIG. 21 to a final position where the key 178 is fully engaged within key slot 130. This final position is shown in FIG. 23.

As indicated above, when the interlock 106 is first inserted into groove 114, the space in between the upper and lower sloped surfaces 122, 126 as seen by the ribs 170 and shaft 180 may be the distance m described above in FIG. 4A. As the key 178 is pulled into the groove by rotation of the coupling 164, the ribs 170 and shaft 180 pivot from the insertion angle to a final position parallel to the x-y reference plane as shown in FIG. 23. In this position, the spacing between the surfaces 122, 126 as seen by the ribs 170 and shaft 180 is the smaller distance n. In some embodiments, taking into account tolerance variations, the outer diameter of the ribs (together) and shaft may be slightly larger than or equal to the distance n. For example, the diameter of the ribs and shaft along this dimension may be 0.005" smaller than the distance m, and 0.005" greater than the distance n. The size of the ribs 170 and/or shaft 180 relative to the distances m, n may vary from this in further embodiments.

Pivoting of the interlock coupling 164 from the position of FIG. 21 to the position of FIG. 23 results in a pivot-fit connection between the interlock 106 and groove 114. In particular, the ribs 170 and/or shaft 180 bear against, and exert a force upward on, the bearing portion 124 in the upper sloped surface 122 in the z-direction, and the ribs 170 and/or shaft 180 bear against, and exert a force down on, the bearing portion 128 in the lower sloped surface 126 in the z-direction. These forces elastically deform the frame 112 around the groove 114 (in the direction of arrows 151 in FIG. 23) so as to take up any variability in the z-axis dimensions of the rails and/or shaft in the groove 114. This provides a solid connection with respect to the z-axis and prevents any relative vertical movement between the interlock 106 and the corners of the adjacent modules in which the couplings of the interlock 106 are engaged. The key 178 bearing against the top and bottom slots 130a, 130b of the key slot 130 may additionally or alternatively prevent relative movement of the corners of the adjacent modules relative to the interlock 106 and each other. Once key 178 enters groove 114, interlock plate 168 may begin to pivot primarily about bearing portion 124 as interlock 106 rotates into its final position.

In one embodiment, in order to secure an interlock 106 to adjacent modules 102, the interlock coupling 164 in the first module 102 may be partially rotated to partially engage the key 178 of that coupling 164 within the key slot 130 of the first module. The second coupling 164 of the interlock may then be fully rotated from horizontal to vertical to fully engage the second coupling within key slot 130 of the second module 102. The rotation of the first coupling may then be completed to finish the installation of the interlock 106. It is understood that the installation of an interlock may be performed by other methods, such as for example fully inserting a first interlock coupling 164, and then fully inserting the second interlock coupling 164 or by fully rotating each interlock coupling 164 immediately after insertion into groove 114.

As indicated above, the key 150 in leveling foot 104 may affix within the groove 114 in the same manner as described above with respect to key 178 of the interlock 106. Thus, revisiting FIGS. 6 and 10, prior to seating a module 102 onto the tongue 148 of a leveling foot 104a, the leveling foot 104b may be affixed within the groove 114 at the opposite side of the module 102 by inserting the key 150 into groove 114 and rotating it by hand or with a tool as described above to engage the key 150 into key slot 130.

FIG. 24 is a perspective view showing a pair of adjacent modules 102 connected with an interlock 106 as described above. FIG. 24 further shows a leveling foot 104 supporting the modules 102. FIG. 24 shows the tongue 148 of leveling foot 104 engaged within the groove 114, and no module engaging the key 150. In some embodiments tongues for interlock couplings comprise catches as described elsewhere in this disclosure. The leveling foot 104 shown in FIG. 24 may for example be coupled at the very front of the array 100 (e.g., one of the leveling feet 104 shown in FIG. 5). In alternative embodiments, leveling feet 104 at the front of the array may have a different configuration where key 150 is inserted instead of tongue 148 or omitted. Modules 102 may be disassembled from an array 100 by performing the reverse operations to those set forth above for mounting the modules 102 to the array 100.

Figure 24A:
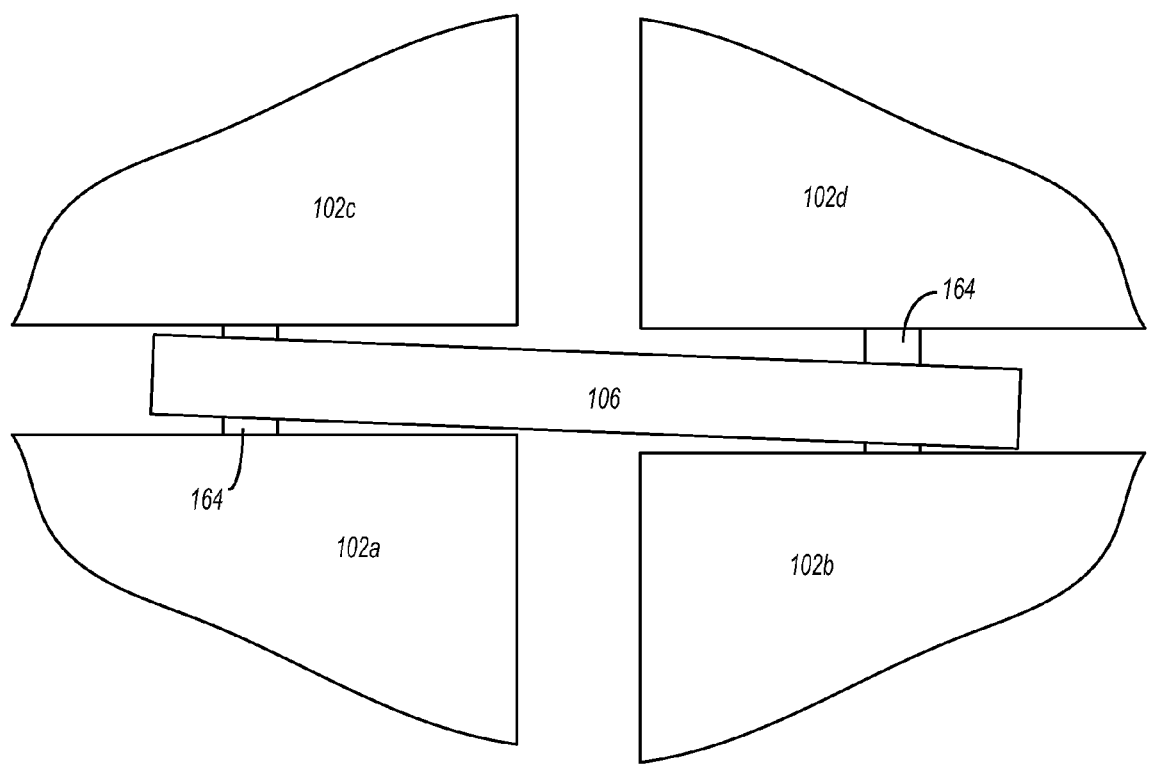
FIG. 24A is a plan view showing four PV modules affixed by an interlock where at least some of the PV modules are misaligned.

In some embodiments, a PV module 102 may align with each adjacent module 102 in the x-direction. However, the interlock 106 may operate even where the modules 102 do not fully align in the x-direction. FIG. 24A shows a plan view of four modules 102a, 102b, 102c and 102d. The modules 102a and 102b are adjacent to each other in the x-direction, but do not completely align. Nevertheless, the interlock 106 may couple the modules 102a and 102b together as described above. Interlock plate 162 can slide in and out on interlock coupling shaft 180 thereby enabling ribs 170 to properly contact bearing portions 124, 128 of groove 114 even under misalignment conditions as shown. The shafts 180 and ribs 170 of the interlock couplings 164 on interlock 106 are long enough so that the key 178 on one side of the interlock 106 may engage within the groove of the module 102a, and the key 178 on the other side of the interlock 106 may also engage within the groove of the module 102b, even though the interlock plate 162 is not parallel to the front edge of either module 102a or 102b.

Any misalignment of modules 102a and 102b may be taken-up by the interlock 106, and not transferred to the next row of modules 102c and 102d. In particular, the modules 102c and 102d may seat over the tongues 176 of respective interlock couplings 164 on the back side of the interlock 106. As noted above, in the coupled position, the tongue still allows for movement of a module with respect to the tongue in a direction parallel to the reference plane. Thus, the modules 102c and 102d may be aligned with each other on the tongues 176, and any misalignment of modules 102a and 102b does not transfer to the next row.

As noted above, where the array 100 is provided on a roof of a residential dwelling, the position of the leveling feet 104 along the x-dimension of a module 102 may be determined by the location of a rafter or joist beneath the roof. This typically will not align neatly over the seams between adjacent modules (since PV modules are not typically the same length as the standard spacing between rafters). Thus, leveling feet 104 may be used to support the array on the rafters or joists, and interlocks 106 may be used to couple together modules at the seams. However, in further embodiments, it may be desirable to slide some rows of modules further to the east or west than others; such as with a hip roof where array 100 fits better if it follows the angle of the hip. In some embodiments it may be desirable to orient some rows of modules 102 in landscape orientation and others in portrait orientation. In these cases, interlock 106 may reside at the seams and/or at any point along the side of PV module 102.

In still further embodiments, array 100 is provided on a support structure 103 that is specifically provided to support the array (such as for example in a ground-mounted array). In such embodiments, an installer is free to choose the position of the supports in the structure 103, and may choose to line those supports up with the seams between modules in the array. For such embodiments, a combined leveling foot and interlock may be used.

Figure 25:
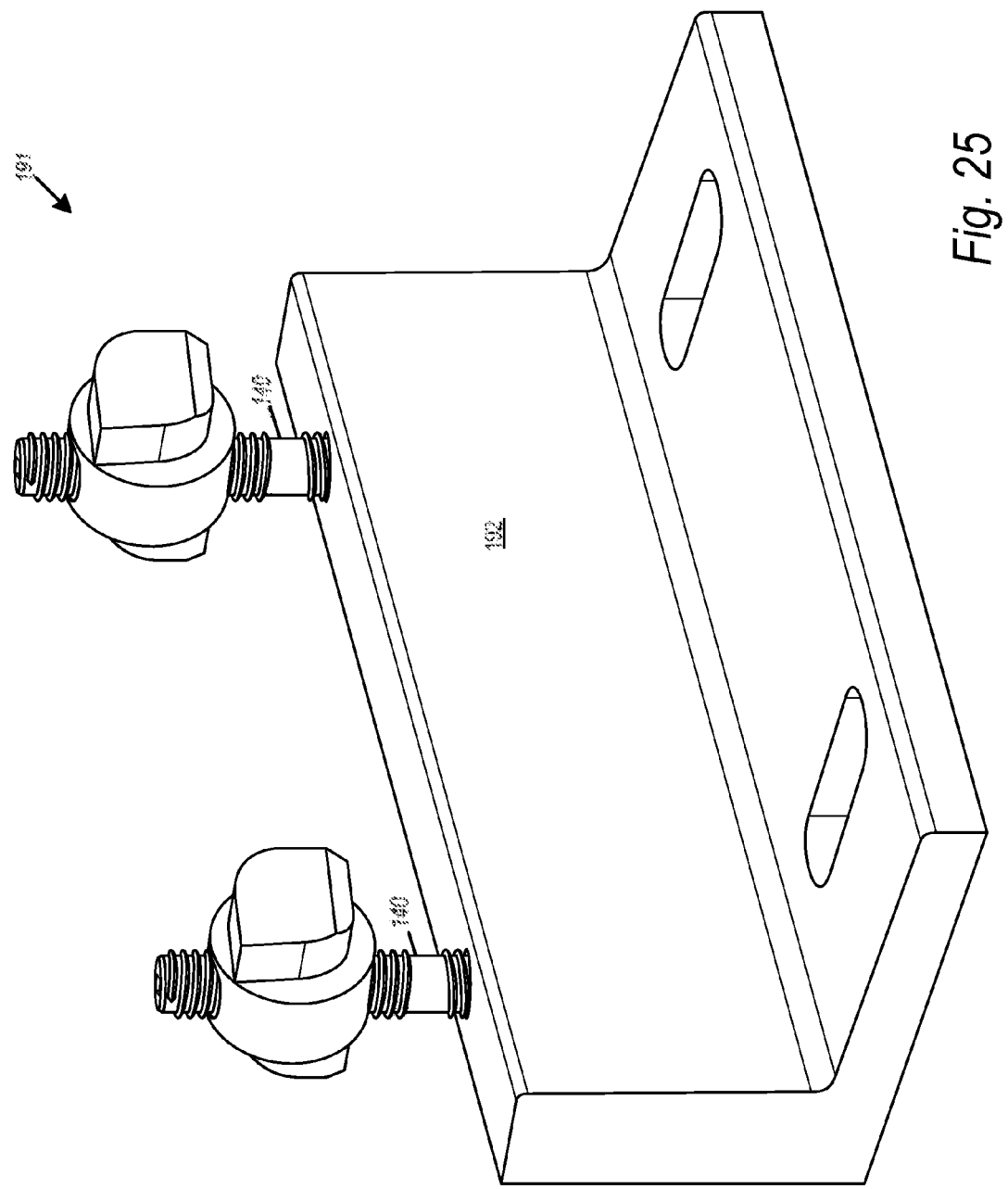
FIG. 25 is a perspective view of a combined leveling foot and interlock coupling according to an embodiment of the present technology.

One embodiment of a combined leveling foot and interlock 191 is shown in FIG. 25. While such a component may have a variety of configurations, in one example, the component 191 may include a foot 192 including a pair of double threaded studs 140 as described above with respect to the leveling foot 104. A pair of foot couplings 138 may be affixed to the foot 192, spaced apart from each other on the studs 140 so that they can engage in the corners of first and second pairs of modules. The first coupling 138 may be affixed to the corners of the first pair of adjacent modules in the y-direction as described above. Likewise, the second coupling 138 in the span may be coupled to the corners of the second pair of adjacent modules in the y-direction as described above. Thus, a single component may be used to fix together the corners of four adjacent modules, support those modules at a desired height above a support surface, and electrically ground those modules together.

The present technology may include additional couplings that mount within groove 114 in further embodiments. In some embodiments, a common element for all these additional couplings may be a key as described above (for example with respect to key 178) that engages with the groove 114 to make a mechanical and electrical connection to the PV module frame 112. In other embodiments a common element may be a tongue such as described above (for example with respect to tongue 148) or any male protrusion capable of engaging with groove 114.

Figure 26:
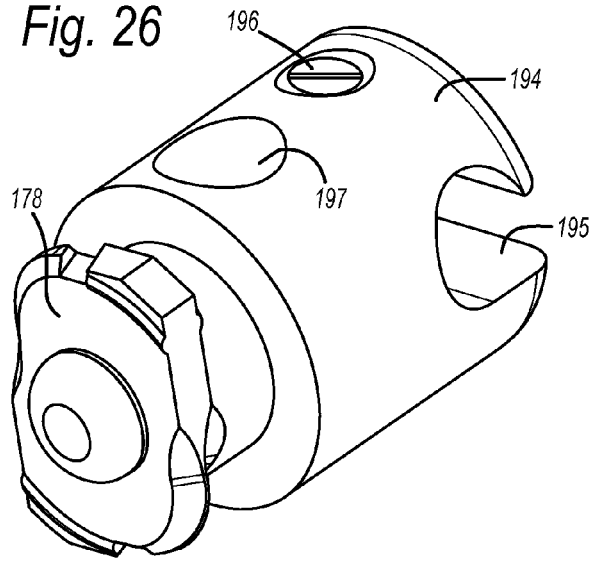
FIG. 26 is a perspective view of a grounding coupling used for grounding the PV array according to an embodiment of the present technology.

As noted above, one such coupling may be a grounding coupling 194 as shown in FIG. 26. The grounding coupling 194 is used to connect a grounding wire (not shown) to one or more PV module 102 of the array 100. The grounding wire is passed through a lay-in-lug channel 195 and then a terminal screw 196 may be turned until a secure ground is made with the grounding wire. The grounding coupling 194 may further include other features of the above-described couplings, such as threaded hole 197 for receiving a double threaded stud that allows the grounding coupling to be supported on the support structure 103 via a base 134 described above with respect to the leveling foot 104. The grounding coupling may further include a key 178 as described above for locking within a key slot 130 in a groove 114 to couple the grounding coupling 194 to a module 102 of the array 100.

Figure 27:
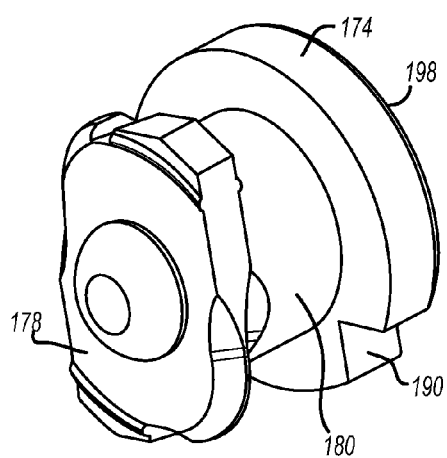
FIG. 27 is a perspective view of an accessory coupling used for affixing additional components to a PV array according to an embodiment of the present technology.

It may happen that other accessories need to be affixed to modules 102 of the array 100. FIG. 27 shows a further coupling, referred to as an accessory coupling 198, for affixing such accessories to modules of the array. The accessory coupling 198 has a key 178 as described above for locking within a key slot 130 in a groove 114 to attach the accessory coupling 198 to a module 102 of the array 100. The accessory coupling may include a flange 174, a shaft 180 between the key 178 and flange 174, and a detent 190. Each of these components may be structurally and operationally the same as the like components described above for interlock coupling 164.

Figure 28:
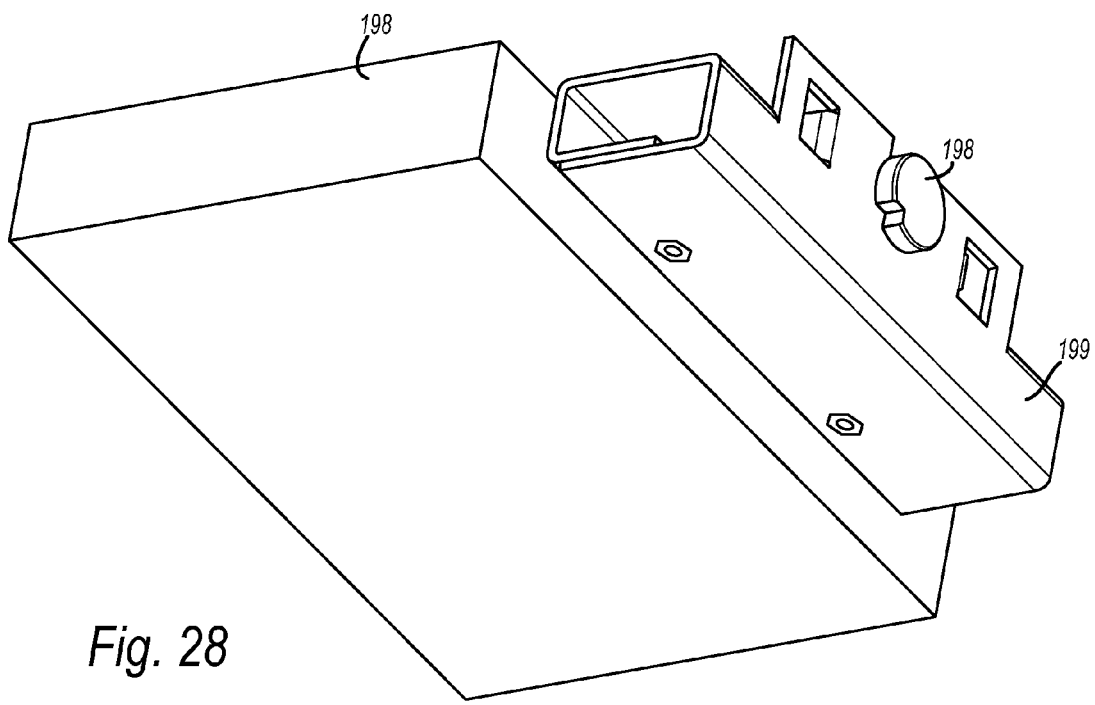
FIG. 28 is a perspective view of the coupling of FIG. 27 coupling a component to a PV array according to an embodiment of the present technology.

The flange 174 may be used to actively hold any type of component against the PV module frame 112 once the accessory coupling 198 is turned from its horizontal insertion position to its vertical locked position. Referring to FIG. 28, the accessory coupling 198 may for example hold a component 199 for PV module inverters, or any other type of electronic device that may be mounted and, possibly, grounded to the PV module frame 112. In the embodiment of FIG. 28, the component 199 may be held under the PV module 102. The accessory coupling 198 could also mount and ground wire junction boxes or wire management systems. The present application covers any device that can be mounted to the PV module frame 112 with a coupling device as described above and/or below.

Figure 29:
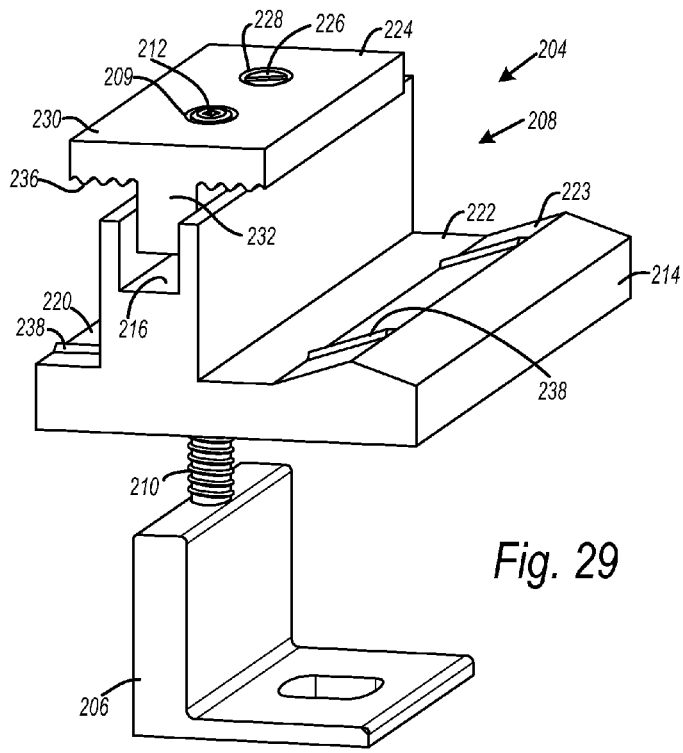
FIG. 29 is a perspective view of a leveling foot for receiving a frame of a PV module that does not include a groove according to an embodiment of the present technology.
Figure 30:
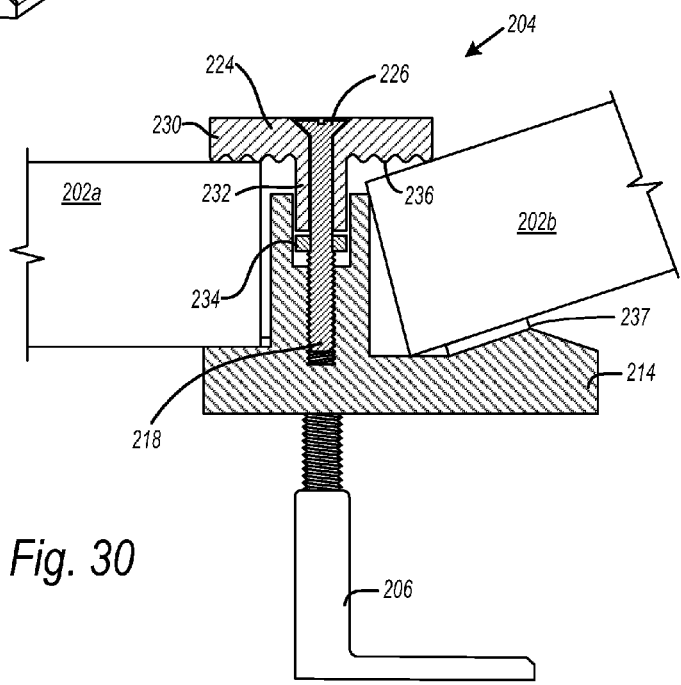
FIG. 30 is a cross-sectional side view of the leveling foot of FIG. 29.

In the above-described embodiments, PV modules 102 include a frame 112 having a novel groove design for engaging with the tongue and/or key and shaft of different couplings. However, those skilled in the art will recognize that generally female parts can be switched for generally male parts and vice versa, therefore further embodiments of the present technology may operate with PV modules 102 not having a groove 114. For example, FIGS. 29 and 30 show a wraparound leveling foot 204 where a coupling or bracket of the leveling foot 204 wraps around the upper and lower surfaces of a pair of PV modules 202 (not having a groove 114) adjacent along the y-axis. It is further understood that wraparound leveling foot 204 may be used with a module 102 having groove 114 in further embodiments.

Wraparound leveling foot 204 may include a base 206, and a coupling 208 attached to the base 206 by double threaded stud 210. The base 206 and stud 210 may be identical to embodiments of the base 134 and stud 140 described above with respect to leveling foot 104. In other embodiments, stud 210 is eliminated and base 206 is an integral part of base 214. Foot coupling 208 may include a hole 209 for receiving stud 210, and rotation of the stud 210, for example by a tool within a tool receiving recess 212 in the stud 210, may raise and lower the coupling 208 with respect to the foot.

Coupling 208 includes a base 214 having a channel 216 and a threaded hole 218. Base 214 includes a first side 220 on a first side of channel 216 and a second side 222 on the opposite side of channel 216. A horizontal portion of the base 214 on the first side 220 may have a uniform vertical thickness, t. A horizontal portion of the base 214 on the second side 222 has a first thickness, v, that is less than the thickness t, and a second thickness, t, which is the same as the thickness t on the first side 220. A sloped surface 223 may be provided connecting the section of side 222 with thickness v to the section of side 222 with the thickness t. The sloped surface 223 peaks at a bearing portion 237, which bears against a module 202 once the module is pivoted down to its final position.

The coupling 208 further includes a top cap 224 and a top cap screw 226. The top cap 224 may seat within the channel 216, and a top cap screw 226 may fit down through the top cap, and into threaded hole 218 in the base 214. As indicated above, a hole 209 is formed through the coupling 208 (including through base 214 and top cap 224) for receiving double threaded stud 210. The hole 209 may be threaded through the base 214, but may be larger in the top cap 224 so that the stud 210 engages the base but not the top cap. Thus, rotation of the stud 210 will raise and lower the base 214, and the top cap supported on the base, but will not independently act on the top cap.

Top cap 224 further includes a second hole 228, countersunk to receive top cap screw 226. Top cap 224 includes a cap section 230 and a shaft section 232. The shaft section 232 fits snuggly within channel 216 and the screw 226 fits through hole 228 in cap 230 and shaft 232 into the tapped hole 218 in the base 214 to mount the top cap to the base. A retaining ring may optionally be provided on top cap screw 226 beneath the shaft 232.

In order to secure a pair of modules 202 to the leveling foot 204 and each other along the y-axis, a first module 202a is inserted in the x-y reference plane between the top cap 224 and the base 214 at the first side 220. The top cap 224 may be loosely affixed to the base 214 at this point, or affixed to the base after module 202a is engaged with side 220 of the base. Once the module 202a is positioned on base 214, top cap screw 226 may be tightened to firmly secure module 202a to wraparound leveling foot 204 between the top cap 224 and the base 214 at the first side 220. An underside of the cap section 230 of top cap 224 may include ridges 236 to ensure a good grip of the top cap 224 against the module 202a when the top cap is tightened down.

Base 214 may include one or more electrical grounding teeth 238, for example in the shape of an inverted v, for cutting through the anodized layer of the module 202a. When the top cap 224 is tightened down against module 202a, the teeth 238 bite through the anodized layer to engage the aluminum or metal layer of the module 202a to provide electrical grounding for the module 202a. In further embodiments, the ridges formed in the underside of the capped section 230 may alternatively or additionally cut into and through the anodized layer to engage the aluminum or other metal layer beneath the anodized layer to provide electrical grounding of the module 202a.

Once the first module 202a is affixed and the top cap 224 is in position, the second module 202b may be inserted at an angle between capped section 230 and slope 223. The sloped surface 223 may be provided at an angle as in the insertion angle described above with respect to groove 114. The insertion angle of slope 223 allows the module 200b to be easily inserted at an angle matching the insertion angle, and then pivoted down on pivot points into the x-y reference plane to engage the module 202b between the base 214 and the top cap 224 (which is fixed in place around the first module 202a).

The distance between the outer edge of cap section 230 and slope 223 is at least as great as the thickness of modules 202 in a direction perpendicular to the slope 223. Once inserted as far as it will go at the insertion angle, the module 202b is pivoted downward to reside in the x-y reference plane of the array, thereby creating a pivot-fit connection similar to that described above. One skilled in the art will recognize that the pivot-fit connection of FIG. 30 still allows for take-up of dimensional variations since module 202b is not significantly constrained in the y-axis once it has been pivoted into position, yet it is substantially constrained in the z-axis by top cap 224 and base 134. Portions of the second side 222, such as for example slope 223, may include one or more electrical ground teeth 238 as described with respect to first side 220. Teeth 238 may still maintain reliable electrical contact even with small variations in module 202b position along the y-axis. Wraparound leveling foot 204 allows PV modules having no groove to be coupled and electrically grounded together and supported on a support surface. Moreover having top cap 224 which screws down onto the modules allows the wraparound leveling foot 204 to be used with modules of different thicknesses. In further embodiments, the top cap screw 226 may be omitted and the top cap 224 may be integrally formed with, or otherwise permanently affixed to, base 214. Such an embodiment may be used with modules 202 having a single uniform thickness.

Figure 30A:
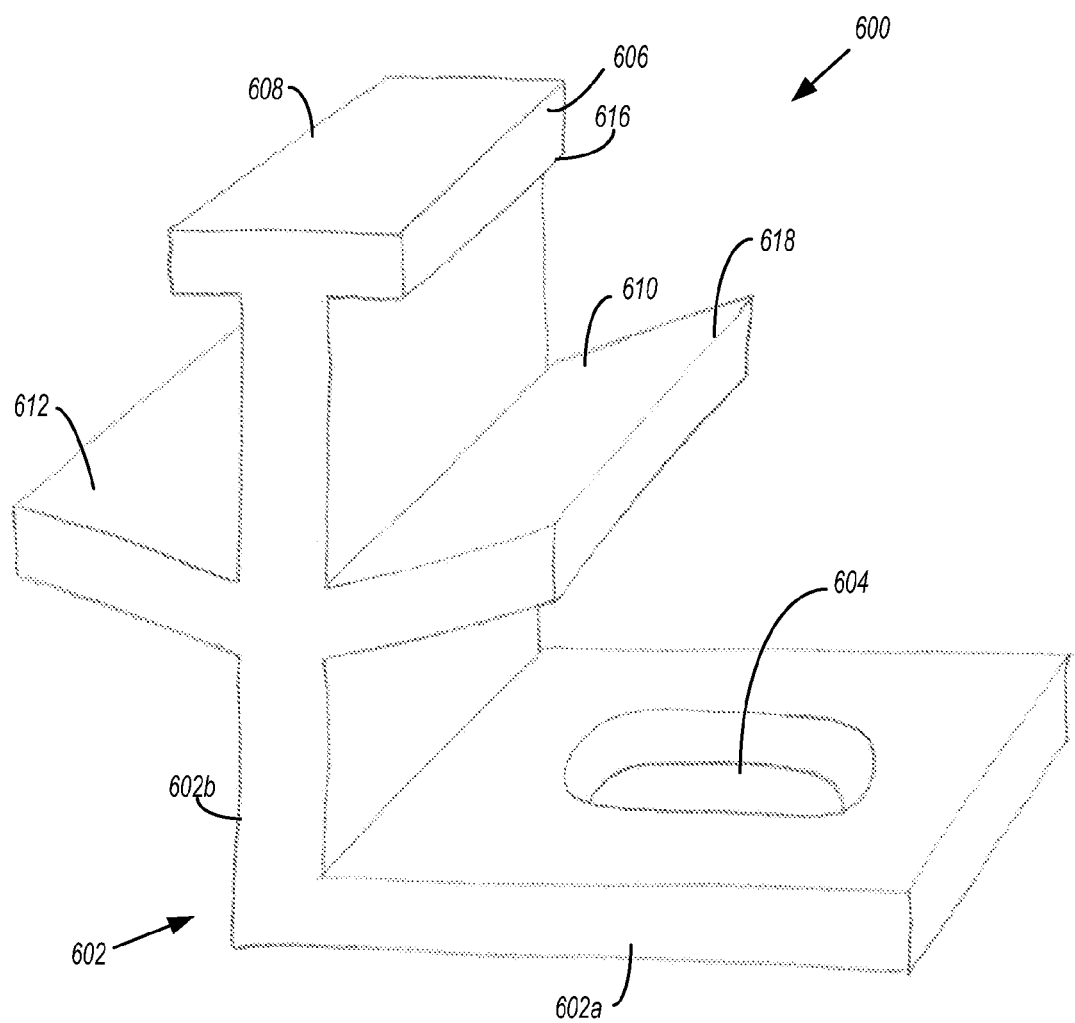
FIG. 30A is a perspective view of a leveling foot for receiving a frame of a PV module that does not include a groove according to a further embodiment of the present technology.

FIG. 30A shows an alternative embodiment of a wraparound leveling foot 600. Wraparound leveling foot 600 is similar to wraparound leveling foot 204, but wraparound leveling foot 600 may be formed of a unitary construction without any movable components. In particular, wraparound leveling foot 600 may include a bracket 602 including a horizontal base portion 602a, and a vertical portion 602b. Base portion 602a may include an opening 604 for mounting the leveling foot 600 to a support structure 103. In embodiments, the height of wraparound leveling foot 600 is not adjustable, so that leveling foot 600 may be best suited to connection to a straight surface such as a rail 256 described below, for example with respect to FIG. 38. However, the leveling foot 600 may be connected to the support structure 103 by other methods in further embodiments.

The vertical portion 602b includes upper flanges 606 and 608 extending from opposite sides of vertical portion 602b, and lower flanges 610 and 612 extending from opposite sides of vertical portion 602b. The lower flanges may be angled upward from their connection point with vertical portion 602b at some angle, for example the above-described insertion angle.

As described above with respect to FIG. 29, a first PV module (not shown in FIG. 30A) may be inserted at an angle between upper flange 606 and lower flange 610. The angle may be the insertion angle of lower flange 610, and may for example be 15°, though it may be other angles in further embodiments. Once inserted so that the PV module abuts against the vertical portion 602b, the PV module may be pivoted down into the x-y reference plane until the module bears against a bearing portion 616 in the upper flange 606 and a bearing portion 618 in the lower flange 610. At this point, the PV module may be secured to the wraparound foot coupling 600 and constrained against movement in the vertical direction. It may still be adjusted in the reference plane. A second PV module may be affixed to the wrap around foot coupling 600 on the opposite side of the vertical portion 602 in the same manner. The wraparound module 600 may further include grounding teeth, such as the grounding teeth 238 described above with respect to FIG. 29.

Figure 31:
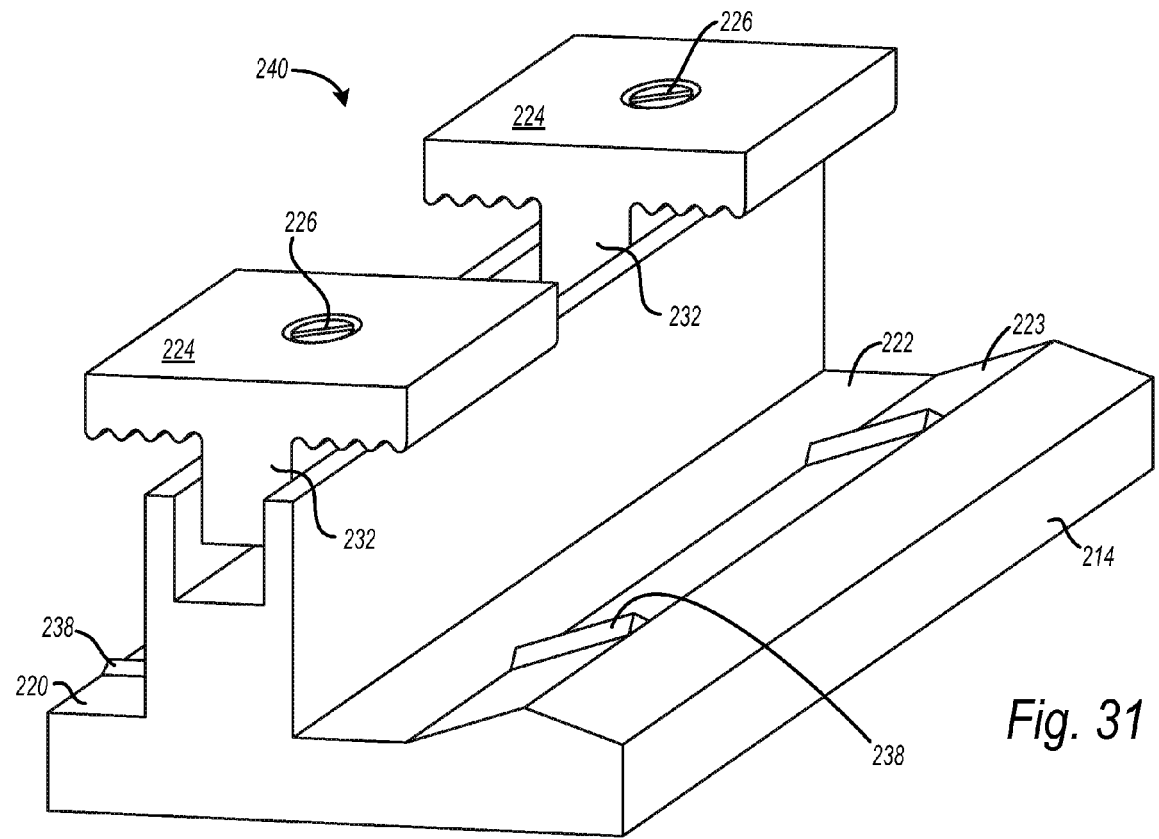
FIG. 31 is an alternative embodiment of an interlock for mounting PV modules which do not have a groove in the frame according to an embodiment of the present technology.
Figure 32:
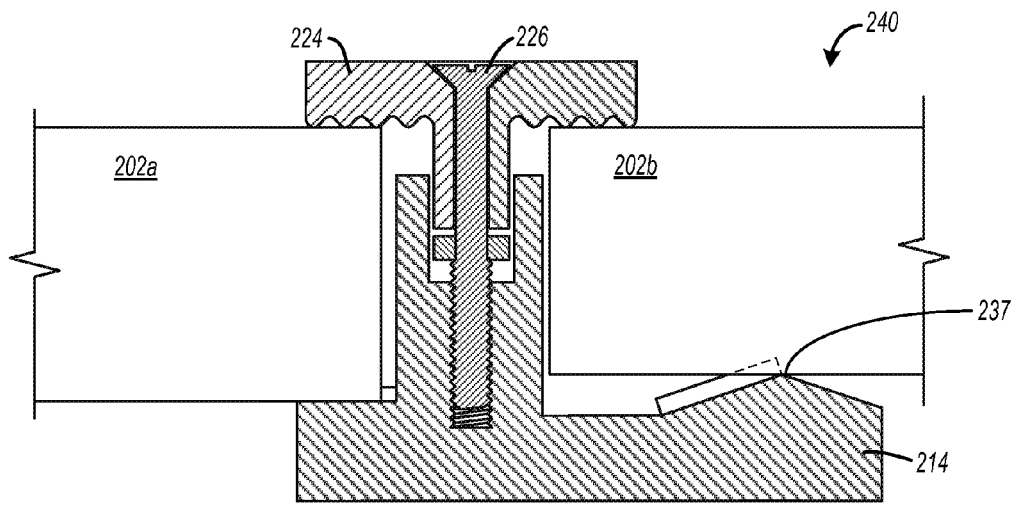
FIG. 32 is a cross-sectional side view of the interlock of FIG. 31.

FIGS. 31 and 32 are perspective and side views of a wraparound interlock 240 according to embodiments of the present technology. Wraparound interlock 240 is structurally and operationally similar to wraparound leveling foot 204, and components in FIGS. 29 through 32 having the same reference numbers have like functionality. One difference is that while wraparound leveling foot 204 is provided to couple a single pair of modules adjacent to each other in the y direction, wraparound interlock 240 is provided to couple two pair of modules adjacent each other in the x and y directions. Accordingly, the base 214 of wraparound interlock 240 is similar to base 214 for wraparound leveling foot 204, but the base 214 of interlock 240 is longer in order to span the corners of four modules adjacent in the x-direction and y-direction.

A second difference may be that the base 206 and stud 210 of the wraparound leveling foot 204 may be omitted from the interlock 240. Thus, the wraparound interlock 240 in some embodiments can couple together four corners of adjacent modules, but does not support those modules on the support structure 103. In further embodiments, the wraparound leveling foot 204 and wraparound interlock 240 may be combined so that the base 206 and stud 210 of the wraparound leveling foot may be added to the structure of wraparound interlock 240. The resulting coupling would couple together the corners of four adjacent modules, and support those modules at an adjustable height on the support surface.

In accordance with the above, the wraparound interlock 240 shown in FIGS. 31 and 32 may include a pair of top caps 224 provided within channel 216. Alternatively, wraparound interlock 240 may include a single top caps 224 which spans the entire length of the base 214. In such an embodiment, top cap 224 may have a single top cap screw 226 for tightening the top cap down onto the four corners of adjacent PV modules, or a pair of top cap screws through a pair of top cap screw holes for tightening the top cap 224 down onto the four corners of adjacent modules. Once a first pair of modules 202a is inserted into the first side 220 of base 214, the top cap or caps 224 may be tightened down. Thereafter, a pair of second modules may be inserted into the second side 222 of base 214 at the insertion angle, and pivoted down to the final coupled position (shown in FIG. 32) to create a pivot-fit connection similar to that described above. As above, the screw-down top cap may be omitted in favor of an integrally formed top cap for working with modules of a single, uniform thickness.

Figure 32C:
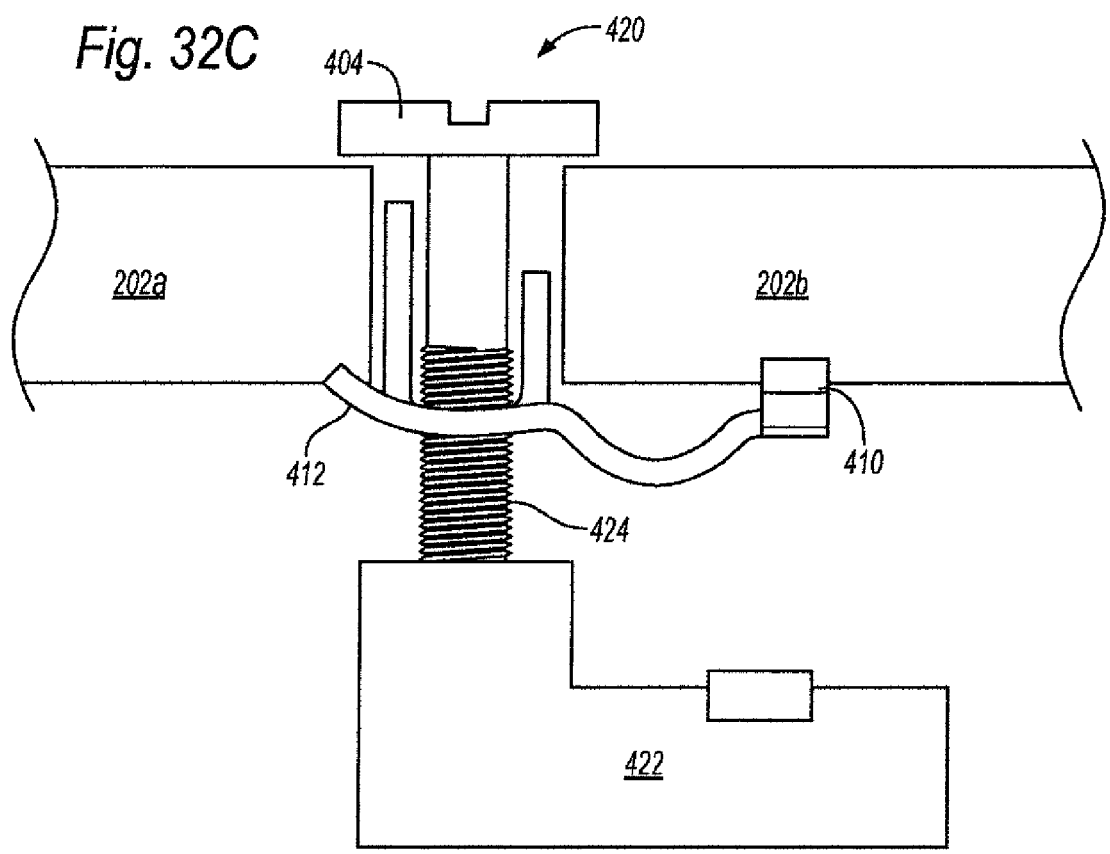
FIG. 32C is a leveling foot formed with the alternative embodiment shown in FIGS. 32A and 32B according to an embodiment of the present technology.

FIGS. 32A through 32C show a further embodiment of a wraparound coupling 400. The coupling 400 of this embodiment may include a base plate 402 and a screw 404. While a single screw 404 is shown in FIG. 32A, the wraparound coupling 400 may include a second screw for engaging a second pair of modules as explained below. The screw 404 may have a head 406. The wraparound coupling 400 may further include grounding teeth 412 on a first side of the base plate 402, and grounding teeth 410 on a second side of the base plate 402.

FIG. 32B shows a side view of the wraparound coupling 400 connecting together a pair of modules 202a and 202b in the y-direction via the screw 404. A second screw 404 (not seen in the side view of FIG. 32B) would similarly connect together a second pair of modules (not seen in the side view of FIG. 32B) adjacent to modules 202a and 202b in the x-direction. In operation, the first module 202a is brought against a first side of the wraparound coupling 400 and the screw 404 is tightened down until the module 202a is held by head 406. Thereafter, a second module 202b may be brought in, for example at the insertion angle shown in phantom in FIG. 32B, until contact with a stop 416 formed on the base plate 402. The second module 202b may then be pivoted downward as explained above to couple the second module 202b to the wraparound coupling 104. The grounding teeth 412 may engage metal within the first module 202a when the screw 404 is tightened down, and the grounding teeth 410 may engage metal within the second module 202b when the module 202b is pivoted down to its final position.

FIG. 32C shows an embodiment of a wraparound coupling 420. Coupling 420 is similar to coupling 400 shown in FIGS. 32A and 32B, but in FIG. 32C, the wraparound coupling 420 is adapted to be supported on a support structure as in support structure 103 described above. For this purpose, wraparound coupling 420 includes a base 422 for being supported on a support structure as in support structure 103, and a stud 424, which may be any of the studs described above for mounting a coupling on a base. The modules 202a and 202b may be affixed to wraparound coupling 420 as described above with respect to wraparound coupling 400.

Figure 32D:
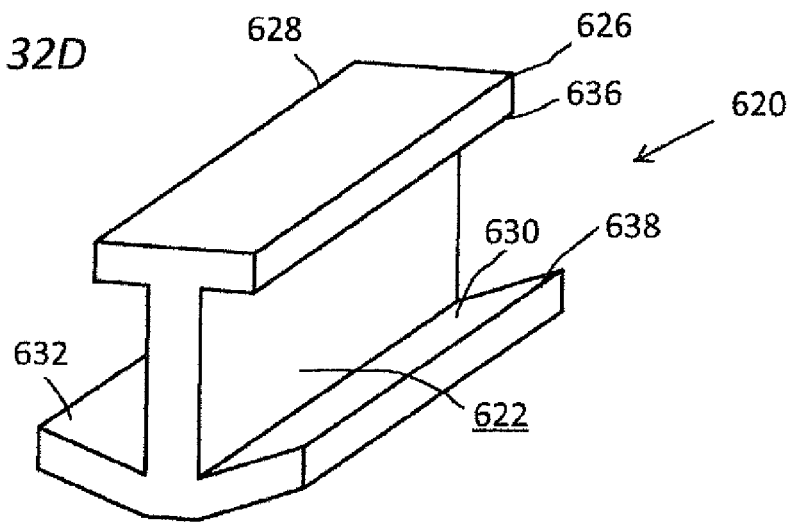
FIG. 32D is an interlock for mounting PV modules which do not have a groove in the frame according to an alternative embodiment of the present technology.

FIG. 32D shows an alternative embodiment of a wraparound interlock 620. Wraparound interlock 620 is similar to wraparound interlock 240 of FIG. 31, but wraparound interlock 620 may be formed of a unitary construction without any movable components. In particular, wraparound interlock 620 may include a vertical portion 622, upper flanges 626 and 628 extending from opposite sides of vertical portion 622, and lower flanges 630 and 632 extending from opposite sides of vertical portion 622. The lower flanges may be angled upward from their connection point with vertical portion 622 at some angle, for example the above-described insertion angle.

As described above with respect to FIG. 31, the wraparound interlock 620 may be inserted over a first PV module (not shown in FIG. 32D) at an angle with upper flange 626 and lower flange 630 fitting over the upper and lower edges of the frame. The angle may be the insertion angle of lower flange 630, and may for example be 15°, though it may be other angles in further embodiments. Once inserted so that the PV module abuts against the vertical portion 622, the interlock 620 may be pivoted down the PV module bears against a bearing portion 636 in the upper flange 626 and a bearing portion 638 in the lower flange 630. At this point, the wraparound interlock 620 may be secured to the PV module. A second PV module may be affixed to the wraparound interlock 620 on the opposite side of the vertical portion 622. The wraparound interlock 620 may further include ground teeth, such as the ground teeth 238 described above with respect to FIG. 31.

FIG. 33 shows a perspective view of a PV array 200 assembled together using wraparound leveling feet 204 and wraparound interlocks 240. As seen, wraparound leveling feet 204 located between adjacent modules 202 in the y-direction are used to couple those modules together and support the array 200 on a support structure 103. Wraparound interlocks 240 located between adjacent modules in the x-direction and adjacent modules in the y-direction may be used to couple together the corners of four adjacent modules. While the embodiment of FIG. 33 shows foot bases 206 on interlocks 240, other embodiments contemplate use of interlock 240 as shown in FIG. 31 instead. In an alternative embodiment, either the first side 220 or the second side 222 may be omitted from wraparound interlock 240 so that it connects only adjacent modules in the x-direction and not the y-direction. Given the above disclosure, those of skill will appreciate that other couplings, such as an electrical ground coupling and an accessory coupling, may be configured as wraparound couplings in further embodiments.

Figure 34:
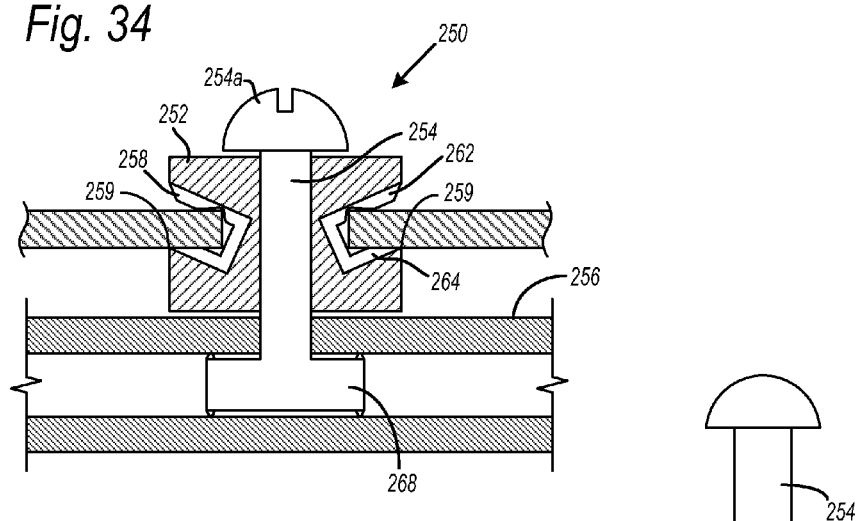
FIG. 34 is a cross-sectional side view of a further embodiment of an interlock coupling for coupling together PV laminates that do not include a frame.
Figure 35:
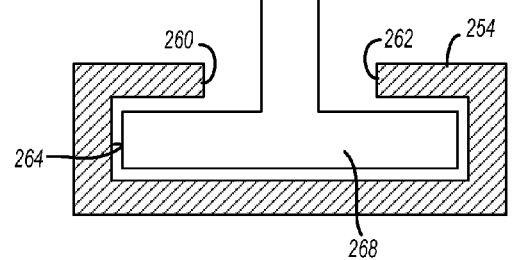
FIG. 35 is a cross-sectional end view of a rail for supporting the interlock coupling of FIG. 34.
Figure 36:
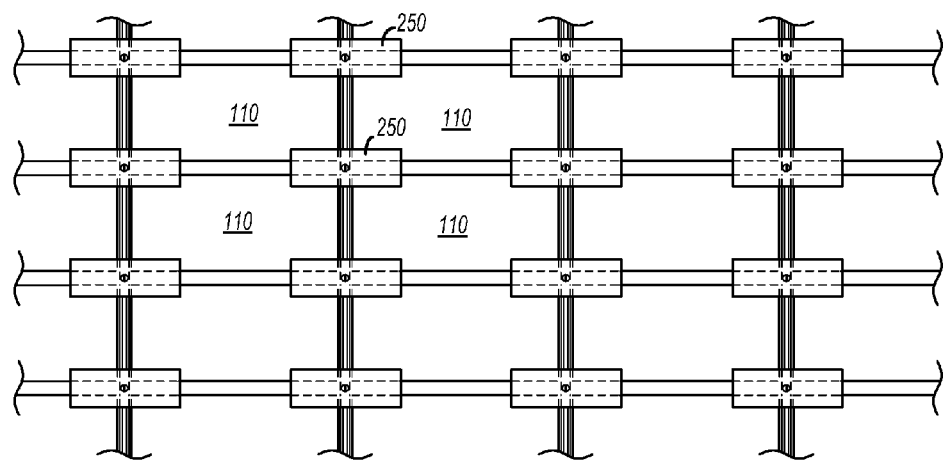
FIG. 36 is a plan view of at least a portion of an array formed with the interlock coupling of FIG. 34.

To this point, the PV modules have been described as a laminate 110 within a frame 112. However, it may happen that a solar array is comprised of PV laminates 110 without a frame 112. FIGS. 34 through 36 show a further embodiment of a coupling for coupling together laminates 110 having no frame. Laminates 110 are still sometimes referred to as PV modules 110 since they comprises electrical connections. Frameless interconnect 250 may be used to couple together a pair of frameless laminates in the y-direction, a pair of laminates in the x-direction, or at the corners of four laminates adjacent in both the x-direction and y-direction.

Frameless interconnect 250 in general includes a coupling 252 affixed to a mounting screw 254. The mounting screw 254 is in turn affixed within a rail 256 of a system of rails laid down on the support structure 103. Coupling 252 may include a first side having a first groove 258 formed into the coupling along the side of the coupling and angled downward from the exterior surface inward. The angle may for example be the insertion angle of 15°, but may vary in further embodiments of the invention. Coupling 252 may similarly include a second, opposed side having a second groove 262 configured as the mirror image of the first groove 258, i.e., along the side of the coupling and angled downward into the coupling at for example an angle of, for example, 15°.

The grooves 258 and 262 receive a bare laminate, and the grooves may include a pliant lining 264 of, for example, rubber, to prevent fracturing of the laminate edges received within the grooves. In order to mount a PV laminate within the first or second grooves 258, 262, the laminate is inserted at an angle matching the insertion angle of the groove, and thereafter pivoted downward to create a pivot-fit connection. The coupling 250 includes bearing portions 259, which bear against a PV laminate 110 on first and second sides of the coupling once the laminate is pivoted down to its final position.

The coupling 252 may be affixed to support structure 103 via mounting screw 254 and rails 256. The coupling 252 may be supported on mounting screw 254 in a number of ways. In a first embodiment, coupling 252 may have threads engaging with threads of mounting screw 254 so that rotation of the mounting screw 254 relative to the coupling 252 results in movement of the coupling up or down along the mounting screw. In a second embodiment (shown in FIG. 34), once the screw 254 is mounted within the rail 256 as explained below, the space between a head 254a of mounting screw 254 and the rails 256 may be approximately equal to the height of the coupling 252. In such an embodiment, the position of the coupling 252 is then fixed when the screw 254 is mounted in the track. A further embodiment may be similar to that described above and shown in FIG. 34, but a spring-biased mechanism may be positioned on the mounting screw. The spring-biased mechanism may have a first end biased against a lower surface of coupling 252 and a second end biased against an upper surface of rail 256. Thus, the coupling 252 is pressed upward against the head 254a and the portions of the mounting screw fitting within the rail (explained below) are biased against an interior, upper surface of the rail.

In some embodiments, the frameless interconnect 250 mounts within rails 256, which may be affixed to the support surface along the x-axis and/or y-axis. The rails 256 may be positioned at locations which correspond to the seams between adjacent PV laminates 110, but need not correspond to both axes in some embodiments. As seen in FIG. 35, a rail 256 may have a substantially C-shaped cross-section. The rail 256 may include opposed surfaces 260 and 262 and wider than a key slot 264 accessible through opposed surfaces 260 and 262.

In one embodiment, mounting screw 254 may include a key 268 at its base having a length greater than its width. When the width dimension of key 268 (visible in FIG. 34) is aligned between opposing surfaces 260 and 262, the width dimension may fit between the opposed surfaces 260, 262 to allow insertion of the mounting screw into the key slot 264. Thereafter, the mounting screw may be rotated 90° so that the length dimension of key 268 locks within key slot 264. The length dimension of key slot 264 is visible in the cross-sectional view of FIG. 35. Those skilled in the art will appreciate a variety of other mechanisms for supporting the coupling 252 on a support surface. In a further embodiment, a foot and double threaded stud, as for example described above with respect to leveling foot 104, may be provided and coupling 252 mounted on the stud. In such an embodiment, rails 256 may be omitted.

FIG. 36 shows a plan view of an array which can be formed using the frameless interconnect 250. It shows a number of frameless interconnects, each connecting together four adjacent PV laminates 110 at their corners. FIG. 36 further shows rails 256 oriented in the y-direction. The rails 256 may be oriented in the x-direction in further embodiments. In further embodiments, the frameless interconnect 250 may be halved along the y-axis so as to join only two adjacent modules along the y-axis, or the frameless interconnect 250 may be halved along the x-axis so as to join only two adjacent modules along the x-axis.

Figure 37:
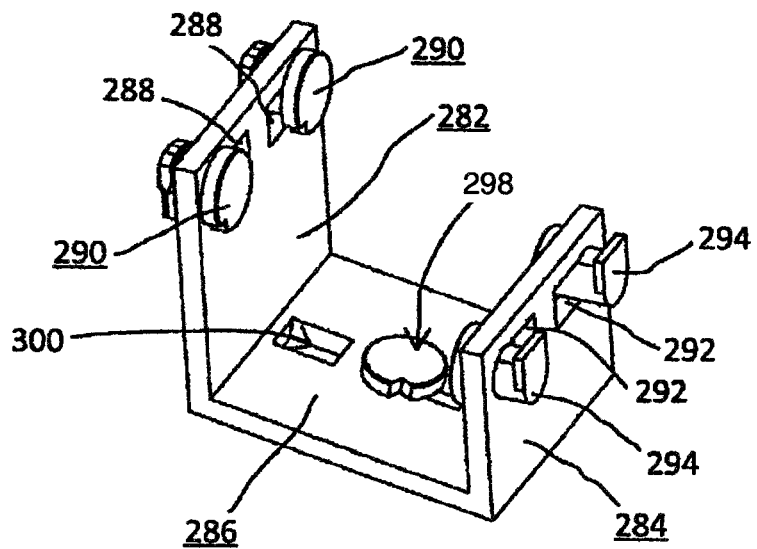
FIG. 37 is a perspective view of a further embodiment of a coupling for working with grooved-frame PV modules on a flat roof according to an embodiment of the present technology.
Figure 38:
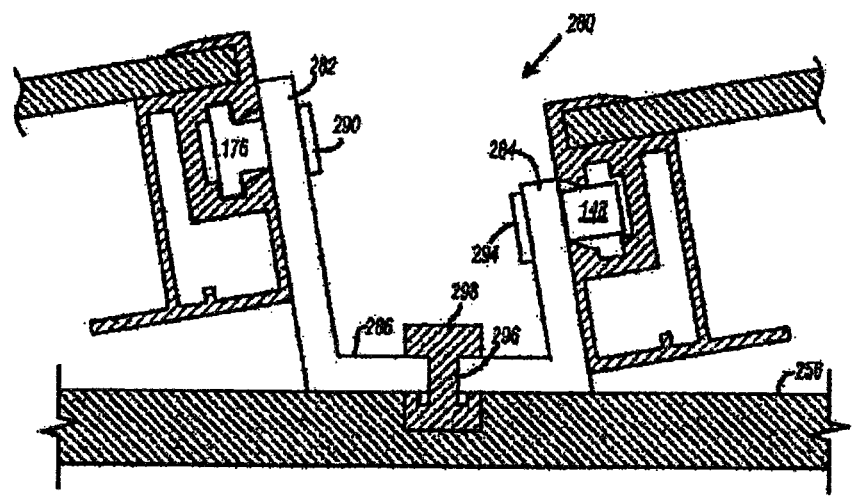
FIG. 38 is a cross-sectional side view of the coupling of FIG. 37.
Figure 39:
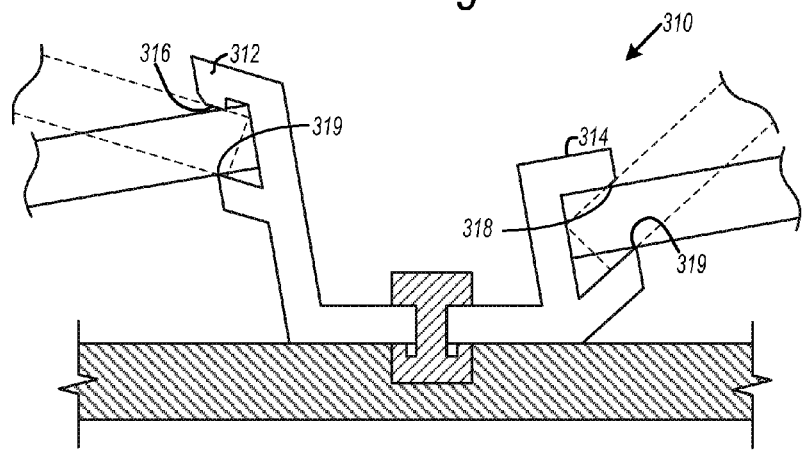
FIG. 39 is a cross-sectional side view of a coupling for operating with PV module frames which do not have a groove and which are adapted to be mounted on a flat roof according to an embodiment of the present technology.

The PV array described above for example with respect to FIG. 1 may lie in a flat x-y reference plane on an inclined support structure 103, such as for example the roof of a residential dwelling. It is understood that a PV array may also be provided on a flat surface, such as for example a commercial roof or a ground-mounted array. FIGS. 37 through 39 illustrate a tilt interlock 280 which may be used for example to mount PV modules on a flat surface, where each module is provided at an inclined angle with respect to the support surface and x-y reference plane in order to optimize the angle of incidence of solar radiation. It is understood that the PV array in the x-y reference plane of FIG. 1 may be mounted on a flat surface, and it is understood that the PV array described with respect to FIGS. 37 through 39 may be mounted on an inclined surface.

The tilt interlock 280 may be configured to operate with modules having an angled groove 114 (as shown in FIGS. 37 and 38) or modules not having an angled groove (as shown in FIG. 39). Referring initially to FIGS. 37 and 38, there is shown an interlock 280 including a first upright 282 spaced from, and generally parallel to, a second upright 284. The first and second uprights may be integrally formed with, or otherwise connected to, a base plate 286. First upright 282 extends a greater distance away from the base plate 286 in the z-direction than the second upright 284. The tilt interlock 280 may be formed for example of extruded or rolled aluminum or some other metal such as rolled steel.

The first upright 282 may include a pair of holes 288 for receiving a first set of couplings 290. The second upright 284 may include a pair of holes 292 for receiving a second set of couplings 294. And the base plate 286 may include a mounting hole 296 for receiving a base plate coupling 298. Base plate 286 may further include a pair of alignment tongues 300 stamped from the base plate and extending downward to align the tilt interlock with a rail as explained hereinafter. The length of the base plate between the first and second uprights may be selected to prevent the first upright 282 from casting a shadow on the PV module mounted to the second upright 284.

A first pair of PV modules adjacent to each other in the x-direction (one of which visible in FIG. 38) may be affixed to the first upright 282 via a first set of couplings 290. The opposite end of the first pair of PV modules (not shown) is supported on a second upright 284 of the next tilt interlock 280. Thus, the PV modules are mounted at an angle which is a function of the difference in height of the first and second uprights 282, 284 and the length of the PV modules. In some embodiments, this angle may vary between 1° and 30° and may for example be 10° (note that this angle is independent of the insertion angle discussed above and hereinafter with respect to a pivot-fit connection which may be related to a final plane of a PV array or a row of PV modules). In some embodiments, the first pair of PV modules may form a right angle on the first upright 282 when coupled thereto. As the PV modules are angled as discussed above, the first upright 282 may also be angled with respect to vertical at the same angle that the PV modules form with horizontal.

As indicated, upright 282 includes a first set of couplings 290, which in some embodiments, may each comprise an accessory coupling as described above with respect to FIG. 27. As described above, such couplings may be mounted through holes 288 with a key engaging a groove 114 of the first pair of modules, and a flange braced against a surface of upright 282. In some embodiments upright 282 further comprises ribs 170 as described above.

A second pair of PV modules adjacent to each other in the x-direction (one of which visible in FIG. 38) may be affixed to the second upright 284 via a second set of couplings 294. The opposite end of the second pair of PV modules (not shown) is supported on a first upright 282 of the next tilt interlock 280, thus mounting the second pair of PV modules at the same angle as the first pair of PV modules. The second upright 284 may also be tilted at the same tilt angle, e.g. 10°, so that the finished coupling between the second upright 284 and second pair of modules is at a right angle.

The second upright 284 may include a pair of couplings 294 having a tongue such as for example tongue 148 described above with respect to leveling foot 104. In order to mount the second pair of PV modules 102b on the respective tongues of the second set of couplings 294, the modules are inserted over the tongues at an angle equal to the tilt angle plus the insertion angle. Where the tilt angle is 10° and the insertion angle is 15°, the PV modules 102b may be inserted at an angle of 25° with respect to horizontal. Again, these angles are by way of example only. At such an angle, the upper and lower sloped surfaces 122, 126 in the groove 114 of PV modules 102b are parallel to and aligned with the tongues 148 of the respective couplings 294. Once engaged over the tongues of the second couplings 294, the PV modules 102b may be pivoted downward to the final tilt angle to provide the above-described pivot-fit connection of the second pair of modules 102b with the tilt coupling 280. The tongues on couplings 294 may comprise grounding teeth as described for tongues 148; other embodiments contemplate no grounding teeth on the tongues of couplings 294.

The tilt interlock 280 may be mounted to a variety of support surfaces by a variety of fastening mechanisms. In the embodiment shown, the tilt interlock 280 is mounted to a support structure 103 via rails 256 such as described above with respect to FIG. 35. In such an embodiment, the base plate coupling 298 may include a key 302 which may be fit within a key slot and then rotated to engage the key within the rail 256. A pair of alignment tongues 300 may also fit down within the channel defined between opposed surfaces 260, 262 in the rail 256 to align and maintain the tilt interlock 280 in the proper orientation with respect to rail 256.

The rails 256 in any of the above described embodiments may be mounted directly to the support surface, which may for example be a flat roof or a ground-mounted support system. Alternatively, the rails may be supported on support blocks so as to be spaced from the support surface. Those skilled in the art will appreciate a wide variety of other methods for mounting tilt interlock 280 to a support surface. In one further embodiment, tilt interlock 280 may include a foot and double threaded stud such as for example those described above with respect to leveling foot 104. In such an embodiment, base plate 286 may include a threaded hole for receiving the double threaded stud. In this instance, the base plate coupling 298 and rails 256 may be omitted. In other embodiments, tilt interlock 280 is held down via ballast material and/or pans with ballast material in them.

FIG. 39 shows a wraparound tilt interlock 310, which may be structurally and operationally similar to tilt interlock 280, except that it is designed for pivot-fit connections at both ends of each PV module 102. Interlock 310 may be configured to operate with PV module frames not including a groove 114 or with frameless laminates. Instead of the first and second set of couplings 290, 294, the wraparound tilt interlock 310 may include a first set of gripping arms 312 in the first upright 282 and a second set of gripping arms 314 in the second upright 284. At least the bottom arm of the first and second set of gripping arms 312, 314 may be angled upward by the insertion angle as described above, which may for example be 15°. The insertion angle here is with respect to the first and second uprights 282, 284, which as explained above are provided at a tilt angle with respect to vertical such as for example 10°.

In order to install a first pair of PV modules positioned side by side with each other along the x-direction (one such module visible from the side view of FIG. 39) on upright 282, the modules are brought in at an approach angle matching the insertion angle minus the tilt angle of the first set of gripping arms 312. Where for example insertion angle is 15° and the tilt angle is 10°, this net angle will be 5° from horizontal. It is understood these angles are provided by way of example only and may vary in further embodiments. Once the PV module(s) are inserted between the first set of gripping arms 312, they may be pivoted downward to their final orientation at the tilt angle to provide the pivot-fit connection. The first set of gripping arms 312 may include bearing portions 316, 319 which bear against the PV module(s) when rotated to their final position to secure the PV modules between the gripping arms 312. In some embodiments, these bearing portions may include cutting teeth to provide an electrical ground connection between the modules in the first pair of modules. In some embodiments interlock 310 is pivoted into position onto module 102 when making the upper connection, whereas the module 102 is dropped into the lower connection and pivoted down, thereby enabling a rapid succession of such operations in the north-south direction.

In order to install a second pair of PV modules positioned side by side with each other along the x-direction (one such module visible from the side view of FIG. 39) on upright 284, the modules are brought in at an approach angle matching the insertion angle plus the tilt angle of the second set of gripping arms 314. Where for example insertion angle is 15° and the tilt angle is 10°, this net angle will be 25° from horizontal. It is understood these angles are provided by way of example only and may vary in further embodiments. Once the PV module(s) are inserted between the second set of gripping arms 314, they may be rotated downward to their final orientation at the tilt angle. The second set of gripping arms 314 may include bearing portions 318, 319 which bear against the PV module(s) when rotated to their final position to secure the PV modules between the gripping arms 314. In some embodiments, these bearing portions may include cutting teeth to provide an electrical ground connection between the modules in the first pair of modules.

Figure 40:
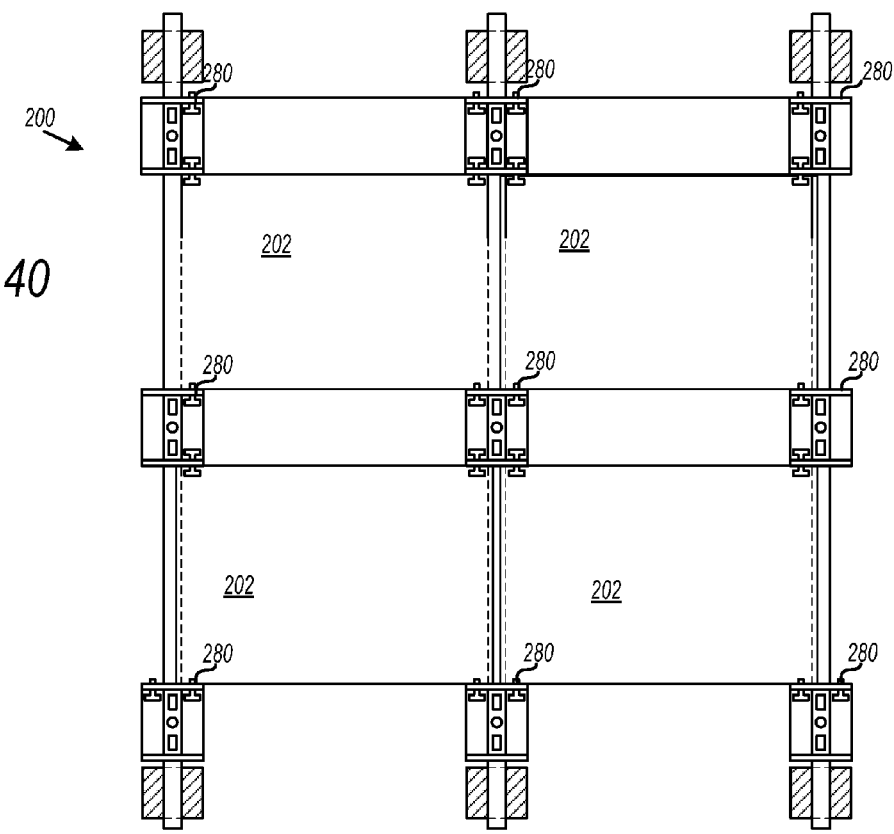
FIG. 40 is a plan view of at least a portion of an array formed with the couplings of FIG. 38 or 39.

FIG. 40 shows a plan view of an array of PV modules assembled together using either the tilt interlock 280 or the wraparound tilt interlock 310. In some embodiments using a grooved frame and tilt interlocks 280, a first row of the tilt interlocks may be mounted to rails 256, with the tongues of the interlocks pointing inward toward the array. Thereafter, a pair of PV modules 102 may be dropped onto the tongues of a second set of couplings 294 in the first row of tilt interlocks 280. The PV modules 102 may be pivoted downward to their final tilt position. At that point, a second row of tilt interlocks 280 may then have the keys of the first set of couplings 290 inserted into the adjacent grooves in the PV module frame. The second row of tilt interlocks may then be fastened to the rails 256. The process may then be repeated for the remaining PV modules in the y-direction.

As seen in FIG. 40 and described above, the tilt interlock 280 may be used to join the corners of four PV modules adjacent along the x-axis and y-axis. In further embodiments, the tilt interlock 280 may be halved along the y-axis so as to join only two adjacent modules along the y-axis, or the tilt interlock 280 may be halved along the x-axis so as to join only two adjacent modules along the x-axis.

Figure 41:
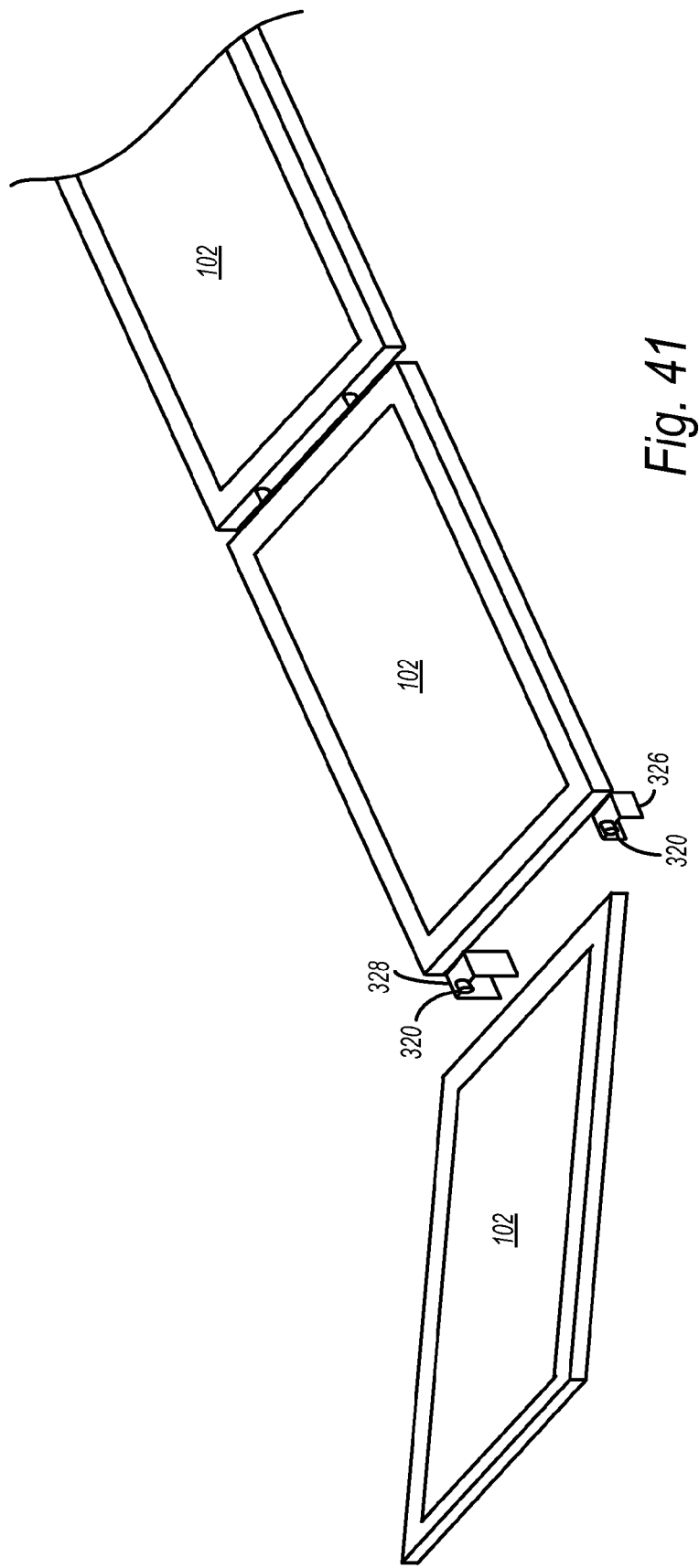
FIG. 41 is a perspective view of a further embodiment of couplings for assembling a PV module into an array while the PV module is inclined about both the X-axis and Y-axis.

In some embodiments described above, certain couplings have been described as coupling along either the y-axis or the x-axis. However, it is understood that in further embodiments, any of the couplings may be used to couple along the y-axis and/or the x-axis. Embodiments of these couplings include a tongue, key or bracket used in any of a leveling foot 104, interlock 106, wraparound leveling foot 204, wraparound interlock 240, frameless interconnect 250, tilt interlock 280 and wrap around tilt interlock 310. FIG. 41 shows one such example. In the embodiments described above, a tongue has been used for connections along the y-axis. In the embodiment of FIG. 41, first and second tilt couplings 326 and 328 each include a tongue 320 for connecting a PV module in the x-direction.

In the embodiment of FIG. 41, the PV modules 102 are inclined at an angle in their final positions, as described above with respect to FIGS. 37 through 40. Thus, the first and second tilt couplings 326 and 329 may be oriented along the y-direction, and the first tilt 326 coupling may extend a shorter distance away from the support surface than the second tilt coupling 328. The tilt couplings may be affixed to the support surface by any of the attachment systems described above.

In order to mount a next module 102 onto the tongues 320 of the first and second tilt couplings 326 and 328, the module may be brought to the tilt couplings tilted about both the x-axis and y-axis. That is, as explained above, in order to seat over tongues 320, a PV module is angled at the insertion angle, which may for example be 15°. As the tongues 320 with which the PV module are to couple lie along the y-axis, the module 102 may be angled at 15° about the y-axis so that the sloped surfaces 122, 126 of the groove 114 of module 102 align over the tongues 320 in the first and second tilt couplings.

If the modules 102 lay flat (i.e., in the x-y reference plane), this would be the only angle applied to PV module 102 to couple it to the tongues 320 of the couplings 326, 328. However, in this embodiment, there is also a tilt angle applied to the modules (the first tilt coupling 326 is shorter than the second tilt coupling 328). Thus, the module must also be tilted at the tilt angle to mate with the tongues 320. The tilt angle is about the x-axis and may for example be 10°. Thus, with these angles in this example, the module may be angled 15° about the y-axis and 10° about the x-axis in order to properly orient the module for mating over the tongues 320. After mating on the tongues 320, the module 102 may then be tilted down around the y-axis to a zero degree angle with respect to the y-axis to provide the module in the final, coupled position, tilted about the x-axis at the tilt angle.

Figure 42:
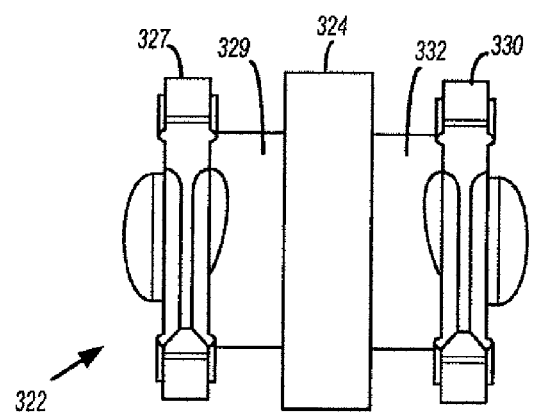
FIG. 42 is an edge view of a double-key coupling having a pair of opposed keys according to an embodiment of the present technology.

In some embodiments described above, opposite facing portions of a coupling include either a tongue or a key, but not both. In further embodiments of the present technology, a single coupling may include a pair of keys or a pair of tongues. Such an embodiment is shown for example in FIG. 42. In the embodiment of FIG. 42, a double-key coupling 322 is shown having a flange 324. A first key 327 and shaft 329 extend from a first side of flange 324, and a second key 330 and shaft 332 extend from a second side of flange 324. Each of keys 327 and 330 may be as described above, for example with respect to key 178.

Figure 43:
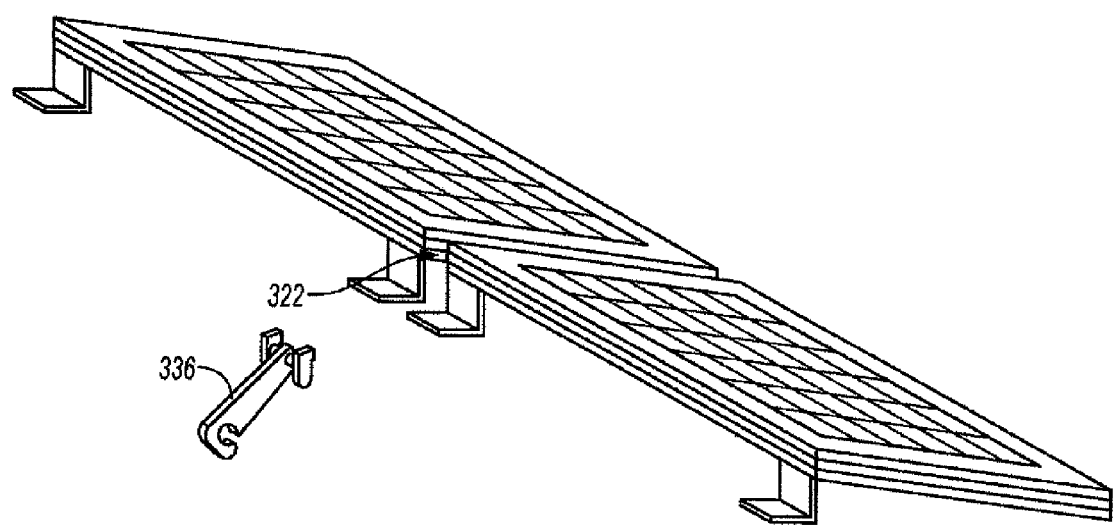
FIG. 43 is a perspective of the double-key coupling as shown in FIG. 42 as may be used in a PV array.
Figure 44:
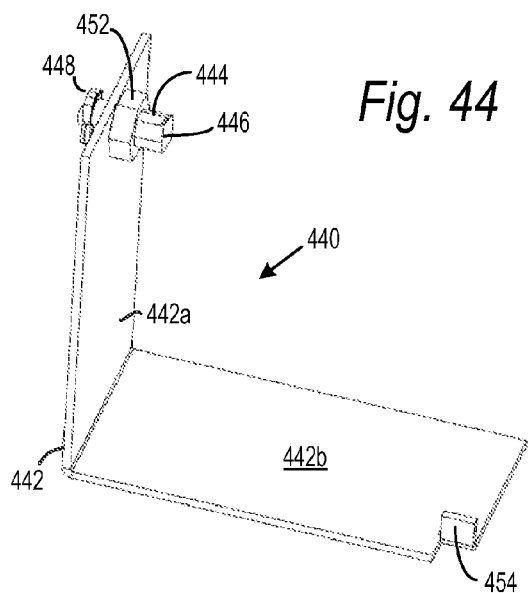
FIGS. 44-45 show perspective and front views of a front tilt foot according to embodiments of the present technology.
Figure 45:
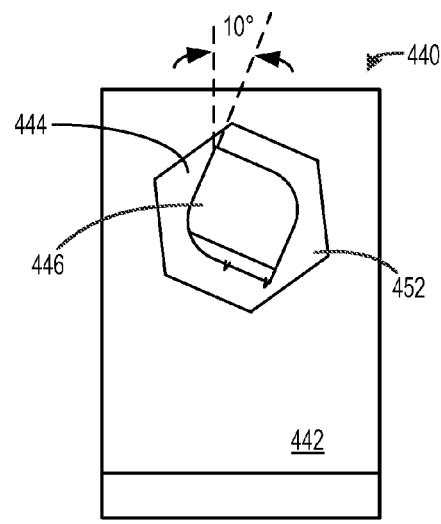

FIG. 43 shows one example for installing an array 100 using the double-key coupling 322, which is shown here further comprising an extension 336 to flange 324. Once a pair of modules 102 are provided adjacent each other, either in the x-direction or the y-direction, the double-key coupling 322 may be slid in between the modules so that the keys 327, 330 seat within the grooves 114 of respective adjacent modules 102. The keys may be slid in between the modules 102 and into the grooves 114 of the respective modules while in the horizontal insertion position. Thereafter, extension 336 may be used to help rotate the coupling 322 such that the keys 327, 330 rotate to the vertical position and engage in their respective grooves 114, coupling the modules 102 together.

In a further embodiment, instead of sliding the double-key coupling 322 into adjacent modules 102, the coupling 322 may be positioned with a first key 327 within the groove 114 of a first module 102. Thereafter, a second module may be moved into position to insert the second key 330 into the groove 114 of the second module. Extension 336 may then be used to engage the keys in the vertical position as described above. A coupling having a pair of oppositely facing tongues may also be provided.

Figure 46:
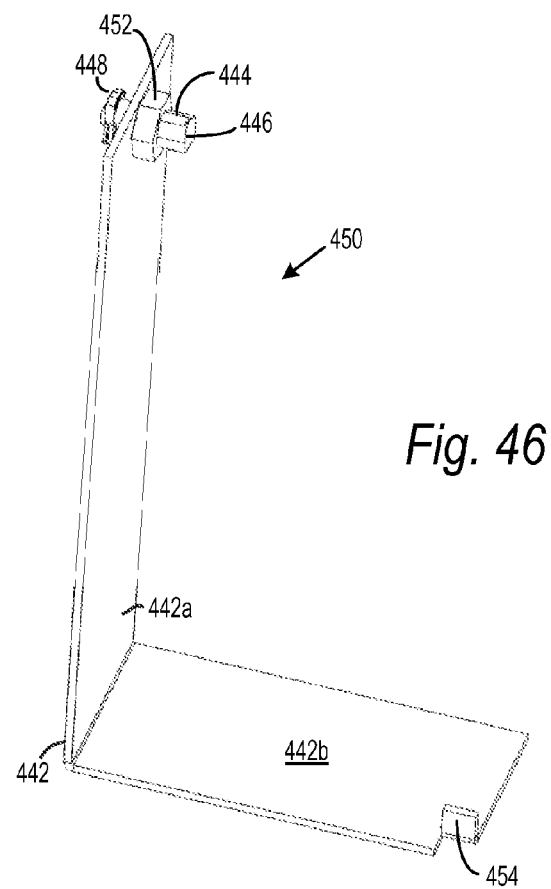
FIG. 46 shows a perspective view of a rear tilt foot according to embodiments of the present technology.

FIGS. 44-48 show a further support coupling in the form of a front tilt foot 440 (FIGS. 44 and 45) and a rear tilt foot 450 (FIG. 46). The front tilt foot 440 and rear tilt foot 450 may be identical to each other with the exception that a bracket 442 used in both feet 440, 450 may have an upwardly extending portion 442a that is longer in the rear tilt foot 450 than in the front tilt foot 440. The bracket 442 may for example be formed of ⅛ inch sheet steel, bent to form the upwardly extending portion 442a and a horizontal portion 442b. The bracket 442 may be formed of different materials and to different thicknesses in further embodiments.

The upwardly extending portion 442a on both feet 440 and 450 may include an opening for receiving a coupling 444 having a tongue 446 and a key 448 extending from opposite sides of a flange 452. The tongue 446 may be of the same type and construction as tongue 148 described above, and key 448 may be of the same type and construction as key 150 described above. The flange 452 as shown has a hexagonal shape that matches the shape of the opening in the upwardly extending portion 442a of feet 440, 450. The flange 452 may for example be swaged into the opening to provide a tight and permanent fit of the coupling 444 to the bracket 442. The flange 452 and opening may have other, corresponding shapes in further embodiments.

Figure 47:
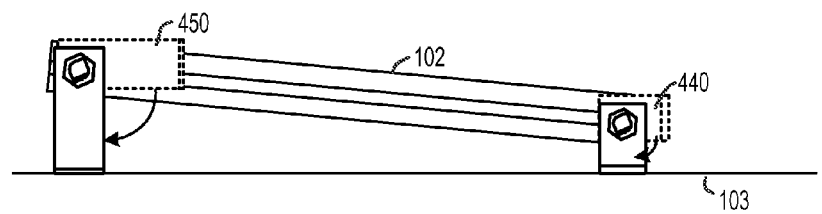
FIG. 47 is a side view of the front and rear tilt feet supporting a PV module according to embodiments of the present technology.
Figure 48:
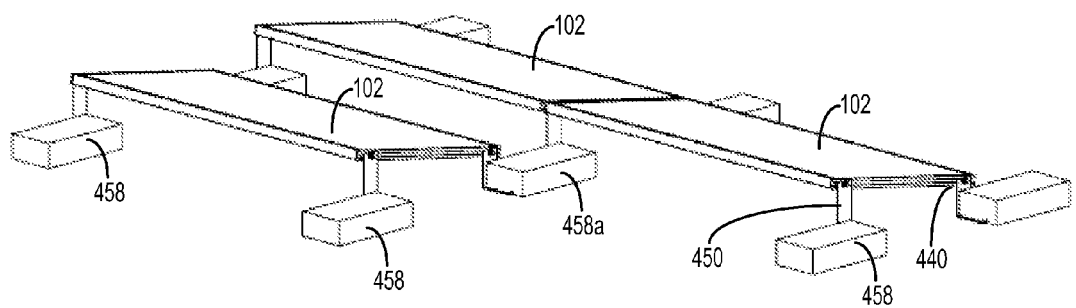
FIG. 48 is a perspective view of the front and rear tilt feet supporting PV modules according to embodiments of the present technology.

As shown in FIGS. 47 and 48, the front and rear tilt feet 440, 450 may be adapted to be connected to PV modules 102 together side-by-side along the x-axis. As also seen in those figures, the PV modules may be tilted relative to the support structure 103, for example at 10°, as explained above for example with reference to FIGS. 37-40. As the couplings enter between modules along the x-axis, and as the modules are tilted about the x-axis, the couplings 444 may similarly be tilted about an axial center of the coupling 444. This feature is shown for example in FIG. 45, which shows the coupling tilted for use in the embodiment of FIG. 47 an angle of 10°. The tilt angle of the coupling 444 may be provided to match the tilt angle of the PV module 102.

The tilt in the PV module 102 may be provided by the different lengths of the upwardly extending portions 442a of the front and rear feet 440, 450, as seen for example in FIGS. 47 and 48. In order to insert the feet 440, 450, they may be oriented generally parallel to the groove 114 in the frame 112 so that the key 448 is oriented in the insertion position as described above, for example with respect to FIG. 21. This initial insertion position is shown in dashed lines for feet 440 and 450 in FIG. 47. Thereafter, the feet may be rotated 90° to engage the key 448 within the groove 114 as described above, for example with respect to FIGS. 22 and 23. Once a pair of front and rear feet 440, 450 are locked onto a first PV module, another PV module adjacent in the x-direction may be dropped onto the tongues 446 of the front and rear feet as described above, for example with respect to FIG. 41.

In order to remove a foot 440 or 450, the foot may be rotated 90° back to the initial insertion position shown in dashed lines in FIG. 47, and pulled outward from the groove 114. Where modules are mounted adjacent to each other along the x-direction as shown in FIG. 48, it may not be possible to pull a foot straight outward from the groove 114. In such instances, in order to remove a foot 440, 450, the foot may be rotated back toward the initial insertion position. The horizontal portion 442b may contact the next adjacent module as the foot is rotated back toward the initial insertion position so that the foot is not able to rotate back 90° to the initial insertion position. However, the foot may be rotated sufficiently to free the key 448 from the groove, and allow the foot 440 and/or 450 to then be slid out of the end of the groove 114 (along y-axis).

In the embodiments including PV modules lying flat and parallel to each other (such as for example shown in FIG. 1), a single reference plane may be defined for the entire array 100. However, where the array 100 includes a tilted array (such as for example shown in FIG. 48), each PV module 102, or row of PV modules 102 along the x-axis, may have its own reference plane. In tilted row embodiments, the reference plane may be parallel to the surface of the tilted PV arrays in a given row, and may be located at or above an upper surfaces of the PV laminates 110 in that row, or at or below the lower surfaces of the PV laminates 110 in that row.

In the embodiments described above, the various support couplings were supported on the support structure 103 either by fasteners into the support structure 103 or on rails, such as rails 256 in FIG. 38. In a further embodiment, a leveling foot or other support coupling according to any of the above-described embodiments may alternatively include a ballast tray and ballast. One example of this is shown in FIG. 48. In this embodiment, the horizontal portion 442b of bracket 442 acts as a ballast tray for supporting ballast 458. Ballast 458 may be any of a variety of relatively heavy objects, such as a paver, brick, concrete, sand bag, metal block, etc. In the embodiment shown, ballast 458 is a block extending between and onto a pair of adjacent front and rear feet 440, 450 (as shown for example by ballast 458a in FIG. 48), though the ballast may be supported on a single foot or across more than two feet in further embodiments. The horizontal portion 442b may include an upwardly extending tab 454 for preventing the ballast 458 from sliding off of the horizontal portion 442b. The embodiments of FIGS. 47 and 48 may alternatively be bolted to the support surface 103, either directly or to rails such as rails 256 described above.

Figure 49:
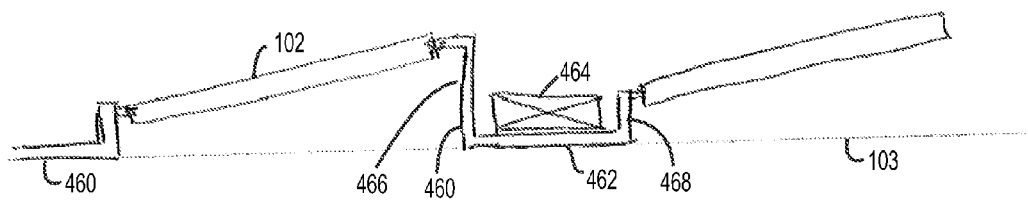
FIGS. 49 and 50 are side and perspective views of mid-support coupling supporting PV modules according to embodiments of the present technology.
Figure 50:
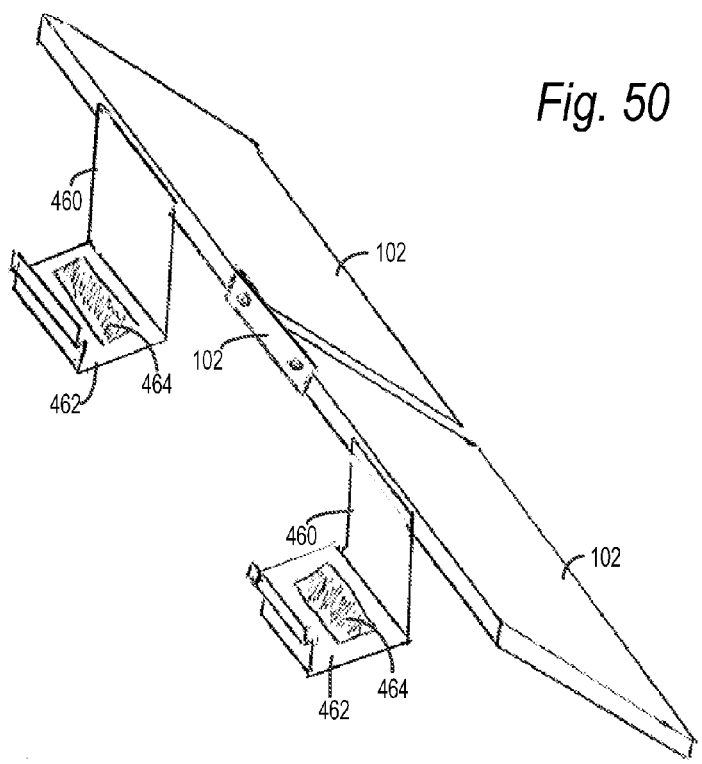

FIGS. 49 and 50 show side and perspective views of a mid-support coupling 460 which may be used to support a pair of tilted PV modules along the y-axis, and may engage the pair of adjacent PV modules with couplings as described for example with respect to any of the embodiments of FIGS. 37-40. In the embodiment shown in FIGS. 49 and 50, the support coupling 460 may be situated along an x-axis side of a PV module 102, in between the ends of the module as shown, and an interlock 106 may be used to join a pair of modules 102 together along the x-axis.

As described above with respect to FIGS. 37-40, the mid-support coupling 460 may include a first upwardly extending support 466 for supporting an end of a first PV module at a first height above the support structure 103, and a second upwardly extending support 468 for supporting an end of a second PV module at a second height above the support structure 103. The differing heights of supports 466 and 468 provide the tilt of the PV modules 102 with respect to the support structure 103.

In the embodiment shown, a central portion 462 between the upwardly extending supports 466 and 468 provides a ballast tray for supporting ballast 464 as described above. The mid-support coupling 460 may alternatively be mounted to the support surface 103 directly, or mounted to a rail, such as rail 256 of FIG. 38, extending in the y-direction.

Figure 51:
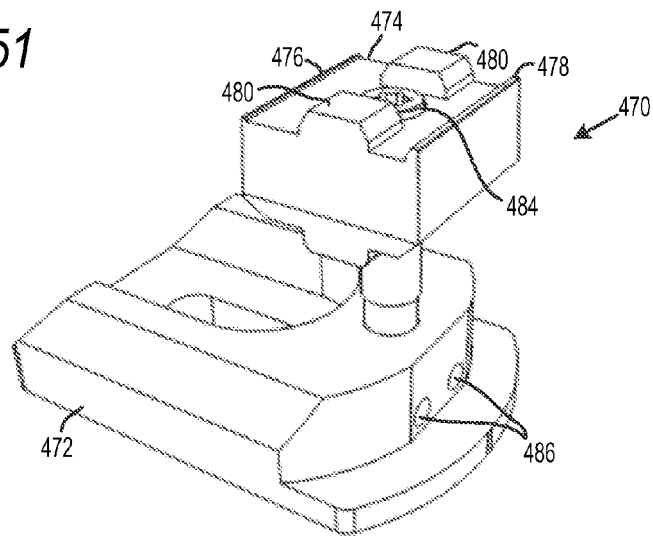
FIGS. 51 and 52 are perspective and side views of a double-tongue leveling foot according to embodiments of the present technology.
Figure 52:
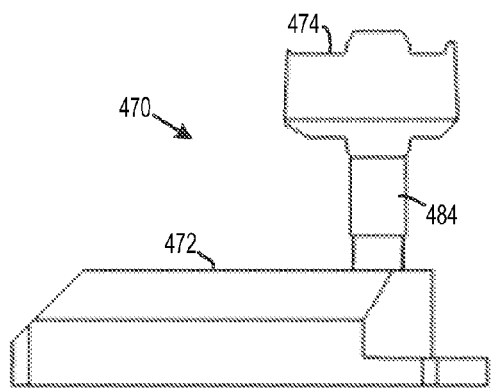

FIGS. 51 and 52 show perspective and side views of a double-tongue leveling foot 470. The foot 470 includes a base 472 which, in embodiments, may be larger and/or bulkier than the foot 134 described above, for example with respect to FIG. 8. A double-tongue coupling 474 may be affixed to the base 472 via a screw 484. In embodiments, screw 484 may have threads only along a top portion of the screw (the portion of the screw engaged by coupling 474). The bottom portion of the screw 484 may have no threads, but may be fixed to the base 472 via a pair of pins 486. The pins may for example engage within notches (not shown) in a portion of the screw 484 within base 472 to allow rotation but not translation of the screw 484 relative to the base 472. Rotation of the screw 484 while preventing rotation of the double-tongue coupling 474 translates the coupling 474 along the screw 484 to a desired height above base 472.

The double-tongue coupling 474 may include a pair of tongues 476 and 478. The tongues 476 and 478 are oppositely facing to each other for engaging within grooves 114 of PV modules 102 adjacent to each other in the y-direction and/or x-direction. The tongues have a thickness along the z-direction as described above for engaging within a groove at the insertion angle and thereafter rotated down to final engagement angle within a groove 114. The tongues 476 and 478 are shown with a width which may be wider than for example tongue 148 described above, though the width need not be greater in further embodiments. A pair of stops 480 are shown on the coupling 474 to provide a hard stop as each tongue 476, 478 is inserted into its respective groove 114. In general, the double-tongue coupling 474 may provide a higher strength than leveling foot 104 and a simpler no-tool installation method.

Figure 52A:
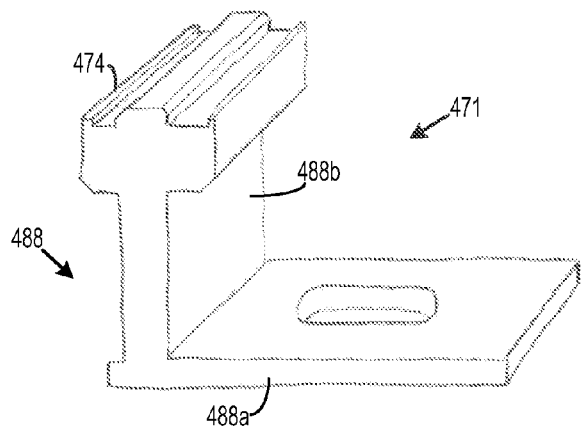
FIG. 52A is a perspective view of a double-tongue leveling foot according to an alternative embodiment of the present technology.

FIG. 52A shows a perspective view of a double-tongue coupling 471 which is similar to the double-tongue coupling 470 of FIGS. 51 and 52 with the exception that the double-tongue coupling 471 in FIG. 52A is integrally formed with, or otherwise fixedly mounted to, a bracket 488. The bracket 488 includes a base 488a and an upwardly extending portion 488b. The double-tongue coupling 474 may be formed on top of the upwardly extending portion 488b. The coupling 474 in FIG. 52A may be structurally and operationally as described above in FIGS. 51 and 52. In embodiments, the height of double-tongue coupling 471 in FIG. 52A is not adjustable, so that double-tongue coupling 471 may be best suited to connection to a straight surface such as a rail 256 described above. However, it is understood that double-tongue coupling 471 may be fastened directly to a support structure such as a roof via a fastener or ballast in further embodiments.

Figure 53:
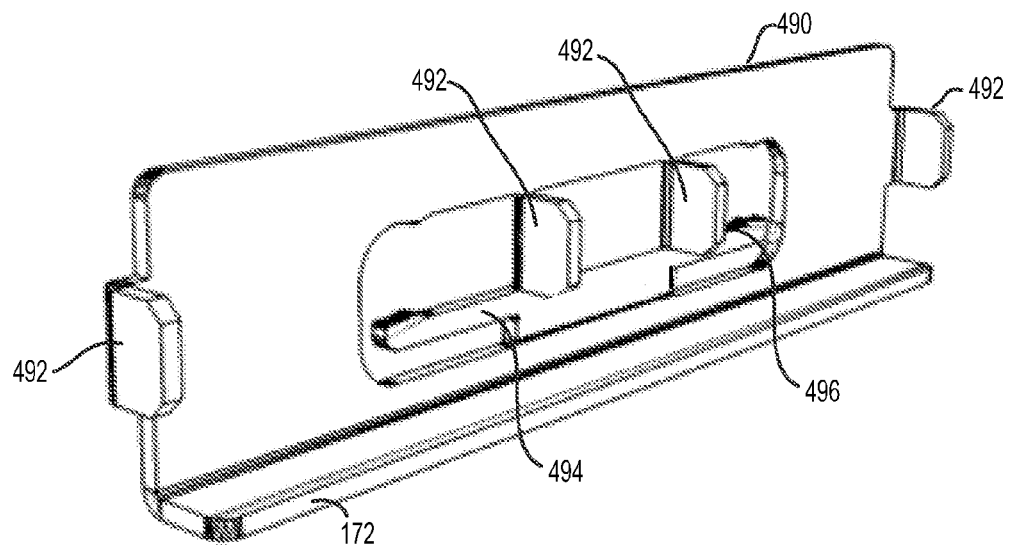
FIGS. 53 and 54 are perspective views of a stamped interlock with and without interlock couplings according to embodiments of the present technology.
Figure 54:
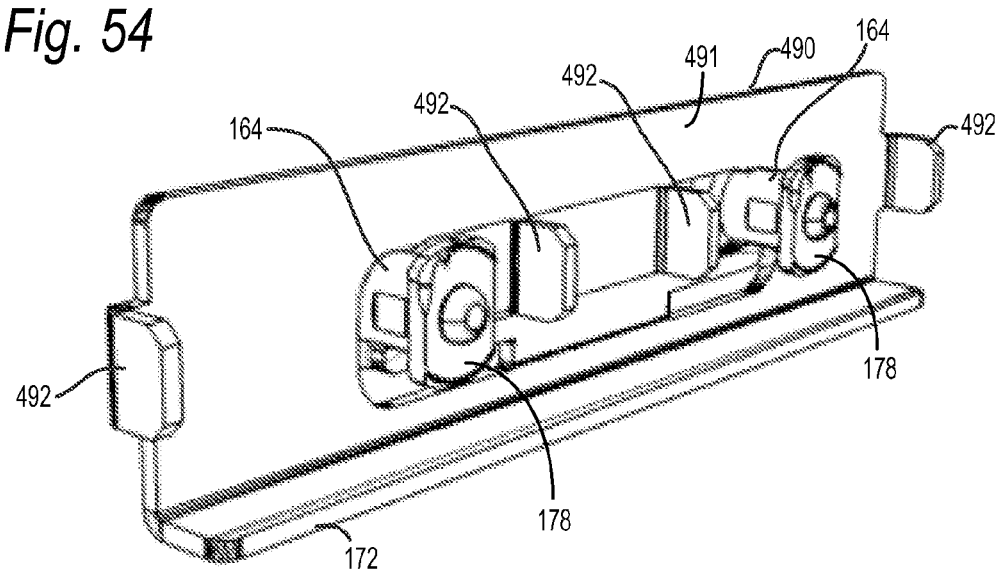

FIGS. 53 and 54 show perspective views of a stamped interlock 490. FIGS. 53 and 54 are identical to each other with the exception that FIG. 54 shows the interlock 490 with a pair of interlock couplings 164, where the couplings 164 are omitted from FIG. 53. Interlock couplings 164 may be structurally and operationally identical to the interlock couplings 164 described above, for example with respect to FIGS. 15-24. The stamped interlock 490 may further include an interlock plate 491, formed for example of a single piece of ⅛ inch sheet steel. Interlock plate 491 may be formed of other material and to other thicknesses in further embodiments. The interlock plate 491 may be stamped to produce a number of tabs 492 bent out of the plane of interlock plate 491. The tabs 492 are operationally analogous to the ribs 170 described above with respect to FIGS. 15-23. In particular, the tabs 492 fit within a groove 114 at an insertion angle, and then may engage top and bottom bearing portions 124, 128 of the groove 114 as the plate 491 pivots downward upon the keys 178 being rotated from their insertion position to their locked position within the key slot 130 within groove 114.

Interlock plate 491 may be stamped in such a way so as to define leaf springs 494 and 496 as shown within a interior open portion of the plate 491. These leaf springs 494, 496 may elastically deflect downward from the perspective of FIG. 53 to allow insertion and fastening of the couplings 164 to the plate 491. The plate 491 may further include a lip 172 as described above for example with respect to FIG. 15. In any of the above described embodiments of the interlock 106 and/or stamped interlock 490, the lip 172 may be omitted. Alternatively, for any such embodiments, a second lip (not shown) may be provided on a top portion of the interlock plate 162/491 so as to be positioned over a top edge of the frame 112 upon affixation of the interlock.

Figure 55:
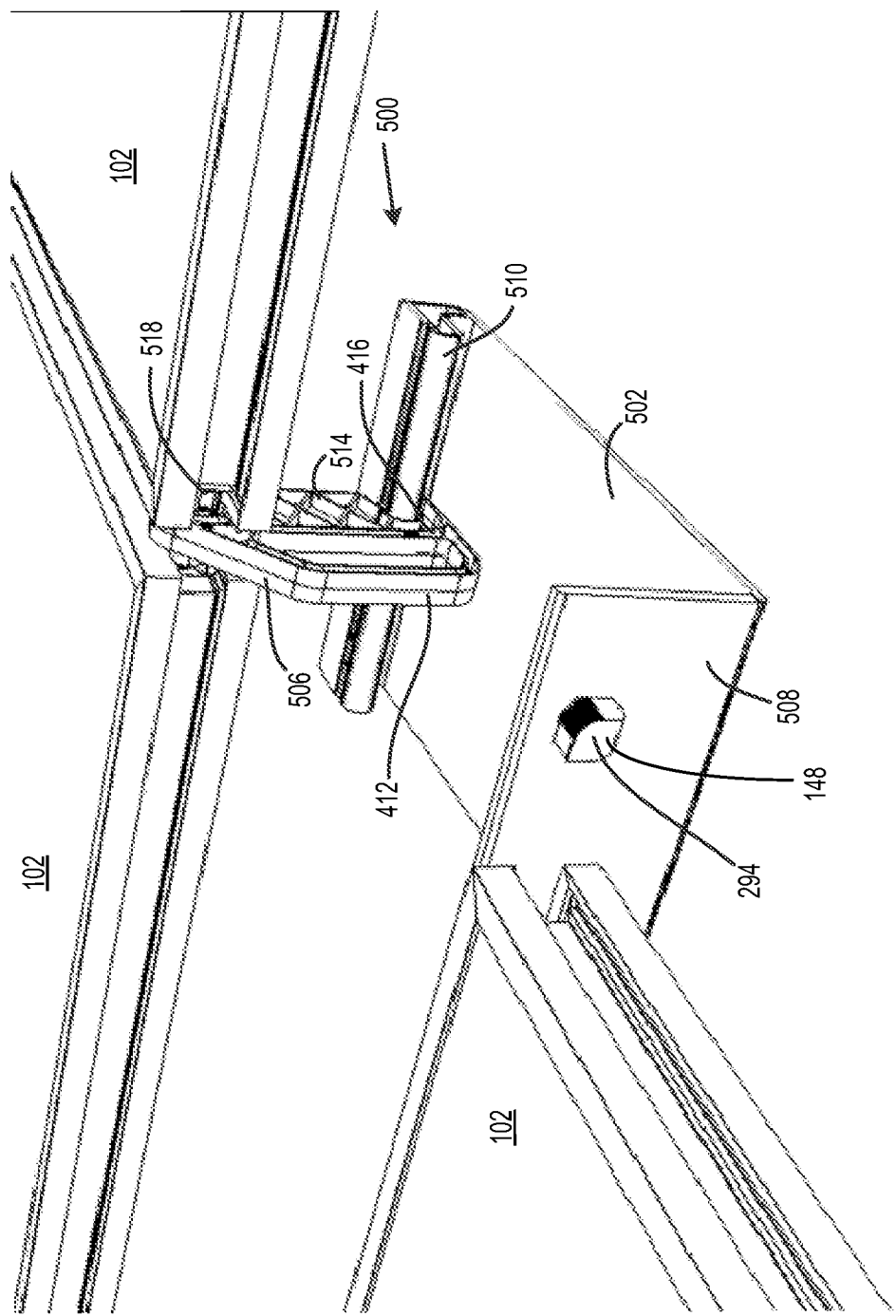
FIGS. 55 and 56 are perspective and side views of a hybrid press-fit coupling according to embodiments of the present technology.
Figure 56:
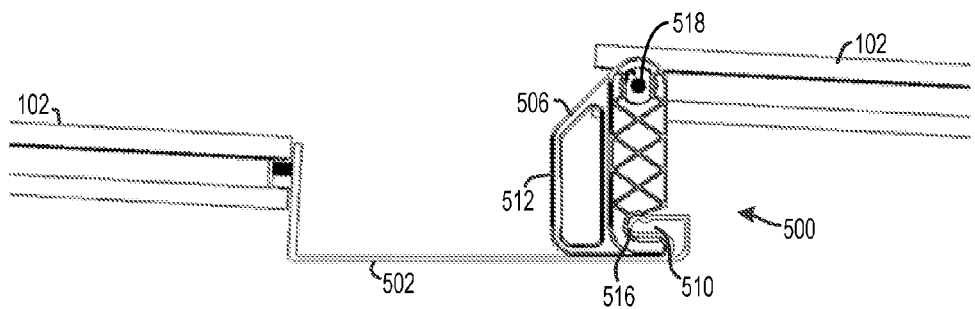

FIGS. 55 and 56 show perspective and side views of a hybrid, press-fit coupling 500 including a support plate 502 and a press-fit leg 506. The coupling 500 may be used to mount PV modules in the reference plane parallel to the support structure, or may be used to mount PV modules tilted at an angle. Where tilted at an angle as in FIGS. 55 and 56, the base 502 includes a low side 508 with a pair of couplings 294 such as described above with respect to FIG. 37. One coupling 294 is visible in FIG. 53, while the other coupling 294 has its tongue 148 engaged within the groove 114 of PV module 102 and is hidden from view.

The base 502 further includes a high side defined by leg 506 which snaps onto base 502. In particular, the leg 506 includes a notch 516 capable of snapping over a protrusion 510 formed in a portion of the base 502 in a press-fit relationship. The leg 506 shown in FIGS. 55 and 56 may be a plastic component including structural ribs 514 for adding rigidity to the leg 506. Leg 506 may be formed of other materials such as aluminum or steel in further embodiments, and ribs 514 may be omitted.

An upper portion of leg 506 includes a double ended coupling 518 for engaging a pair of PV modules 102 adjacent to each other in the x-direction in the embodiment shown. The double ended coupling 518 may include a pair of keys extending in opposite directions for engaging within respective grooves 114 of the adjacent modules 102. Such a coupling is shown above as double-key coupling 422 in FIG. 42. Alternatively, the coupling 518 may have a pair of tongues for engaging within respective grooves 114 of the adjacent modules 102. Such a coupling is shown above as double-tongue coupling 470 in FIGS. 51 and 52. The coupling 518 may further include one key and one tongue extending in opposite directions from each other off of the coupling 518 to engage within respective grooves 114 of adjacent PV modules.

The leg 506 also includes a handle 512 for easy insertion of the coupling 518 and removal of the coupling 518. In order to insert the leg 506, the double-ended coupling 518 is inserted in between adjacent modules 102 and rotated 90° downward until the notch 516 press-fits over the protrusion 510 and the opposite ends of the double ended coupling 518 engage within the respective grooves 102 of adjacent PV modules.

The base 502 may be supported on the support structure 103 by fasteners through the base and into the support structure 103, by being mounted to rails such as rails 256, or by serving as a ballast tray and having ballast provided thereon.

Figure 57:
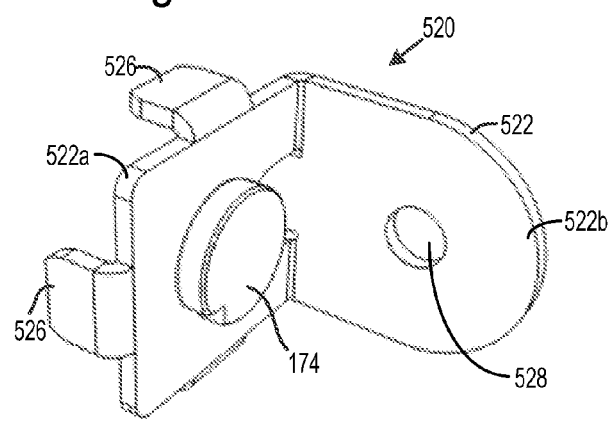
FIGS. 57 and 58 are front and rear perspective views of a modular coupling according to embodiments of the present technology.
Figure 58:
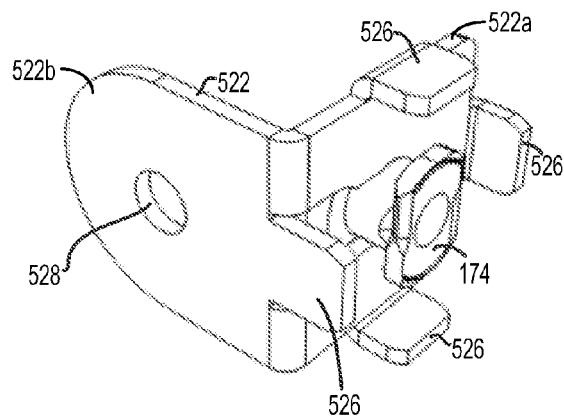

FIGS. 57 and 58 show front and rear perspective views of a modular coupling 520. The modular coupling 520 may include a plate 522 formed for example of ⅛ inch sheet steel, though it may be other materials and thicknesses in further embodiments. The plate 522 may be bent into right angle sections 522a and 522b. Section 522a may formed to include a central opening for receiving an accessory coupling 174, for example as described above with respect to FIGS. 27 and 28. The section 522a is further formed with two pair of opposed tabs 526 bent out of the plane of section 522a. The tabs 526 serve dual functions as explained below. The section 522b may be bent at a right angle with respect to section 522a, and may include a hole 528 allowing components to be bolted to the modular coupling 520 as explained below.

Figure 59:
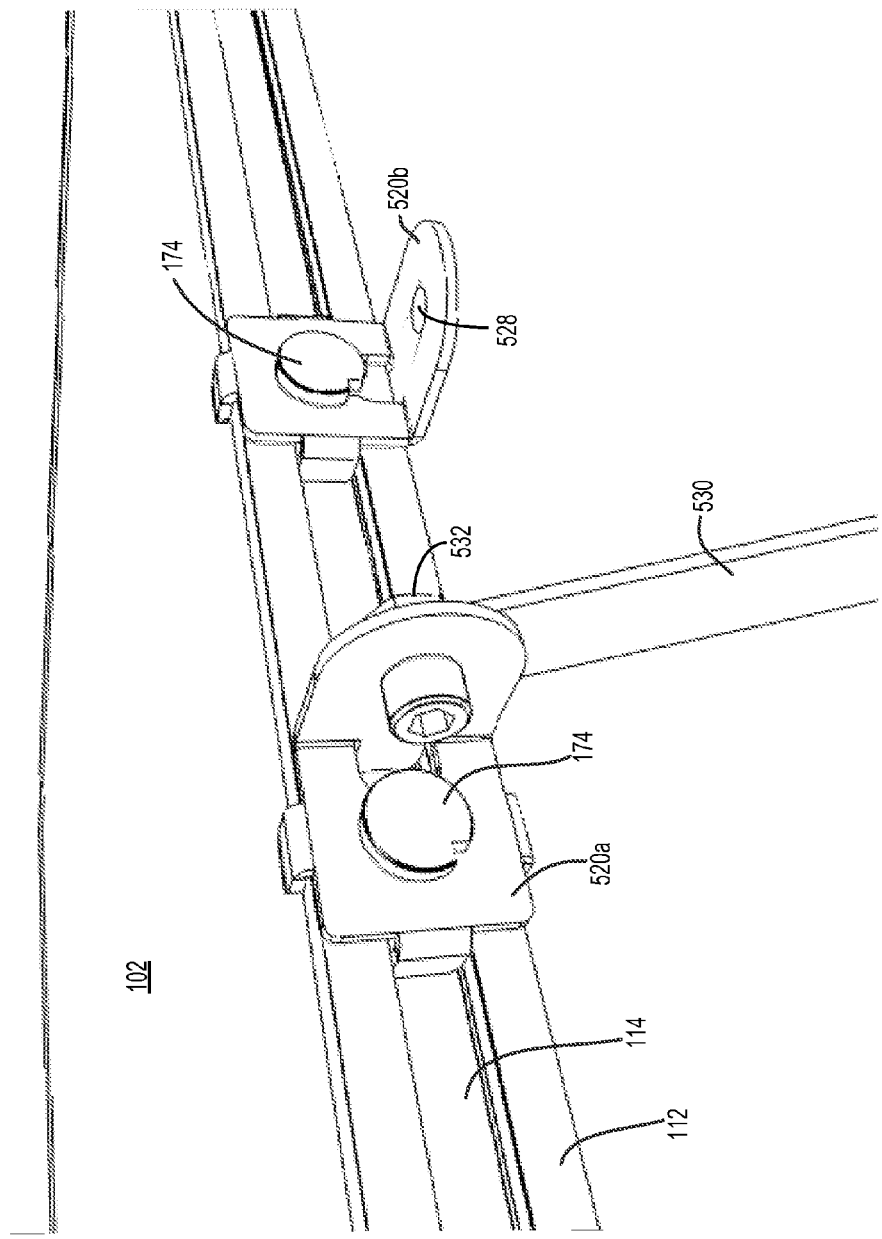
FIG. 59 is a perspective view of a pair of modular accessory couplings affixed to a PV module according to embodiments of the present technology.

FIG. 59 is a perspective view of a PV module 102 having a pair of modular couplings 520 affixed thereto. In embodiments, the section 522a has a square shape with a length and width approximately equal to a height of a frame 112. The modular coupling 520 may be affixed to the frame 112 in one of four orientations: a first where the section 522b is oriented perpendicular to the reference plane of module 102 and to the right of the modular coupling (coupling 520a in FIG. 59); a second where the section 522b is oriented perpendicular to the reference plane of module 102 and to the left of the modular coupling; a third where the section 522b is oriented parallel to the reference plane of module 102 and at the bottom of the modular coupling (coupling 520b in FIG. 59); and a fourth where the section 522b is oriented parallel to the reference plane of module 102 and at the top of the modular coupling.

In the first and second orientations, a first pair of opposed tabs 526 are received within groove 114, and the second pair of opposed tabs 526 are positioned over the upper and lower edges of frame 112. In the third and fourth orientations, the second pair of opposed tabs 526 are received within groove 114, and the first pair of opposed tabs 526 are positioned over the upper and lower edges of frame 112.

As described above, the accessory coupling 174 includes a key 178. In order to affix the modular coupling 520a in FIG. 59, the key 178 is positioned for insertion within the groove 114 at the insertion angle while the section 522b is perpendicular to the reference plane. Thereafter, the key 178 is rotated as explained above to engage the modular coupling 520a with the frame 112. In order to affix the modular coupling 520b in FIG. 59, the key 178 is positioned for insertion within the groove 114 at the insertion angle while the section 522b is parallel to the reference plane. Thereafter, the key 178 is rotated as explained above to engage the modular coupling 520b with the frame 112.

The tabs 526 are structurally and operationally similar to tabs 492 described above with respect to FIGS. 53 and 54. In particular, the tabs 526 which fit within the groove 114 are inserted at the insertion angle, and then they may engage top and bottom bearing portions 124, 128 of the groove 114 as the modular coupling 520 pivots downward upon the key 178 being rotated from its insertion position to its locked position within the key slot 130 within groove 114.

Once the modular coupling 170 is affixed to the frame 112, various components may be affixed to the section 522b via a bolt in hole 528. For example, FIG. 59 shows a component 530 affixed to the modular coupling 520a via a bolt 532. Other connections may be made to the modular coupling in any orientation, such as for example for connecting a module 102 to various types of surfaces as well as connecting a tilt-up leg or ground-mount rack.

Figure 60:
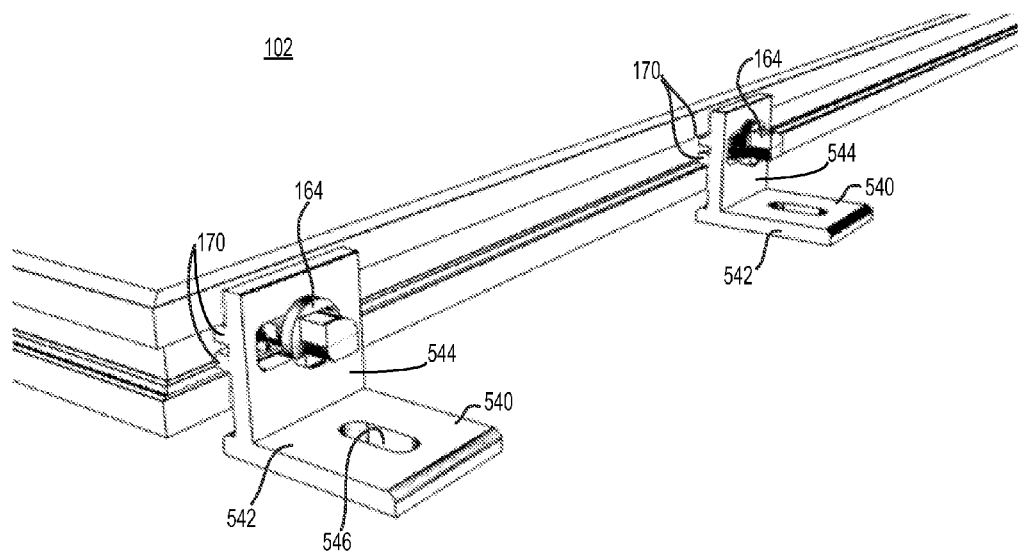
FIGS. 60 and 61 are perspective and side views of a hybrid foot bracket supporting PV modules according to embodiments of the present technology.
Figure 61:
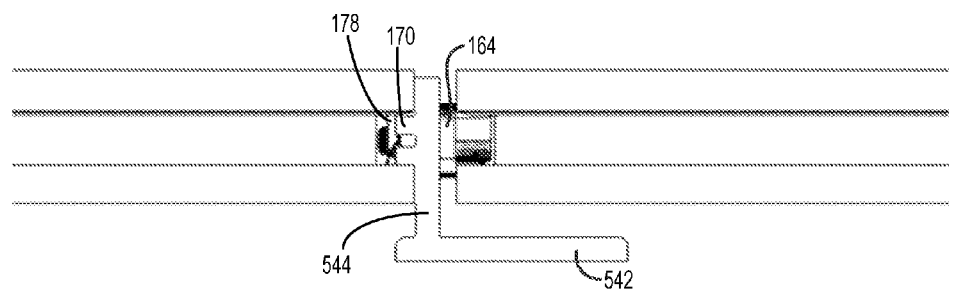

FIGS. 60 and 61 show perspective and side views of a foot bracket 540 which connects to a PV module 102 with a pivot action similar to interlock 106 described above. The foot bracket 540 includes a base 542 with a hole 546 for receiving a fastener (not shown) for affixing the foot bracket 540 to a support structure 103. In embodiments, the height of foot bracket 540 is not adjustable, so that foot bracket 540 may be best suited to connection to a straight surface such as a rail 256 described above. However, it is understood that foot bracket 540 may be fastened directly to a support structure such as a roof via a fastener or ballast in further embodiments.

The foot bracket 540 further includes an upright section 544 including ribs 170 and an interlock coupling 164 which are structurally and operationally the same as described above with respect to FIGS. 15-23. The coupling 164 includes a key 178 (FIG. 61). The key is positioned parallel to the ribs 170, and the key and ribs are inserted into the groove 114 at the insertion angle. Thereafter, the key 178 is rotated to pivot the foot bracket 540 down to engage the ribs 170 and key 178 within the groove 114, completing the fastening of foot bracket 540 to the frame 112 of module 102.

In the embodiments described above, the coupling engaging within the groove 114 often engaged the upper bearing portion 124 and the lower bearing portion 128. The coupling may engage other surfaces within the groove 114 in further embodiments. FIG. 62 is a side view of one such embodiment showing a key slot-engaging coupling 550. The coupling 550 may be formed of ⅛ inch sheet steel, though it may be formed of other materials and other thicknesses, and need not be formed of a sheet of such material, in further embodiments. The coupling 550 includes a base 552 supported on the support structure 103. The base 552 is shown folded into two layers in FIG. 62, though it may be a single layer or more than two layers of folded material in further embodiments. A first upwardly extending portion 554 extends from base 552. The length of first upwardly extending portion 554 determines the height of the connected PV modules above the support structure 103.

The coupling 550 may for example be two inches wide (into the page of FIG. 62), though it may be wider or narrower than that in further embodiments. At a top of first upwardly extending portion 554, the coupling may split along its width dimension, with a first horizontal section 556 extending in the direction of the first PV module 102a, and a second horizontal section 558 extending in the direction of the first PV module 102b. Section 556 has a second upwardly extending portion 560, and section 558 has a third upwardly extending portion 562. In embodiments, the second and third portions 560 and 562 may be same length, to provide a PV array parallel to the support structure 103. In further embodiments, one of the second and third portions 560 and 562 may be longer than the other, to provide PV modules which are tilted, as shown for example in FIG. 48.

In order to assemble PV module 102a onto the coupling 550, the PV module 102a may be inserted over the second upwardly extending portion 560 at an insertion angle as described above until a top of the second upwardly extending portion 560 engages within the key slot 130 of the frame 112 of the PV module 102a. Once the second upwardly extending portion 560 is engaged within the key slot, the PV module 102a may be rotated downward until the lower bearing portion 128 of frame 112 engages the first horizontal section 556 of the coupling 550. At this point, the PV module 102a is secured on the coupling 550.

In order to assemble PV module 102b onto the coupling 550, the PV module 102b may be inserted over the third upwardly extending portion 562 at an insertion angle as described above until a top of the third upwardly extending portion 562 engages within the key slot 130 of the frame 112 of the PV module 102b. Once the third upwardly extending portion 562 is engaged within the key slot, the PV module 102b may be rotated downward until the lower bearing portion 128 of frame 112 engages the second horizontal section 558 of the coupling 550. At this point, the PV module 102b is secured on the coupling 550, adjacent the first PV module 102a. Other configurations are contemplated where a coupling engages bearing portions other than bearing portions 124 and/or 128 in further embodiments.

The foregoing detailed description of the inventive system has been presented for purposes of illustration and description. It is not intended to be exhaustive or to limit the inventive system to the precise form disclosed. Many modifications and variations are possible in light of the above teaching. The described embodiments were chosen in order to best explain the principles of the inventive system and its practical application to thereby enable others skilled in the art to best utilize the inventive system in various embodiments and with various modifications as are suited to the particular use contemplated. It is intended that the scope of the inventive system be defined by the claims appended hereto.

What is claimed:

1. An array of photovoltaic modules interlocked together, comprising:
    (a) a first photovoltaic module;
    (b) a second photovoltaic module;
    (c) an interlock assembly comprising:
        (i) an interlock plate;
        (ii) an opening passing through the interlock plate; and
        (iii) a rotatable coupling passing through the opening in the interlock plate, wherein the rotatable coupling comprises:
            (A) a key portion dimensioned to rotatably lock into a groove in the first photovoltaic module, and
            (B) a tongue portion dimensioned to be slidably inserted into a groove in the second photovoltaic module in a direction orthogonal to the length of the groove after the key portion has been rotated into a locked position, and wherein the grooves in each of the first and second modules are dimensioned such that:
                (1) an innermost edge of the top of an opening into the groove is lower than an outermost edge of the top of the opening into the groove, and
                (2) an innermost edge of the bottom of an opening into the groove is lower than an outermost edge of the bottom of the opening into the groove.

2. The array of claim 1, wherein the tongue portion permits movement of the second photovoltaic module in the direction orthogonal to the length of the groove after the key portion has been rotated into the locked position.

3. The array of claim 2, wherein the tongue portion has a flat surface on which the second photovoltaic module is permitted to slide in a direction orthogonal to the second photovoltaic module when the key portion has been engaged with the first photovoltaic module.

4. An interlock assembly for connecting photovoltaic module frames together, comprising:
    (a) an interlock plate;
    (b) an opening passing through the interlock plate; and
    (c) at least one rotatable coupling passing through the opening in the interlock plate, wherein the rotatable coupling comprises:
        (i) a key portion dimensioned to rotatably lock into a groove in a first photovoltaic module frame, and
        (ii) a tongue portion dimensioned to be slidably inserted into a groove in a second photovoltaic module frame in a direction orthogonal to the length of the groove after the key portion has been rotated into a locked position, and wherein the grooves in each of the first and second module frames are dimensioned such that:
            (1) an innermost edge of the top of an opening into the groove is lower than an outermost edge of the top of the opening into the groove, and
            (2) an innermost edge of the bottom of an opening into the groove is lower than an outermost edge of the bottom of the opening into the groove.

5. The interlock assembly of claim 4, wherein the tongue portion permits movement of the second photovoltaic module frame in the direction orthogonal to the length of the groove after the key portion has been rotated into the locked position.

6. The interlock assembly of claim 4, wherein the tongue portion of the rotatable coupling is dimensioned to be slidably received into an angled groove in the second photovoltaic module frame and then pivoted about an axis extending parallel to the length of the groove into a locked position, thereby locking the tongue portion into the angled groove in the second photovoltaic module frame.

7. The interlock assembly of claim 6, wherein the tongue portion is dimensioned to push against upper and lower bearing surfaces in the angled groove when the tongue is in the locked position.

8. The interlock assembly of claim 4, further comprising:
(d) a bottom support lip extending along the bottom of the interlock plate, wherein the bottom support lip is dimensioned to be positioned under two photovoltaic module frames when the two photovoltaic module frames are connected together in series.

9. The interlock assembly of claim 4, further comprising:
(d) at least one support rib extending from a side of the interlock plate, wherein the support rib is dimensioned to be received into grooves of two photovoltaic module frames when the two photovoltaic module frames are connected together in series.

10. The interlock assembly of claim 4, wherein the coupling enables a grounding bond between said first and second photovoltaic modules.

* * * * *